United States Patent
Yamazaki et al.

(10) Patent No.: US 12,283,599 B2
(45) Date of Patent: Apr. 22, 2025

(54) SEMICONDUCTOR DEVICE

(71) Applicant: Semiconductor Energy Laboratory Co., Ltd., Atsugi (JP)

(72) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/242,210

(22) Filed: Sep. 5, 2023

(65) Prior Publication Data

US 2023/0413587 A1 Dec. 21, 2023

Related U.S. Application Data

(63) Continuation of application No. 17/949,436, filed on Sep. 21, 2022, now Pat. No. 11,825,665, which is a (Continued)

(30) Foreign Application Priority Data

Dec. 25, 2009 (JP) ................. 2009-296202

(51) Int. Cl.
*H01L 27/12* (2006.01)
*H01L 29/24* (2006.01)
(Continued)

(52) U.S. Cl.
CPC ........ *H01L 27/1225* (2013.01); *H01L 27/124* (2013.01); *H01L 27/1255* (2013.01);
(Continued)

(58) Field of Classification Search
CPC .................................. H01L 27/1214
See application file for complete search history.

(56) References Cited

U.S. PATENT DOCUMENTS

| | | |
|---|---|---|
| 4,466,081 A | 8/1984 | Masuoka |
| 5,349,366 A | 9/1994 | Yamazaki et al. |
| | (Continued) | |

FOREIGN PATENT DOCUMENTS

| | | |
|---|---|---|
| CN | 001219770 A | 6/1999 |
| CN | 001396156 A | 2/2003 |
| | (Continued) | |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Trang Q Tran
(74) *Attorney, Agent, or Firm* — Fish & Richardson P.C.

(57) ABSTRACT

An object of one embodiment of the present invention is to provide a semiconductor device with a novel structure in which stored data can be stored even when power is not supplied in a data storing time and there is no limitation on the number of times of writing. The semiconductor device includes a first transistor which includes a first channel formation region using a semiconductor material other than an oxide semiconductor, a second transistor which includes a second channel formation region using an oxide semiconductor material, and a capacitor. One of a second source electrode and a second drain electrode of the second transistor is electrically connected to one electrode of the capacitor.

14 Claims, 17 Drawing Sheets

Related U.S. Application Data continuation of application No. 16/779,774, filed on Feb. 3, 2020, now Pat. No. 11,456,296, which is a continuation of application No. 15/995,204, filed on Jun. 1, 2018, now Pat. No. 10,553,589, which is a continuation of application No. 15/157,565, filed on May 18, 2016, now Pat. No. 9,991,265, which is a continuation of application No. 13/905,178, filed on May 30, 2013, now Pat. No. 9,349,735, which is a continuation of application No. 12/976,564, filed on Dec. 22, 2010, now Pat. No. 8,455,868.

(51) Int. Cl.
| | |
|---|---|
| *H01L 29/786* | (2006.01) |
| *H10B 12/00* | (2023.01) |
| *H10B 41/20* | (2023.01) |
| *H10B 41/70* | (2023.01) |
| *G11C 13/00* | (2006.01) |
| *H01L 49/02* | (2006.01) |
| *H10B 10/00* | (2023.01) |

(52) U.S. Cl.
CPC .......... *H01L 29/24* (2013.01); *H01L 29/7869* (2013.01); *H01L 29/78696* (2013.01); *H10B 12/00* (2023.02); *H10B 41/20* (2023.02); *H10B 41/70* (2023.02); *G11C 13/0007* (2013.01); *G11C 13/003* (2013.01); *G11C 2213/79* (2013.01); *H01L 28/40* (2013.01); *H10B 10/00* (2023.02)

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 6,127,702 | A | 10/2000 | Yamazaki et al. |
| 6,140,158 | A | 10/2000 | Rhee et al. |
| 6,271,542 | B1 | 8/2001 | Emma et al. |
| 6,294,274 | B1 | 9/2001 | Kawazoe et al. |
| 6,563,174 | B2 | 5/2003 | Kawasaki et al. |
| 6,579,727 | B1 | 6/2003 | Zambrano |
| 6,620,659 | B2 | 9/2003 | Emmma et al. |
| 6,727,522 | B1 | 4/2004 | Kawasaki et al. |
| 6,787,835 | B2 | 9/2004 | Atwood et al. |
| 6,839,260 | B2 | 1/2005 | Ishii |
| 6,876,045 | B2 | 4/2005 | Takagi |
| 6,909,242 | B2 | 6/2005 | Kimura |
| 6,949,782 | B2 | 9/2005 | Atwood et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,177,187 | B2 | 2/2007 | Ishii |
| 7,189,992 | B2 | 3/2007 | Wager, III et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,306,981 | B2 | 12/2007 | Kuwabara et al. |
| 7,323,356 | B2 | 1/2008 | Hosono et al. |
| 7,336,519 | B2 | 2/2008 | Ishii |
| 7,339,187 | B2 | 3/2008 | Wager, III et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,468,901 | B2 | 12/2008 | Kameshiro et al. |
| 7,501,293 | B2 | 3/2009 | Ito et al. |
| 7,570,516 | B2 | 8/2009 | Ishii |
| 7,583,032 | B2 | 9/2009 | Kimura |
| 7,674,650 | B2 | 3/2010 | Akimoto et al. |
| 7,732,819 | B2 | 6/2010 | Akimoto et al. |
| 7,759,788 | B2 | 7/2010 | Aoki et al. |
| 7,772,053 | B2 | 8/2010 | Kameshiro et al. |
| 7,791,074 | B2 | 9/2010 | Iwasaki |
| 7,826,266 | B2 | 11/2010 | Ishii |
| 7,833,851 | B2 | 11/2010 | Kuwabara et al. |
| 7,859,889 | B2 | 12/2010 | Kameshiro et al. |
| 7,863,612 | B2 | 1/2011 | Sato |
| 7,884,360 | B2 | 2/2011 | Takechi et al. |
| 7,888,207 | B2 | 2/2011 | Wager, III et al. |
| 7,915,830 | B2 | 3/2011 | Kimura |
| 7,933,140 | B2 * | 4/2011 | Wang .................. G11C 11/4074 365/177 |
| 7,935,582 | B2 | 5/2011 | Iwasaki |
| 7,956,361 | B2 | 6/2011 | Iwasaki |
| 7,956,947 | B2 | 6/2011 | Lee et al. |
| 7,977,675 | B2 | 7/2011 | Kawamura et al. |
| 7,982,250 | B2 | 7/2011 | Yamazaki et al. |
| 7,989,361 | B2 | 8/2011 | Seon et al. |
| 7,994,500 | B2 | 8/2011 | Kim et al. |
| 8,017,513 | B2 | 9/2011 | Jeong et al. |
| 8,067,793 | B2 | 11/2011 | Akimoto |
| 8,084,307 | B2 | 12/2011 | Itagaki et al. |
| 8,084,331 | B2 | 12/2011 | Ofuji et al. |
| 8,148,779 | B2 | 4/2012 | Jeong et al. |
| 8,154,024 | B2 | 4/2012 | Iwasaki |
| 8,188,480 | B2 | 5/2012 | Itai |
| 8,202,365 | B2 | 6/2012 | Umeda et al. |
| 8,203,143 | B2 | 6/2012 | Imai |
| 8,212,248 | B2 | 7/2012 | Itagaki et al. |
| 8,258,496 | B2 | 9/2012 | Toda et al. |
| 8,274,082 | B2 | 9/2012 | Ferrao De Paiva Martins et al. |
| 8,288,197 | B2 | 10/2012 | Yukawa et al. |
| 8,314,425 | B2 | 11/2012 | Iwasaki et al. |
| 8,378,578 | B2 | 2/2013 | Kimura |
| 8,420,442 | B2 | 4/2013 | Takechi et al. |
| 8,426,860 | B2 | 4/2013 | Sato |
| 8,450,142 | B2 | 5/2013 | Hotta et al. |
| 8,455,868 | B2 | 6/2013 | Yamazaki et al. |
| 8,541,258 | B2 | 9/2013 | Kim et al. |
| 8,563,977 | B2 | 10/2013 | Shimada et al. |
| 8,604,704 | B2 | 12/2013 | Kimura |
| 8,659,016 | B2 | 2/2014 | Kim et al. |
| 8,742,412 | B2 | 6/2014 | Goyal et al. |
| 8,765,535 | B2 | 7/2014 | Akimoto |
| 8,796,679 | B2 | 8/2014 | Jeong et al. |
| 8,809,850 | B2 | 8/2014 | Yamazaki |
| 8,889,480 | B2 | 11/2014 | Takechi et al. |
| 8,901,559 | B2 | 12/2014 | Yamazaki |
| 8,969,859 | B2 | 3/2015 | Sato |
| 9,029,859 | B2 | 5/2015 | Sato |
| 9,035,313 | B2 | 5/2015 | Jeong et al. |
| 9,209,026 | B2 | 12/2015 | Takechi et al. |
| 9,209,251 | B2 | 12/2015 | Yamazaki |
| 9,236,404 | B2 | 1/2016 | Sato |
| 9,257,451 | B2 | 2/2016 | Sato |
| 9,349,735 | B2 | 5/2016 | Yamazaki et al. |
| 9,564,539 | B2 | 2/2017 | Sato |
| 2001/0015450 | A1 | 8/2001 | Sugibayashi et al. |
| 2001/0017798 | A1 | 8/2001 | Ishii |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218221 | A1 | 11/2003 | Wager, III et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2005/0237786 | A1 | 10/2005 | Atwood et al. |
| 2005/0280000 | A1 | 12/2005 | Ishii et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |

(56) References Cited

U.S. PATENT DOCUMENTS

| | | |
|---|---|---|
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0216877 A1 | 9/2006 | Toyota et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1* | 3/2007 | Akimoto ............ H01L 27/1225 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287221 A1* | 12/2007 | Ong ..................... H01L 29/045 257/E21.464 |
| 2007/0287296 A1 | 12/2007 | Chang |
| 2008/0006877 A1 | 1/2008 | Mardilovich et al. |
| 2008/0035920 A1 | 2/2008 | Takechi et al. |
| 2008/0038882 A1 | 2/2008 | Takechi et al. |
| 2008/0038884 A1 | 2/2008 | Hwang |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0079075 A1 | 4/2008 | Seon et al. |
| 2008/0083950 A1 | 4/2008 | Pan et al. |
| 2008/0093595 A1 | 4/2008 | Song et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0315193 A1 | 12/2008 | Kim et al. |
| 2009/0002590 A1 | 1/2009 | Kimura |
| 2009/0008638 A1 | 1/2009 | Kang et al. |
| 2009/0014799 A1 | 1/2009 | Isobe |
| 2009/0027371 A1 | 1/2009 | Lin et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0079000 A1 | 3/2009 | Yamazaki et al. |
| 2009/0114910 A1 | 5/2009 | Chang |
| 2009/0134390 A1 | 5/2009 | Kodama et al. |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0152607 A1 | 6/2009 | Tanaka et al. |
| 2009/0184315 A1 | 7/2009 | Lee et al. |
| 2009/0256150 A1 | 10/2009 | Yoon et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0090216 A1 | 4/2010 | Ferrao De Paiva martins et al. |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0140599 A1 | 6/2010 | Yano et al. |
| 2010/0148171 A1 | 6/2010 | Hayashi et al. |
| 2010/0193785 A1 | 8/2010 | Kimura |
| 2010/0224870 A1 | 9/2010 | Iwasaki et al. |
| 2010/0276685 A1 | 11/2010 | Itagaki et al. |
| 2010/0276689 A1 | 11/2010 | Iwasaki |
| 2010/0279462 A1 | 11/2010 | Iwasaki |
| 2011/0089417 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0108706 A1 | 5/2011 | Koyama |
| 2011/0108836 A1 | 5/2011 | Koyama et al. |
| 2011/0110145 A1 | 5/2011 | Yamazaki et al. |
| 2011/0116310 A1 | 5/2011 | Yamazaki et al. |
| 2011/0121285 A1 | 5/2011 | Yamazaki et al. |
| 2011/0121286 A1 | 5/2011 | Yamazaki et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156117 A1 | 6/2011 | Yamazaki et al. |
| 2011/0194331 A1 | 8/2011 | Kawae et al. |
| 2011/0215328 A1 | 9/2011 | Morosawa et al. |
| 2012/0132911 A1 | 5/2012 | Shimada et al. |
| 2014/0011329 A1 | 1/2014 | Zhang et al. |
| 2016/0086979 A1 | 3/2016 | Yamazaki |
| 2017/0141178 A1 | 5/2017 | Sato |

FOREIGN PATENT DOCUMENTS

| | | |
|---|---|---|
| CN | 001695254 A | 11/2005 |
| CN | 102656683 A | 9/2012 |
| CN | 102804360 A | 11/2012 |
| EP | 1134811 A | 9/2001 |
| EP | 1296310 A | 3/2003 |
| EP | 1498955 A | 1/2005 |
| EP | 1737044 A | 12/2006 |
| EP | 2017881 A | 1/2009 |
| EP | 2226847 A | 9/2010 |
| EP | 2290642 A | 3/2011 |
| EP | 2339639 A | 6/2011 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-101556 A | 10/1991 |
| JP | 05-029571 A | 2/1993 |
| JP | 05-119298 A | 5/1993 |
| JP | 05-251705 A | 9/1993 |
| JP | 05-335482 A | 12/1993 |
| JP | 08-264794 A | 10/1996 |
| JP | 10-003091 A | 1/1998 |
| JP | 11-505377 | 5/1999 |
| JP | 2000-044236 A | 2/2000 |
| JP | 2000-150900 A | 5/2000 |
| JP | 2001-053164 A | 2/2001 |
| JP | 2001-274355 A | 10/2001 |
| JP | 2002-076356 A | 3/2002 |
| JP | 2002-093924 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2003-152191 A | 5/2003 |
| JP | 2004-014094 A | 1/2004 |
| JP | 2004-054200 A | 2/2004 |

(56) References Cited

FOREIGN PATENT DOCUMENTS

| JP | 2004-103957 A | 4/2004 |
|---|---|---|
| JP | 2004-273614 A | 9/2004 |
| JP | 2004-273732 A | 9/2004 |
| JP | 2006-502597 | 1/2006 |
| JP | 2006-156985 A | 6/2006 |
| JP | 2006-165532 A | 6/2006 |
| JP | 2006-261178 A | 9/2006 |
| JP | 2006-294116 A | 10/2006 |
| JP | 2006-332629 A | 12/2006 |
| JP | 2007-096055 A | 4/2007 |
| JP | 2007-103918 A | 4/2007 |
| JP | 2007-220820 A | 8/2007 |
| JP | 2007-250863 A | 9/2007 |
| JP | 2008-042088 A | 2/2008 |
| JP | 2008-046619 A | 2/2008 |
| JP | 2008-091904 A | 4/2008 |
| JP | 2008-130814 A | 6/2008 |
| JP | 2008-153329 A | 7/2008 |
| JP | 2008-277665 A | 11/2008 |
| JP | 2009-016844 A | 1/2009 |
| JP | 2009-021536 A | 1/2009 |
| JP | 2009-033145 A | 2/2009 |
| JP | 2009-076065 A | 4/2009 |
| JP | 2009-099965 A | 5/2009 |
| JP | 2009-117669 A | 5/2009 |
| JP | 2009-135350 A | 6/2009 |
| JP | 2009-147069 A | 7/2009 |
| JP | 2009-152235 A | 7/2009 |
| JP | 2009-164393 A | 7/2009 |
| JP | 2009-167087 A | 7/2009 |
| JP | 2009-176864 A | 8/2009 |
| JP | 2009-182194 A | 8/2009 |
| JP | 2009-206508 A | 9/2009 |
| JP | 2009-212443 A | 9/2009 |
| JP | 2009-260002 A | 11/2009 |
| JP | 2009-260060 A | 11/2009 |
| JP | 2009-260364 A | 11/2009 |
| JP | 2010-518619 | 5/2010 |
| KR | 2008-0052107 A | 6/2008 |
| TW | 200929546 | 7/2009 |
| TW | 200937613 | 9/2009 |
| WO | WO-2000/030183 | 5/2000 |
| WO | WO-2004/038757 | 5/2004 |
| WO | WO-2004/114391 | 12/2004 |
| WO | WO-2006/095425 | 9/2006 |
| WO | WO-2006/118294 | 11/2006 |
| WO | WO-2007/029844 | 3/2007 |
| WO | WO-2008/062720 | 5/2008 |
| WO | WO-2008/097117 | 8/2008 |
| WO | WO-2008/122575 | 10/2008 |
| WO | WO-2008/123270 | 10/2008 |
| WO | WO-2009/041544 | 4/2009 |
| WO | WO-2009/075242 | 6/2009 |
| WO | WO-2009/087943 | 7/2009 |
| WO | WO-2009/093724 | 7/2009 |
| WO | WO-2009/096608 | 8/2009 |
| WO | WO-2009/110623 | 9/2009 |
| WO | WO-2011/070928 | 6/2011 |
| WO | WO-2011/077967 | 6/2011 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Janotti.A et al., "Oxygen Vacancies in ZnO", Appl. Phys. Lett. (Applied Physics Letters) , 2005, vol. 87, pp. 122102-1-122102-3.

Janotti.A et al., "Native Point Defects in ZnO", Phys. Rev. B (Physical Review. B), Oct. 4, 2007, vol. 76, No. 16, pp. 165202-1-165202-22.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

(56) References Cited

OTHER PUBLICATIONS

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kim.W et al., "An Experimental High-Density DRAM Cell with a Built-in Gain Stage", IEEE Journal of Solid-State Circuits, Aug. 1, 1994, vol. 29, No. 8, pp. 978-981.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M, "Synthesis of Homologous Compound with New Long-Period Structure", Nirim Newsletter, Mar. 1, 1995, vol. 150, pp. 1-4.
Nakamura.M et al., "The phase relations in the In2O3—Ga2ZnO4—ZnO system at 1350° C", Journal of Solid State Chemistry, Aug. 1, 1991, vol. 93, No. 2, pp. 298-315.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m <4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.S et al., "Challenge to Future Displays: Transparent AM-OLED Driven by PEALD Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.

(56) References Cited

OTHER PUBLICATIONS

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2010/072187) Dated Feb. 8, 2011.

Written Opinion (Application No. PCT/JP2010/072187) Dated Feb. 8, 2011.

Korean Office Action (Application No. 2013-7019493) Dated Feb. 24, 2014.

Chinese Office Action (Application No. 201080059256.X) Dated Mar. 10, 2014.

Taiwanese Office Action (Application No. 102125718) Dated Apr. 23, 2015.

Taiwanese Office Action (Application No. 099144998) Dated May 18, 2015.

Chinese Office Action (Application No. 201410239460.X) Dated May 19, 2016.

Chinese Office Action (Application No. 201410646241.3) Dated Apr. 6, 2017.

Cho.D et al., "Local structure and conduction mechanism in amorphous In-G-Zn—O films", Appl. Phys. Lett. (Applied Physics Letters) , 2009, vol. 94, pp. 112112-1-112112-3.

* cited by examiner

FIG. 5A1
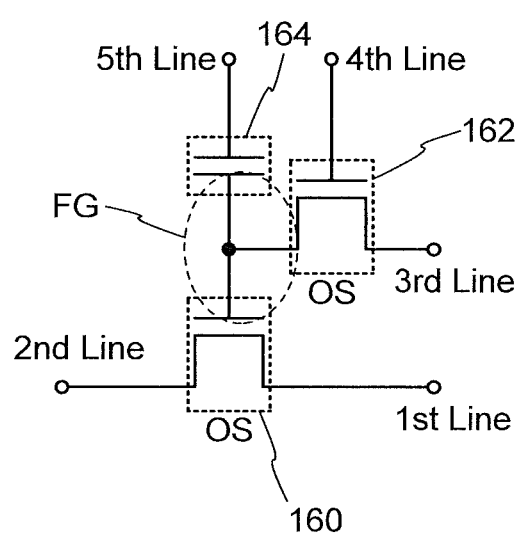
FIG. 5A2
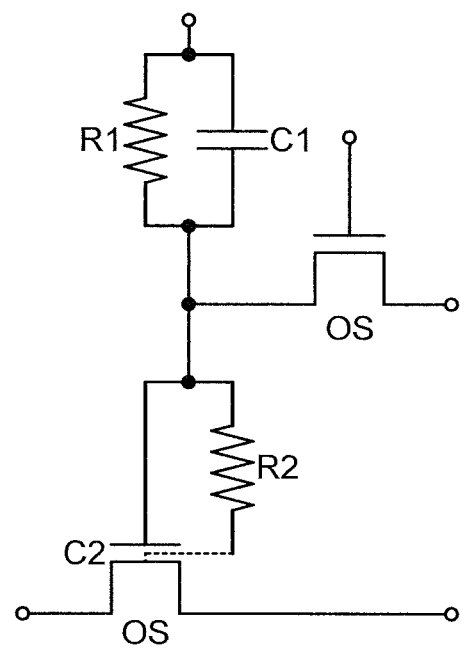
FIG. 5B
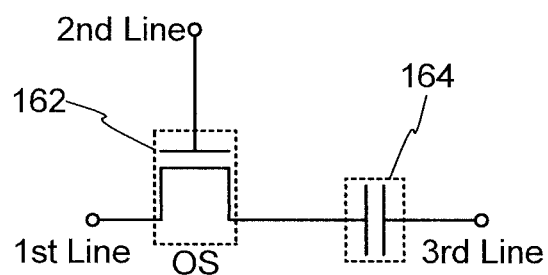

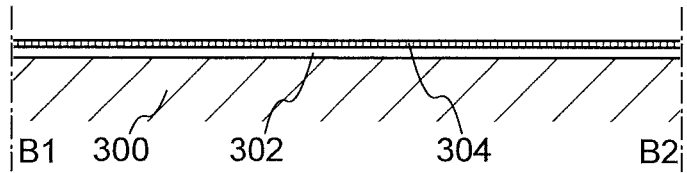
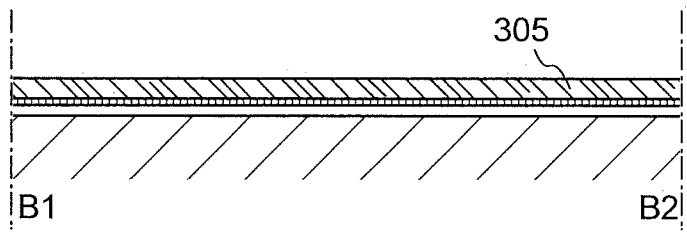
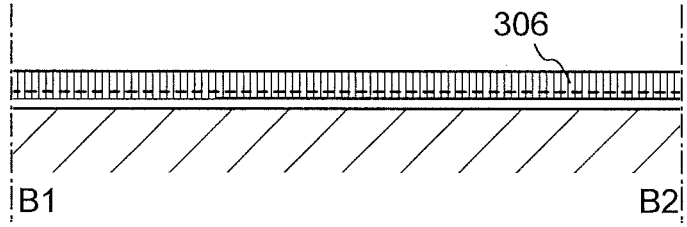
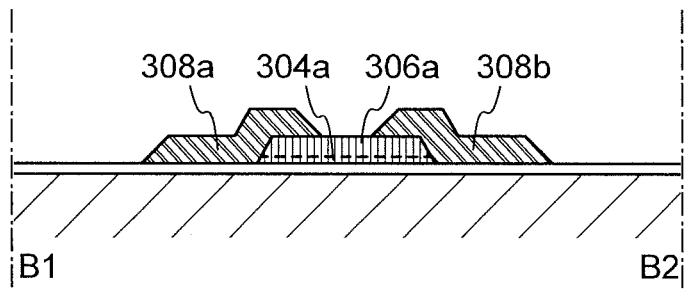
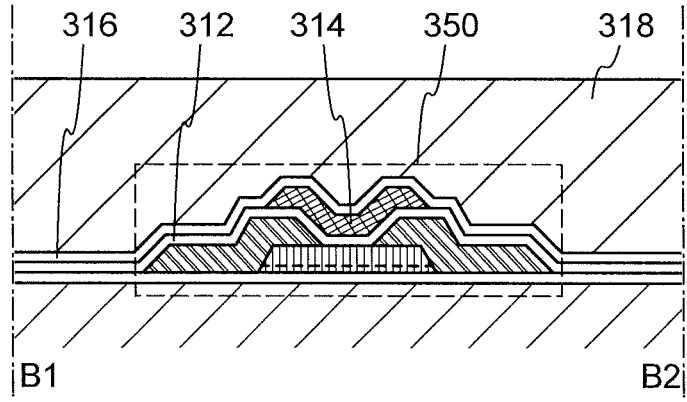

SEMICONDUCTOR DEVICE

CROSS-REFERENCE TO RELATED APPLICATIONS

This application is a continuation of U.S. application Ser. No. 17/949,436, filed Sep. 21, 2022, now allowed, which is a continuation of U.S. application Ser. No. 16/779,774, filed Feb. 3, 2020, now U.S. Pat. No. 11,456,296, which is a continuation of U.S. application Ser. No. 15/995,204, filed Jun. 1, 2018, now U.S. Pat. No. 10,553,589, which is a continuation of U.S. application Ser. No. 15/157,565, filed May 18, 2016, now U.S. Pat. No. 9,991,265, which is a continuation of U.S. application Ser. No. 13/905,178, filed May 30, 2013, now U.S. Pat. No. 9,349,735, which is a continuation of U.S. application Ser. No. 12/976,564, filed Dec. 22, 2010, now U.S. Pat. No. 8,455,868, which claims the benefit of a foreign priority application filed in Japan as Serial No. 2009-296202 on Dec. 25, 2009, all of which are incorporated by reference.

TECHNICAL FIELD

The disclosed invention relates to a semiconductor device using a semiconductor element and a manufacturing method of the semiconductor device.

BACKGROUND ART

Memory devices using semiconductor elements are broadly classified into two categories: a volatile memory device that loses stored data when power supply stops, and a non-volatile memory device that stores stored data even when power is not supplied.

A typical example of a volatile memory device is a DRAM (dynamic random access memory). A DRAM stores data in such a manner that a transistor included in a memory element is selected and charge is stored in a capacitor.

When data is read from a DRAM, charge in a capacitor is lost on the above-described principle; thus, another writing operation is necessary whenever data is read out. Moreover, a transistor included in a memory element has leakage current and charge flows into or out of a capacitor even when the transistor is not selected, so that the data storing time is short. For that reason, another writing operation (refresh operation) is necessary at predetermined intervals, and it is difficult to reduce power consumption sufficiently. Furthermore, since stored data is lost when power supply stops, an additional memory device using a magnetic material or an optical material is needed in order to store the data for a long time.

Another example of a volatile memory device is an SRAM (static random access memory). An SRAM stores stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile memory device is a flash memory. A flash memory includes a floating gate between a gate electrode and a channel formation region in a transistor and stores data by holding of charge in the floating gate. Therefore, a flash memory has advantages in that the data storing time is extremely long (almost permanent) and refresh operation which is necessary in a volatile memory device is not needed (e.g., see Patent Document 1).

However, a gate insulating layer included in a memory element deteriorates by tunneling current which flows in writing, so that the memory element stops its function after a predetermined number of writing operations. In order to reduce adverse effects of this problem, a method in which the number of writing operations for memory elements is equalized is employed, for example. However, complicated supplemental circuits are additionally needed to realize this method. Moreover, employing such a method does not solve the fundamental problem of lifetime. In other words, a flash memory is not suitable for applications in which data is frequently rewritten.

In addition, high voltage is necessary for holding of charge in the floating gate or removal of the charge, and a circuit for generating high voltage is also necessary. Further, it takes a relatively long time to hold or remove charge, and it is not easy to perform writing and erasing at higher speed.

REFERENCE

Patent Document

Patent Document 1: Japanese Published Patent Application No. S57-105889

DISCLOSURE OF INVENTION

In view of the foregoing problems, an object of one embodiment of the disclosed invention is to provide a semiconductor device with a novel structure, in which stored data can be stored even when power is not supplied in a data storing time and where there is no limitation on the number of times of writing.

In the disclosed invention, a semiconductor device is formed using a highly purified oxide semiconductor. A transistor formed using a highly purified oxide semiconductor has extremely small leakage current; therefore, data can be stored for a long time.

One embodiment of the disclosed invention is a semiconductor device including: a first transistor which includes a first channel formation region using a semiconductor material other than an oxide semiconductor, impurity regions provided so as to sandwich the first channel formation region, a first gate insulating layer over the first channel formation region, a first gate electrode over the first gate insulating layer, and a first source electrode and a first drain electrode which are electrically connected to the impurity regions; a second transistor which includes a second source electrode and a second drain electrode above the first transistor, a second channel formation region electrically connected to the second source electrode and the second drain electrode and using an oxide semiconductor material, a second gate insulating layer over the second channel formation region, and a second gate electrode over the second gate insulating layer; and a capacitor. One of the second source electrode and the second drain electrode of the second transistor and one electrode of the capacitor are electrically connected to each other.

In the above structure, the capacitor can include the second source electrode or the second drain electrode, the second gate insulating layer, and an electrode for the capacitor over the second gate insulating layer.

Further, the above semiconductor device can further include: a third transistor which includes a third source electrode and a third drain electrode above the first transistor, a third channel formation region electrically connected to the third source electrode and the third drain electrode and using an oxide semiconductor material, a third gate insulating layer over the third channel formation region, and a third gate electrode over the third gate insulating layer, a source line; a bit line; a word line; a first signal line; and a second signal line. The third gate electrode, one of the second source electrode and the second drain electrode, and the one electrode of the capacitor can be electrically connected to one another; the source line and the third source electrode can be electrically connected to each other; the bit line and the third drain electrode can be electrically connected to each other; the first signal line and the other of the second source electrode and the second drain electrode can be electrically connected to each other; the second signal line and the second gate electrode can be electrically connected to each other; and the word line and the other electrode of the capacitor can be electrically connected to each other.

Further, in the above structure, a logic circuit (an arithmetic circuit) or a driver circuit can include the first transistor.

Note that in this specification and the like, the term such as "over" or "below" does not necessarily mean that a component is placed "directly on" or "directly under" another component. For example, the expression "a gate electrode over a gate insulating layer" does not exclude the case where a component is placed between the gate insulating layer and the gate electrode. Moreover, the terms such as "over" and "below" are only used for convenience of description and can include the case where the positional relation of components is reversed, unless otherwise specified.

In addition, in this specification and the like, the term such as "electrode" or "line" does not limit a function of a component. For example, an "electrode" is sometimes used as part of a "line", and vice versa. Furthermore, the term "electrode" or "line" can include the case where a plurality of "electrodes" or "lines" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an "object having any electric function". There is no particular limitation on an "object having any electric function" as long as electric signals can be transmitted and received between components that are connected through the object.

Examples of an "object having any electric function" are a switching element such as a transistor, a resistor, an inductor, a capacitor, and an element with a variety of functions as well as an electrode and a line.

One embodiment of the present invention provides a semiconductor device with a layered structure of a transistor using a material other than an oxide semiconductor and a transistor using an oxide semiconductor.

Since the off current of a transistor using an oxide semiconductor is extremely low, stored data can be stored for an extremely long time by using the transistor. In other words, power consumption can be considerably reduced because refresh operation becomes unnecessary or the frequency of refresh operation can be extremely low. Moreover, stored data can be stored for a long time even when power is not supplied.

Further, a semiconductor device according to one embodiment of the disclosed invention does not need high voltage for writing of data and there is no problem of deterioration of elements. For example, since there is no need to perform injection of electrons to a floating gate and extraction of electrons from the floating gate which are needed in a conventional nonvolatile memory, deterioration of a gate insulating layer does not occur. In other words, one embodiment of the semiconductor device according to the present invention does not have a limit on the number of times of writing which is a problem in a conventional nonvolatile memory, and reliability thereof is drastically improved. Furthermore, data is written depending on on and off of the transistor, whereby high-speed operation can be easily realized. In addition, there is no need of operation for erasing data, which is another merit.

Further, a transistor which contains a material other than an oxide semiconductor can operate at sufficiently high speed; thus, by using the transistor, a variety of circuits (e.g., a logic circuit or a driver circuit) in which high-speed operation is needed can be favorably realized.

A semiconductor device with a novel feature can be realized by including both the transistor using a material other than an oxide semiconductor and the transistor using an oxide semiconductor.

BRIEF DESCRIPTION OF DRAWINGS

In the accompanying drawings:

FIGS. 5A1, 5A2, and 5B are circuit diagrams of a semiconductor device;

FIGS. 8A to 8E are cross-sectional views relating to manufacturing steps of a semiconductor device;

BEST MODE FOR CARRYING OUT THE INVENTION

Figure 1:
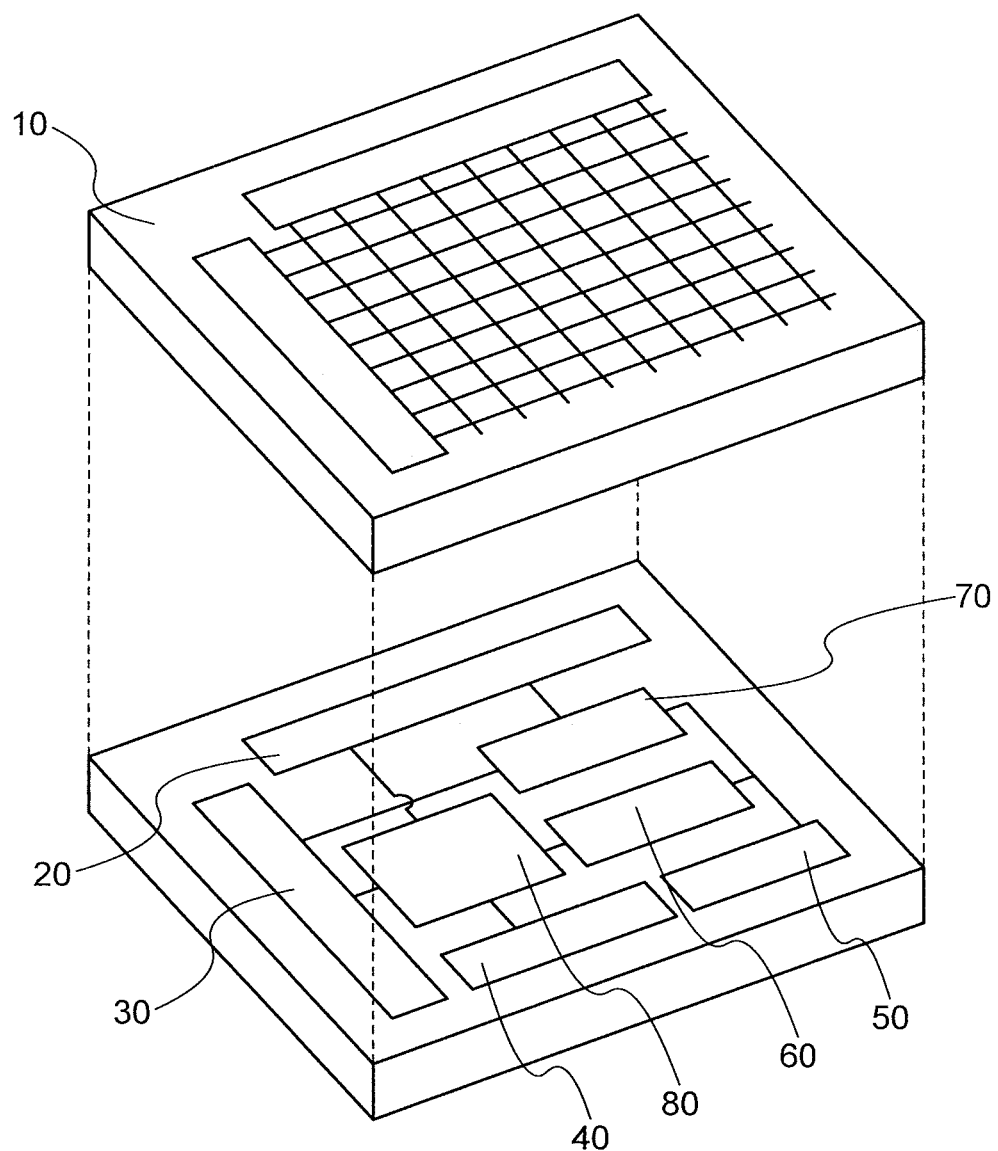
FIG. 1 is a schematic view of a semiconductor device.

Examples of embodiments of the present invention will be described below with reference to the accompanying drawings. Note that the present invention is not limited to the following description, and it is easily understood by those skilled in the art that modes and details disclosed herein can be modified in various ways without departing from the spirit and the scope of the present invention. Therefore, the present invention is not to be construed as being limited to the content of the embodiments included herein.

Note that the position, the size, the range, or the like of each structure illustrated in drawings and the like is not accurately represented in some cases for easy understanding. Therefore, the disclosed invention is not necessarily limited to the position, the size, the range, or the like disclosed in the drawings and the like.

In addition, in this specification and the like, ordinal numbers such as "first", "second", and "third" are used in order to avoid confusion among components, and the terms do not mean limitation of the number of components.

Embodiment 1

In this embodiment, structures and a manufacturing method of a semiconductor device according to one embodiment of the disclosed invention will be described with reference to FIG. 1, FIGS. 2A and 2B, FIGS. 3A and 3B, FIGS. 4A to 4C, and FIGS. 5A1, 5A2, and 5B. Note that in some of the circuit diagrams, "OS" is written beside a transistor in order to indicate that the transistor uses an oxide semiconductor.

<Outline of Structure of Semiconductor Device>

FIG. 1 is a schematic view illustrating an example of a structure of a semiconductor device. A semiconductor device according to one embodiment of the disclosed invention is, typically, a semiconductor device with a layered structure which includes a memory circuit in an upper portion and a logic circuit (also referred to as an arithmetic circuit) and a driver circuit which need high speed operation in a lower portion.

A semiconductor device illustrated in FIG. 1 is a semiconductor device (a memory device) including a memory cell array 10 in an upper portion, and a column decoder 20, a row decoder 30, an IO controller 40, an IO buffer 50, a command buffer 60, an address buffer 70, a controller 80, and the like which are included in a driver circuit in a lower portion. An arithmetic circuit such as a CPU may be included in the lower portion. Note that although a memory device is illustrated here as an example of a semiconductor device, one embodiment of the disclosed invention is not limited thereto.

<Cross-Sectional Structure of Semiconductor Device>

Figure 2A:
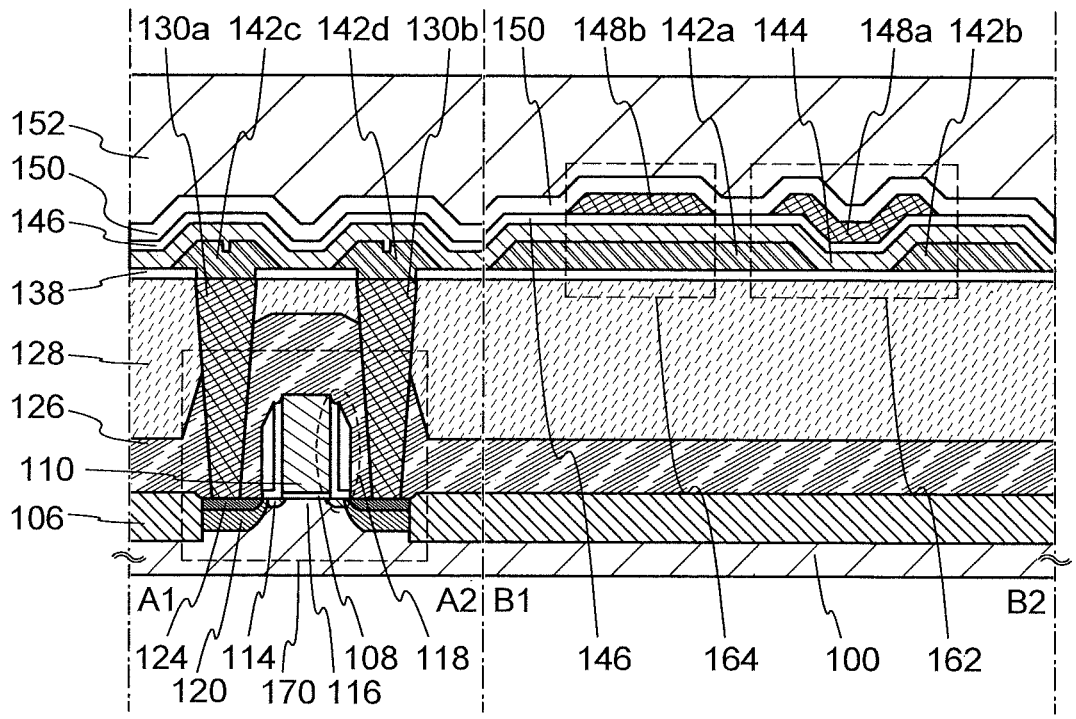
FIGS. 2A and 2B are cross-sectional views of a semiconductor device.
Figure 2B:
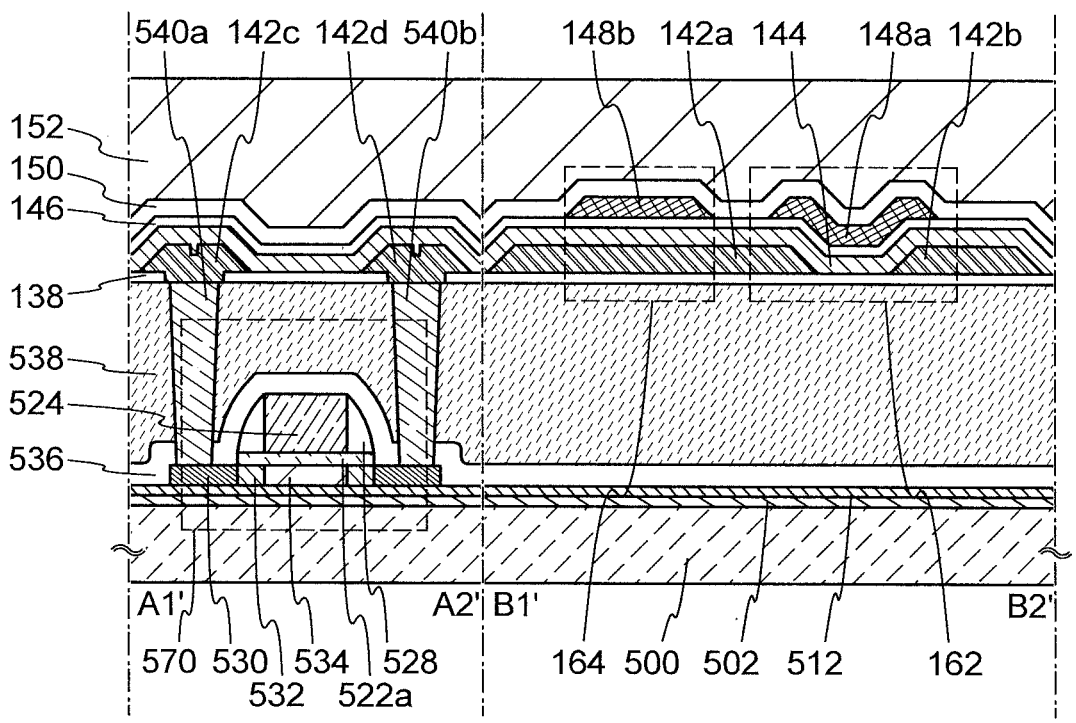

FIGS. 2A and 2B are cross-sectional views each illustrating an example of a specific structure of a semiconductor device. FIG. 2A and FIG. 2B are a cross-sectional view of a semiconductor device related to a first example and a cross-sectional view of a semiconductor device related to a second example, respectively. The semiconductor devices illustrated in FIGS. 2A and 2B each includes, in a lower portion, a transistor (a transistor 170 or a transistor 570) using a material other than an oxide semiconductor, and in an upper portion, a transistor 162 and a capacitor 164 each of which uses an oxide semiconductor. A transistor which uses a material other than an oxide semiconductor can easily operate at high speed and is used in a logic circuit (also referred to as an arithmetic circuit) and the like. On the other hand, a transistor which uses an oxide semiconductor is used in a memory circuit which utilizes the characteristics of the transistor or the like.

Although all the transistors are described as n-channel transistors here, it is needless to say that p-channel transistors can be used. Since the technical nature of the disclosed invention is to use an oxide semiconductor in the transistor 162 so that data can be stored, it is not necessary to limit a specific structure of a semiconductor device to the structure described here.

The transistor 170 illustrated in FIG. 2A includes a channel formation region 116 provided in a substrate 100 containing a semiconductor material (such as silicon); impurity regions 114 and high-concentration impurity regions 120 (these regions can be collectively referred to simply as impurity regions) provided so as to sandwich the channel formation region 116; a gate insulating layer 108 provided over the channel formation region 116; a gate electrode 110 provided over the gate insulating layer 108; and a source or drain electrode 130a and a source or drain electrode 130b which are electrically connected to the impurity regions.

Sidewall insulating layers 118 are provided on side surfaces of the gate electrode 110. The high-concentration impurity regions 120 are provided in regions of the substrate 100 that do not overlap with the sidewall insulating layers 118 when seen from a direction perpendicular to a surface of the substrate 100. Metal compound regions 124 are placed in contact with the high-concentration impurity regions 120. An element isolation insulating layer 106 is provided over the substrate 100 so as to surround the transistor 170. An interlayer insulating layer 126 and an interlayer insulating layer 128 are provided so as to cover the transistor 170. Each of the source or drain electrode 130a and the source or drain electrode 130b is electrically connected to the metal compound region 124 through an opening formed in the interlayer insulating layers 126 and 128. That is, each of the source or drain electrode 130a and the source or drain electrode 130b is electrically connected to the high-concentration impurity region 120 and the impurity region 114 through the metal compound region 124. Note that the sidewall insulating layers 118 are not provided in some cases so that integration of the transistor 170 and the like are realized.

The transistor 570 illustrated in FIG. 2B includes a channel formation region 534 provided in a layer which contains a semiconductor material (such as silicon) over a nitrogen-containing layer 502 and an oxide film 512; low-concentration impurity regions 532 and high-concentration impurity regions 530 (these regions can be collectively referred to simply as impurity regions) provided so as to sandwich the channel formation region 534; a gate insulating layer 522a provided over the channel formation region 534; a gate electrode 524 provided over the gate insulating layer 522a; and a source or drain electrode 540a and a source or drain electrode 540b which are electrically connected to the impurity regions.

Sidewall insulating layers 528 are provided on side surfaces of the gate electrode 524. The high-concentration impurity regions 530 are provided in regions of a base substrate 500 that do not overlap with the sidewall insulating layers 528 when seen from a direction perpendicular to a surface of the base substrate 500. An interlayer insulating layer 536 and an interlayer insulating layer 538 are provided so as to cover the transistor 570. Each of the source or drain electrode 540a and the source or drain electrode 540b is electrically connected to the high-concentration impurity region 530 through an opening formed in the interlayer insulating layers 536 and 538. Note that the sidewall insulating layers 528 are not provided in some cases so that integration of the transistor 570 and the like are realized.

The transistor 162 in each of FIG. 2A and FIG. 2B includes a source or drain electrode 142a and a source or drain electrode 142b which are provided over an insulating layer 138, an oxide semiconductor layer 144 electrically connected to the source or drain electrode 142a and the source or drain electrode 142b, a gate insulating layer 146 covering the source or drain electrode 142a, the source or drain electrode 142b, and the oxide semiconductor layer 144, and a gate electrode 148a provided over the gate insulating layer 146 so as to overlap with the oxide semiconductor layer 144.

Here, the oxide semiconductor layer 144 is preferably an oxide semiconductor layer which is highly purified by sufficiently removing impurity such as hydrogen therefrom or by supplying a sufficient amount of oxygen thereto. Specifically, the hydrogen concentration of the oxide semiconductor layer 144 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the hydrogen concentration of the oxide semiconductor layer 144 is measured by secondary ion mass spectrometry (SIMS). In the oxide semiconductor layer 144 which is highly purified by sufficiently reducing the concentration of hydrogen therein and in which defect levels in an energy gap due to oxygen deficiency are reduced by supplying a sufficient amount of oxygen, the carrier concentration is lower than $1 \times 10^{12}$/cm$^3$, preferably lower than $1 \times 10$/cm$^3$, more preferably lower than $1.45 \times 10^{10}$/cm$^3$. For example, the off current density (a value obtained by dividing the off current by the channel width of the transistor) at room temperature is approximately 10 zA/μm to 100 zA/μm (1 zA (zeptoampere) is $1 \times 10^{-21}$ A). The transistor 162 with significantly excellent off current characteristics can be obtained with the use of such an oxide semiconductor which is made to be an i-type (intrinsic) oxide semiconductor or a substantially i-type oxide semiconductor.

Note that since the oxide semiconductor layer 144 is not patterned to have an island shape in the transistor 162 in FIGS. 2A and 2B, the oxide semiconductor layer 144 is prevented from being contaminated by etching for patterning.

The capacitor 164 includes the source or drain electrode 142a, the oxide semiconductor layer 144, the gate insulating layer 146, and an electrode 148b. That is, the source or drain electrode 142a functions as one electrode of the capacitor 164 and the electrode 148b functions as the other electrode of the capacitor 164.

Note that in the capacitor 164 illustrated in FIGS. 2A and 2B, insulating properties between the source or drain electrode 142a and the electrode 148b can be adequately secured by stacking the oxide semiconductor layer 144 and the gate insulating layer 146.

Note that in the transistor 162 and the capacitor 164, edge portions of the source or drain electrode 142a and the source or drain electrode 142b are preferably tapered. Here, a taper angle is, for example, greater than or equal to 30° and less than or equal to 60°. Note that the "taper angle" means an inclination angle formed by a side surface and a bottom surface of a layer (for example, the source or drain electrode 142a) having a tapered shape when being observed in a direction perpendicular to the cross-section (a plane which is perpendicular to the surface of the substrate). When the edge portions of the source or drain electrode 142a and the source or drain electrode 142b are tapered, the coverage of the oxide semiconductor layer 144 can be improved and disconnection can be prevented.

Further, an interlayer insulating layer 150 is provided over the transistor 162 and the capacitor 164 and an interlayer insulating layer 152 is provided over the interlayer insulating layer 150.

Modified Example of Semiconductor Device

Figure 3A:
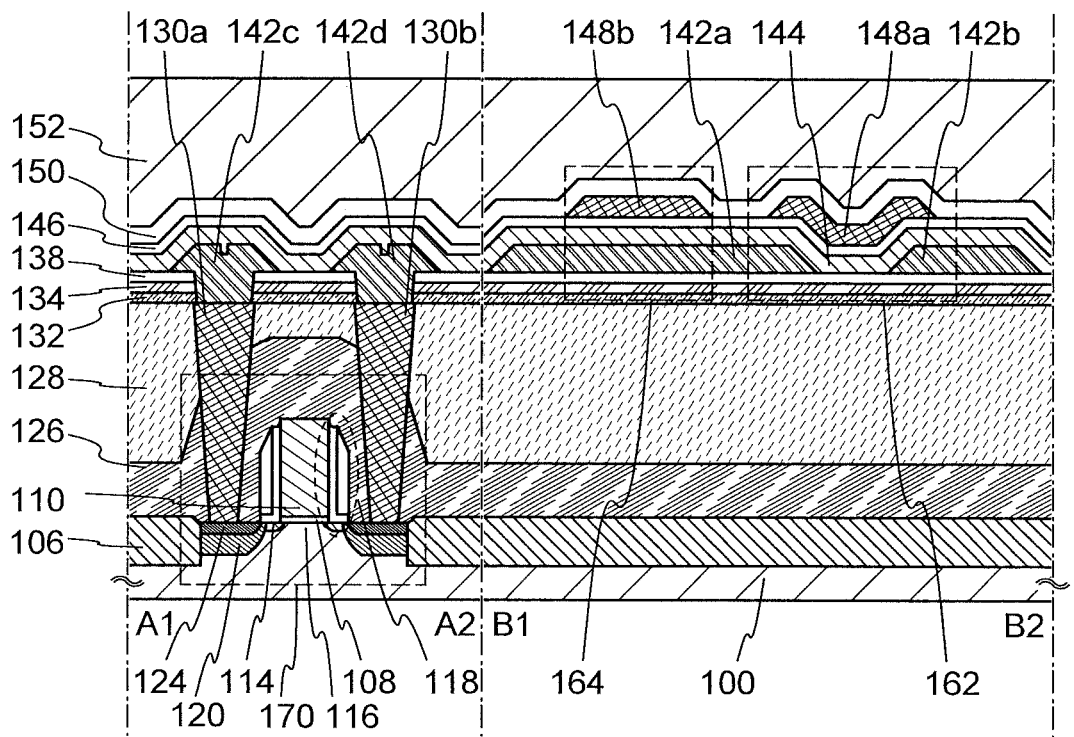
FIGS. 3A and 3B are cross-sectional views of a semiconductor device.
Figure 3B:
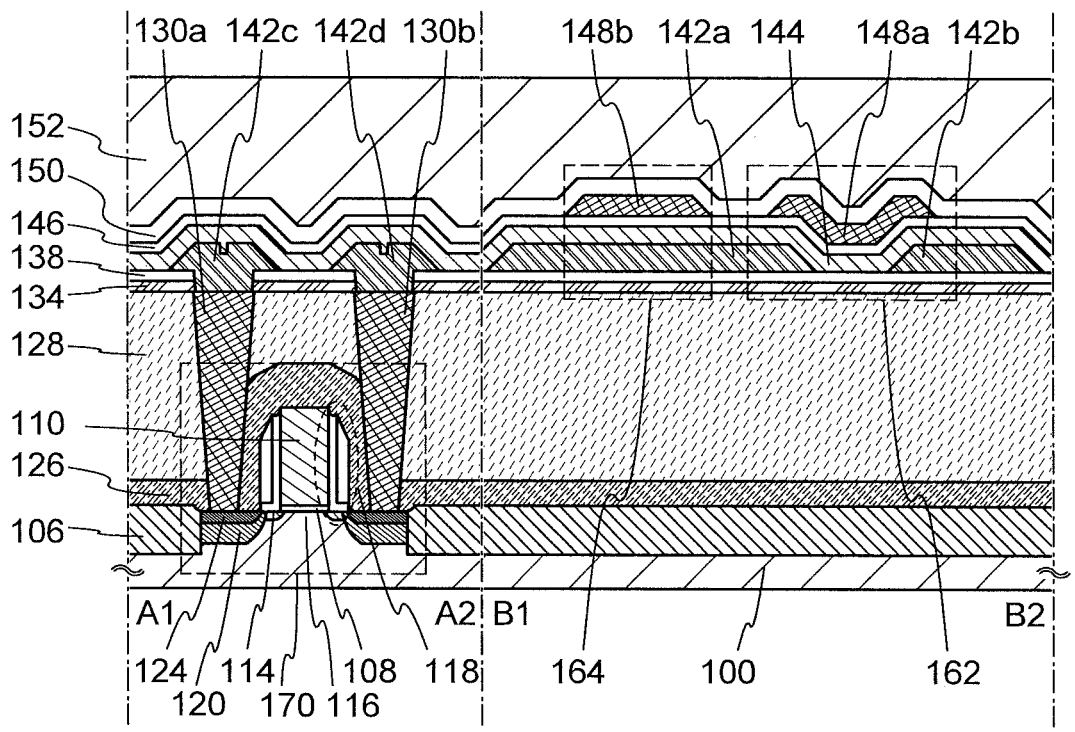

FIGS. 3A and 3B are cross-sectional views each illustrating a modified example of the structure of the semiconductor device. FIG. 3A and FIG. 3B are a cross-sectional view of a semiconductor device related to a first example and a cross-sectional view of a semiconductor device related to a second example, respectively. Note that each of the semiconductor devices illustrated in FIGS. 3A and 3B corresponds to a modified example of the structure illustrated in FIG. 2A.

The semiconductor device illustrated in FIG. 3A is different from the semiconductor device illustrated in FIG. 2A in that the former includes an insulating layer 132 and an insulating layer 134 between the interlayer insulating layer 128 and the insulating layer 138. Here, silicon nitride to which hydrogen is added is used for the insulating layer 132 and silicon nitride to which no hydrogen is added is used for the insulating layer 134. Further, it is preferable that the insulating layer 138 be formed using silicon oxide.

By employing the above structure which includes the insulating layer 132 formed using silicon nitride to which hydrogen is added as the lower layer and the insulating layer 134 formed using silicon nitride to which no hydrogen is added as the upper layer, hydrogen can be supplied to a material (e.g., silicon) of the channel formation region 116 of the transistor 170; accordingly, the characteristics of the transistor 170 can be improved, and hydrogen which causes deterioration of the characteristics of the transistor 162 using an oxide semiconductor can be prevented from entering the oxide semiconductor layer 144. Note that the insulating layer 132 formed using silicon nitride to which hydrogen is added can be formed by a plasma CVD method or the like. The insulating layer 134 formed using silicon nitride to which no hydrogen is added can be formed by a sputtering method or the like. In the case of using a sputtering method, for example, a deposition atmosphere may be a nitrogen atmosphere or a mixed atmosphere of nitrogen and argon, and silicon containing no hydrogen may be used as a sputtering target.

The semiconductor device illustrated in FIG. 3B is different from the semiconductor device illustrated in FIG. 2A in that the former includes the insulating layer 134 between the interlayer insulating layer 128 and the insulating layer 138. Here, the insulating layer 134 is formed using silicon nitride to which no hydrogen is added. The interlayer insulating layer 126 is formed using silicon nitride to which hydrogen is added. It is preferable that the interlayer insulating layer 128 and the insulating layer 138 be formed using silicon oxide.

By employing the above structure which includes the interlayer insulating layer 126 formed using silicon nitride to which hydrogen is added and the insulating layer 134 formed using silicon nitride to which no hydrogen is added, hydrogen can be supplied to a material (e.g., silicon) of the channel formation region 116 of the transistor 170; accordingly, the characteristics of the transistor 170 can be improved, and hydrogen which causes deterioration of the characteristics of the transistor 162 using an oxide semiconductor can be prevented from entering the oxide semiconductor layer 144. Note that the interlayer insulating layer 126 formed using silicon nitride to which hydrogen is added can be formed by a plasma CVD method or the like. The insulating layer 134 formed using silicon nitride to which no hydrogen is added can be formed by a sputtering method or the like. In the case of using a sputtering method, for example, a deposition atmosphere may be a nitrogen atmosphere or a mixed atmosphere of nitrogen and argon, and silicon containing no hydrogen may be used as a sputtering target.

Modified Example of Transistor and Capacitor in Upper Portion

Figure 4A:
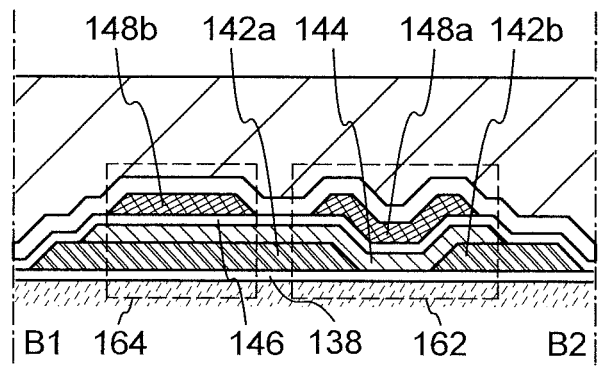
FIGS. 4A to 4C are cross-sectional views of a semiconductor device.
Figure 4B:
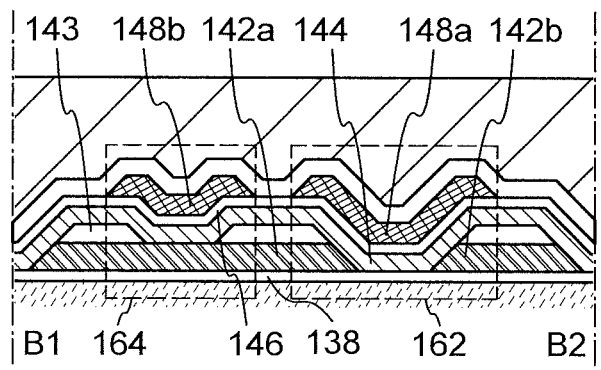
Figure 4C:
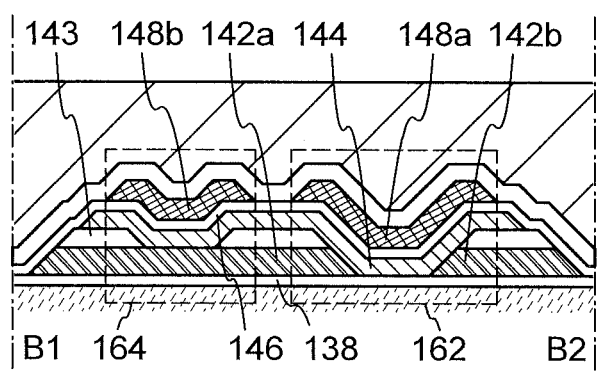

Next, modified examples of the transistor 162 and the capacitor 164 in the upper portion which are illustrated in FIGS. 2A and 2B are illustrated in FIG. 4A, FIG. 4B, and FIG. 4C.

The transistor and the capacitor which are illustrated in FIG. 4A are the modified examples of the transistor and the capacitor in the upper portion of the semiconductor device illustrated in FIGS. 2A and 2B.

The structure illustrated in FIG. 4A is different from those illustrated in FIGS. 2A and 2I in that the former includes the oxide semiconductor layer which is formed to have an island shape. That is, in the structures illustrated in FIGS. 2A and 2B, the oxide semiconductor layer 144 entirely covers the insulating layer 138, the source or drain electrode 142a, and the source or drain electrode 142b; on the other hand, in the structure illustrated in FIG. 4A, the island-shaped oxide semiconductor layer 144 partly covers the insulating layer 138, the source or drain electrode 142a, and the source or drain electrode 142b. Here, edge portions of the island-shaped oxide semiconductor layer 144 are preferably tapered. It is preferable that a taper angle be greater than or equal to 30° and less than or equal to 60°, for example.

Further, in the capacitor 164, insulating properties between the source or drain electrode 142a and the electrode 148b can be adequately secured by stacking the oxide semiconductor layer 144 and the gate insulating layer 146.

The transistor and the capacitor which are illustrated in FIG. 4B are other modified examples of the transistor and the capacitor in the upper portion of the semiconductor device illustrated in FIGS. 2A and 2B.

The structure illustrated in FIG. 4B is different from the structures illustrated in FIGS. 2A and 2B in that the former includes an insulating layer 143 which is formed over the source or drain electrode 142a and the source or drain electrode 142b. Further, the oxide semiconductor layer 144 is formed so as to cover the insulating layer 143, the source or drain electrode 142a, and the source or drain electrode 142b. In addition, in the structure illustrated in FIG. 4B, the oxide semiconductor layer 144 is provided in contact with the source or drain electrode 142a through an opening formed in the insulating layer 143.

When the insulating layer 143 is provided, capacitance which is formed between the gate electrode and the source electrode and between the gate electrode and the drain electrode is reduced and high-speed operation of the transistor can be realized.

The transistor and the capacitor which are illustrated in FIG. 4C are partly different from the transistors and the capacitors which are illustrated in FIG. 4A and FIG. 4B.

The structure illustrated in FIG. 4C is different from that illustrated in FIG. 4A in that the former includes the insulating layer 143 formed over the source or drain electrode 142a and the source or drain electrode 142b. Further, the oxide semiconductor layer 144 is formed so as to cover the insulating layer 143, the source or drain electrode 142a, and the source or drain electrode 142b. Moreover, the structure illustrated in FIG. 4C is different from that illustrated in FIG. 4B in that the former includes the oxide semiconductor layer 144 which is formed to have an island shape. With such a structure, both an effect which can be obtained in the structure illustrated in FIG. 4A and an effect which can be obtained in the structure illustrated in FIG. 4B can be obtained.

<Circuit Configuration and Operation of Semiconductor Device>

Next, an example of a circuit configuration of the above semiconductor device and operation thereof are described. FIGS. 5A1, 5A2, and 5B illustrate examples of a circuit configuration in which the semiconductor device illustrated in FIG. 2A or FIG. 2B is used.

In a semiconductor device illustrated in FIG. 5A1, a first line (also referred to as a source line) and a source electrode of a transistor 160 are electrically connected to each other, and a second line (also referred to as a bit line) and a drain electrode of the transistor 160 are electrically connected to each other. Further, a third line (also referred to as a first signal line) and one of the source electrode and the drain electrode of the transistor 162 are electrically connected to each other, and a fourth line (also referred to as a second signal line) and the gate electrode of the transistor 162 are electrically connected to each other. A gate electrode of the transistor 160, the other of the source electrode and the drain electrode of the transistor 162, and the one electrode of the capacitor 164 are electrically connected to one another. Further, a fifth line (also referred to as a word line) and the other electrode of the capacitor 164 are electrically connected to each other.

Here, a transistor using the above-described oxide semiconductor is used as the transistor 160 and the transistor 162. A transistor using the above-described oxide semiconductor has a characteristic of significantly low off current. Therefore, when the transistor 162 is turned off, the potential of the gate electrode of the transistor 160 can be held for an extremely long time. Providing the capacitor 164 facilitates holding of charge given to the gate electrode of the transistor 160 and reading of stored data. Note that the transistor 162 using an oxide semiconductor has a channel length (L) greater than or equal to 10 nm and less than or equal to 1000 nm and thus consumes a small amount of power and operates at extremely high speed.

The semiconductor device in FIG. 5A1 utilizes a characteristic in which the potential of the gate electrode of the transistor 160 can be held, whereby writing, storing, and reading of data can be performed as follows.

Firstly, writing and storing of data will be described. First, the potential of the fourth line is set to potential which allows the transistor 162 to be turned on, so that the transistor 162 is turned on. Accordingly, the potential of the third line is supplied to the gate electrode of the transistor 160 and the capacitor 164. That is, predetermined charge is given to the gate electrode of the transistor 160 (writing). Here, charge for supply of a potential level or charge for supply a different potential level (hereinafter referred to as Low level charge and High level charge) is given. After that, the potential of the fourth line is set to potential which allows the transistor 162 to be turned off, so that the transistor 162 is turned off. Thus, the charge given to the gate electrode of the transistor 160 is held (storing).

Since the off current of the transistor 162 is significantly low, the charge of the gate electrode of the transistor 160 is held for a long time.

Next, reading of data will be described. By supplying appropriate potential (reading potential) to the fifth line while predetermined potential (constant potential) is supplied to the first line, the potential of the second line varies depending on the amount of charge held in the gate electrode of the transistor 160. This is because in general, when the transistor 160 is an n-channel transistor, apparent threshold voltage $V_{th\_H}$ in the case where High level charge is given to the gate electrode of the transistor 160 is lower than apparent threshold voltage $V_{th\_L}$ in the case where Low level charge is given to the gate electrode of the transistor 160. Here, apparent threshold voltage refers to the potential of the fifth line, which is needed to turn on the transistor 160. Thus, the potential of the fifth line is set to potential $V_0$ intermediate between $V_{th\_H}$ and $V_{th\_L}$, whereby charge given to the gate electrode of the transistor 160 can be determined. For example, in the case where High level charge is given in writing, when the potential of the fifth line is set to $V_0$ ($>V_{th\_H}$), the transistor 160 is turned on. In the case where Low level charge is given in writing, even when the potential of the fifth line is set to $V_0$ ($<V_{th\_L}$), the transistor 160 remains in an off state. Therefore, the stored data can be read by the potential of the second line.

Note that in the case where memory cells are arrayed to be used, only data of a desired memory cell is necessary to be read. Thus, in order that data of a predetermined memory cell is read and data of the other memory cells is not read, in the case where the transistors 160 are connected in parallel between the memory cells, potential which allows the transistor 160 to be turned off regardless of a state of the gate electrode, that is, potential lower than $V_{th\_H}$ may be supplied to fifth lines of the memory cells whose data is not to be read. In the case where the transistors 160 are connected in series between the memory cells, potential which allows the transistor 160 to be turned on regardless of the state of the gate electrode, that is, potential higher than $V_{th\_A}$ may be supplied to the fifth lines.

Next, rewriting of data will be described. Rewriting of data is performed similarly to the writing and storing of data. That is, the potential of the fourth line is set to potential which allows the transistor 162 to be turned on, so that the transistor 162 is turned on. Accordingly, the potential of the third line (potential related to new data) is supplied to the gate electrode of the transistor 160 and the capacitor 164. After that, the potential of the fourth line is set to potential which allows the transistor 162 to be turned off, so that the transistor 162 is turned off. Accordingly, charge related to new data is given to the gate electrode of the transistor 160.

In the semiconductor device according to the disclosed invention, data can be directly rewritten by another writing of data as described above. Therefore, erasing operation which is necessary for a flash memory and the like is not needed, and reduction in operation speed, which is attributed to erasing operation, can be suppressed. In other words, high-speed operation of the semiconductor device can be realized.

Note that the source electrode or the drain electrode of the transistor 162 is electrically connected to the gate electrode of the transistor 160, thereby having an effect similar to an effect of a floating gate of a floating gate transistor used for a nonvolatile memory element. Therefore, a portion in the drawing where the source electrode or the drain electrode of the transistor 162 and the gate electrode of the transistor 160 are electrically connected to each other is called a floating gate portion FG in some cases. When the transistor 162 is off, the floating gate portion FG can be regarded as being embedded in an insulator and thus charge is held in the floating gate portion FG. The amount of off current of the transistor 162 using an oxide semiconductor is less than or equal to one hundred thousandth of the amount of off current of a transistor formed using silicon or the like; thus, lost of the charge accumulated in the floating gate portion FG due to leakage current of the transistor 162 is negligible. That is, with the transistor 162 using an oxide semiconductor, a nonvolatile memory device can be realized.

For example, when the off current density of the transistor 162 is approximately 10 zA (1 zA (zeptoampere) is $1 \times 10^{-21}$ A) at room temperature and the capacitance value of the capacitor 164 is approximately 1 pF, data can be stored at least for $10^6$ seconds or longer. It is needless to say that the storing time depends on transistor characteristics and the capacitance value.

Further, in that case, the problem of deterioration of a gate insulating film (a tunnel insulating film), which is pointed out in a conventional floating gate transistor, does not exist. That is to say, the deterioration of a gate insulating film due to injection of an electron into a floating gate, which has been conventionally regarded as a problem, can be avoided. This means that there is no limit on the number of times of writing in principle. Furthermore, high voltage needed for writing or erasing in a conventional floating gate transistor is not necessary.

A circuit structure of the semiconductor device illustrated in FIG. 5A1 in which the components such as the transistors in the semiconductor device include a resistor and a capacitor can be replaced with a circuit structure illustrated in FIG. 5A2. That is, in FIG. 5A2, the transistor 160 and the capacitor 164 are each regarded as including a resistor and a capacitor. R1 and C1 denote the resistance value and the capacitance value of the capacitor 164, respectively. The resistance value R1 corresponds to a resistance value which depends on the insulating layer included in the capacitor 164. R2 and C2 denote the resistance value and the capacitance value of the transistor 160, respectively. The resistance value R2 corresponds to a resistance value which depends on the gate insulating layer included in the transistor 160 at the time when the transistor 160 is on. The capacitance value C2 corresponds to so-called gate capacitance (capacitance formed between the gate electrode and the source electrode and between the gate electrode and the drain electrode) value. Note that the resistance value R2 only denotes the resistance value between the gate electrode and the channel formation region of the transistor 160, and in order that this point is clarified, part of the connection is represented by a dotted line.

A charge holding time (which can be also referred to as a data storing time) is determined mainly by off current of the transistor 162 in the case where R1 and R2 satisfy R1≥ROS (R1 is ROS or more) and R2≥ROS (R2 is ROS or more), where the resistance value (also referred to as effective resistance) between the source electrode and the drain electrode when the transistor 162 is off is ROS.

On the other hand, when the above relation is not satisfied, it is difficult to sufficiently secure the holing time even if the off current of the transistor 162 is sufficiently low. This is because the amount of leakage current generated in part other than the transistor 162 is large. Thus, it can be said that the above relation is desirably satisfied in the semiconductor device disclosed in this embodiment.

It is desirable that C1 and C2 satisfy C1≥C2 (C1 is C2 or more). If C1 is large, variation in the potential of the fifth line can be made small when the potential of the floating gate portion FG is controlled by the fifth line (e.g., at the time of reading).

When the above relation is satisfied, a more preferable semiconductor device can be realized. Note that R1 and R2 are controlled by the gate insulating layers of the transistor 160 and the transistor 162. C1 and C2 are similarly controlled. Therefore, the material, the thickness, and the like of the gate insulating layer are desirably set as appropriate so that the above relation is satisfied.

A semiconductor device illustrated in FIG. 5B is a semiconductor device having a structure in which the transistor 160 illustrated in FIG. 5A1 is not provided. In the semiconductor device illustrated in FIG. 5B, a first line (also referred to as a first signal line) and one of the source electrode and the drain electrode of the transistor 162 are electrically connected to each other. A second line (also referred to as a second signal line) and the gate electrode of the transistor 162 are electrically connected to each other. Further, the other of the source electrode and the drain electrode of the transistor 162 and the one electrode of the capacitor 164 are electrically connected to each other. A third line (also referred to as a capacitor line) and the other electrode of the capacitor 164 are electrically connected to each other.

Here, a transistor using the above oxide semiconductor is used as the transistor 162. A transistor using the above oxide semiconductor has a characteristic of significantly low off current. Therefore, when the transistor 162 is turned off, the potential supplied to the capacitor 164 can be held for an extremely long time. Note that the transistor 162 using an oxide semiconductor has a channel length (L) greater than or equal to 10 nm and less than or equal to 1000 nm and thus consumes a small amount of power and operates at extremely high speed.

The semiconductor device illustrated in FIG. 5B utilizes a characteristic in which the potential supplied to the capacitor 164 can be held, whereby writing, storing, and reading of data can be performed as follows.

Firstly, writing and storing of data will be described. For simplicity, the potential of the third line is fixed here. First, the potential of the second line is set to potential which allows the transistor 162 to be turned on, so that the transistor 162 is turned on. In this manner, the potential of the first line is supplied to the one electrode of the capacitor 164. That is, predetermined charge is given to the capacitor 164 (writing). After that, the potential of the second line is set to potential which allows the transistor 162 to be turned off, so that the transistor 162 is turned off. Thus, the charge given to the capacitor 164 is held (storing). The transistor 162 has extremely low off current as described above and thus can hold charge for a long time.

Next, reading of data will be described. By setting the potential of the second line to potential which allows the transistor 162 to be turned on while predetermined potential (constant potential) is supplied to the first line, the potential of the first line varies depending on the amount of charge held in the capacitor 164. Therefore, the stored data can be read by the potential of the first line.

Since the charge of the capacitor 164 is lost in the case where the data is read, it is to be noted that another writing is performed.

Next, rewriting of data will be described. Rewriting of data is performed similarly to the writing and storing of data. That is, the potential of the second line is set to potential which allows the transistor 162 to be turned on, so that the transistor 162 is turned on. Accordingly, the potential of the first line (potential related to new data) is supplied to the one electrode of the capacitor 164. After that, the potential of the second line is set to potential which allows the transistor 162 to be turned off, so that the transistor 162 is turned off. Accordingly, charge related to new data is given to the capacitor 164.

In the semiconductor device according to one embodiment of the disclosed invention, data can be directly rewritten by another writing of data as described above. Therefore, high-speed operation of the semiconductor device can be realized.

Note that in the above description, an n-channel transistor in which electrons are majority carriers is used. However, it is needless to say that a p-channel transistor in which holes are majority carriers can be used instead of the n-channel transistor.

The structures, methods, and the like described in this embodiment can be combined as appropriate with any of the structures, methods, and the like described in the other embodiments.

Embodiment 2

In this embodiment, a manufacturing method of a semiconductor device using an oxide semiconductor, specifically, a manufacturing method of the transistor 162 in an upper portion in FIGS. 2A and 2B is described with reference to FIGS. 6A to 6E. Note that since FIGS. 6A to 6E are cross-sectional views mainly illustrating the manufacturing steps and the like of the transistor 162, detailed description of the transistor 170 and the like below the transistor 162 is omitted.

First, the insulating layer 138 is formed over the interlayer insulating layer 128. After that, a conductive layer is formed over the insulating layer 138 and is selectively etched, so that the source or drain electrode 142a and the source or drain electrode 142b are formed (see FIG. 6A).

The insulating layer 138 functions as a base and can be formed by a PVD method, a CVD method, or the like. The insulating layer 138 can be formed using a material containing an inorganic insulating material such as silicon oxide, silicon oxynitride, silicon nitride, hafnium oxide, aluminum oxide, or tantalum oxide. Note that it is preferable that the insulating layer 138 contain hydrogen or water as little as possible. A structure in which the insulating layer 138 is not provided can be employed.

The conductive layer can be formed by a PVD method such as a sputtering method, or a CVD method such as a plasma CVD method. As a material for the conductive layer, an element selected from aluminum, chromium, copper, tantalum, titanium, molybdenum, and tungsten; an alloy containing any of these elements as a component; or the like can be used. Moreover, one or more materials selected from manganese, magnesium, zirconium, and beryllium may be used. Alternatively, aluminum combined with one or more of elements selected from titanium, tantalum, tungsten, molybdenum, chromium, neodymium, and scandium may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source or drain electrode 142a and the source or drain electrode 142b having tapered shapes.

Alternatively, the conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer is preferably etched so that edge portions of the source or drain electrode 142a and the source or drain electrode 142b are tapered. Here, a taper angle is preferably greater than or equal to 30° and less than or equal to 60°, for example. The edge portions of the source or drain electrode 142a and the source or drain electrode 142b are etched so as to be tapered; accordingly, the coverage of the gate insulating layer 146 to be formed later is improved and disconnection can be prevented. Note that a "taper angle" means an inclination angle formed by the side surface and the bottom surface of the layer having a tapered shape (e.g., the source or drain electrode 142a) when being observed in a direction perpendicular to the cross section (plane which is perpendicular to the surface of the substrate).

The channel length (L) of the transistor is determined by a distance between a lower edge portion of the source or drain electrode 142a and a lower edge portion of the source or drain electrode 142b. Note that in the case where the channel length (L) of the transistor is 25 nm or less, light exposure for forming a mask is preferably performed with extreme ultraviolet rays whose wavelength is short of several nanometers to several tens of nanometers. The resolution of light exposure with extreme ultraviolet rays is high and the depth of focus is large. For these reasons, the channel length (L) of the transistor to be formed later can be in the range of greater than or equal to 10 nm and less than or equal to 1000 nm (1 μm), and the circuit can operate at higher speed. Moreover, miniaturization can lead to low power consumption of a semiconductor device.

Note that an insulating layer may be formed over the source or drain electrode 142a and the source or drain electrode 142b. By providing the insulating layer, parasitic capacitance formed between a gate electrode to be formed later and the source or drain electrode 142a and between the gate electrode and the source or drain electrode 142b can be reduced.

Next, the oxide semiconductor layer 144 is formed so as to cover the source or drain electrode 142a and the source or drain electrode 142b (see FIG. 68).

The oxide semiconductor layer 144 can be formed using any of the following oxide semiconductors; a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, and an In—Mg—O-based oxide semiconductor; and a single-component metal oxide such as an In—O-based oxide semiconductor, a Sn—O-based oxide semiconductor, and a Zn—O-based oxide semiconductor.

In particular, an In—Ga—Zn—O-based oxide semiconductor material has sufficiently high resistance when there is no electric field and thus off current can be sufficiently reduced. In addition, with high field-effect mobility, the In—Ga—Zn—O-based oxide semiconductor material is suitable for a semiconductor material used in a semiconductor device.

As a typical example of the In—Ga—Zn—O-based oxide semiconductor material, one represented by $InGaO_3(ZnO)_m$ (m>0 and m is not limited to a natural number) is given.

Using M instead of Ga, there is an oxide semiconductor material expressed by $InMO_3(ZnO)_m$ (m>0 and m is not limited to a natural number). Here, M denotes one or more of metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni. Ga and Mn, Ga and Co, or the like. Note that the above-described compositions are derived from the crystal structures that the oxide semiconductor material can have and are only examples.

As a target for forming the oxide semiconductor layer 144 by a sputtering method, a target having a composition ratio of In:Ga:Zn=1:x:y (x is 0 or more and y is more than or equal to 0.5 and less than or equal to 5) is preferably used. For example, a target having a composition ratio of $In_2O_3$:$Ga_2O_3$:ZnO=1:1:2 [molar ratio], or the like can be used. Alternatively, a target having a composition ratio of $In_2O_3$:$Ga_2O_3$:ZnO=1:1:1 [molar ratio], a target having a composition ratio of $In_2O_3$:$Ga_2O_3$:ZnO=1:1:4 [molar ratio], or a target having a composition ratio of $In_2O_3$:ZnO=1:2 [molar ratio] can be used.

In this embodiment, the oxide semiconductor layer 144 having an amorphous structure is formed by a sputtering method using an In—Ga—Zn—O-based metal oxide target.

It is preferable that a metal oxide contained in the metal oxide target have a relative density of 80% or higher, preferably 95% or higher, more preferably 99.9% or higher. With the use of the metal oxide target with high relative density, the oxide semiconductor layer 144 having a dense structure can be formed.

The atmosphere in which the oxide semiconductor layer 144 is formed is preferably a rare gas (typically argon) atmosphere, an oxygen atmosphere, or a mixed atmosphere of a rare gas (typically argon) and oxygen. Specifically, it is preferable to use a high-purity gas atmosphere, for example, from which an impurity such as hydrogen, water, a hydroxyl group, or a hydride is removed so that the concentration is 1 ppm or lower (preferably 10 ppb or lower).

In forming the oxide semiconductor layer 144, the object is held in a treatment chamber that is maintained at reduced pressure and is heated so that the temperature of the object is higher than or equal to 100° C. and lower than 550° C., preferably higher than or equal to 200° C. and lower than or equal to 400° C. Alternatively, the temperature of the object in forming the oxide semiconductor layer 144 may be room temperature. Then, a sputtering gas from which hydrogen, water, and the like are removed is introduced while moisture in the treatment chamber is removed, whereby the oxide semiconductor layer 144 is formed using the above-described target. The oxide semiconductor layer 144 is formed while the object is heated, so that an impurity contained in the oxide semiconductor layer 144 can be reduced. Moreover, damage due to sputtering can be reduced. An entrapment vacuum pump is preferably used in order to remove moisture in the treatment chamber. For example, a cryopump, an ion pump, or a titanium sublimation pump can be used. A turbo pump provided with a cold trap may be used. By evacuation with the cryopump or the like, hydrogen, water, and the like can be removed from the treatment chamber, whereby the impurity concentration of the oxide semiconductor layer 144 can be reduced.

The oxide semiconductor layer 144 can be formed under the following conditions, for example: the distance between the object and the target is 170 mm; the pressure is 0.4 Pa; the direct-current (DC) power is 0.5 kW; and the atmosphere is an oxygen (the proportion of the oxygen flow is 100%) atmosphere, an argon (the proportion of the argon flow is 100%) atmosphere, or a mixed atmosphere of oxygen and argon. Note that it is preferable to use a pulse direct current (DC) power supply because powder substances (also referred to as particles or dust) generated in film deposition can be reduced and the thickness distribution can be uniform. The thickness of the oxide semiconductor layer 144 is greater than or equal to 1 nm and less than or equal to 50 nm, preferably greater than or equal to 1 nm and less than or equal to 30 nm, more preferably greater than or equal to 1 nm and less than or equal to 10 nm. Using the oxide semiconductor layer 144 with such a thickness can suppress a short-channel effect due to miniaturization. Note that an appropriate thickness differs depending on an oxide semiconductor material used, the usage of a semiconductor device, or the like; therefore, it is also possible to set the thickness as appropriate depending on the material to be used, the usage, or the like.

Note that before the oxide semiconductor layer 144 is formed by a sputtering method, a material attached to a surface over which the oxide semiconductor layer 144 is formed (e.g., a surface of the interlayer insulating layer 128) is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near an object. Note that a nitrogen atmosphere, a helium atmosphere, an oxygen atmosphere, or the like may be used instead of an argon atmosphere.

After that, heat treatment (first heat treatment) is preferably performed on the oxide semiconductor layer 144. Excess hydrogen (including water and a hydroxyl group) contained in the oxide semiconductor layer 144 can be removed by the first heat treatment; thus, the structure of the oxide semiconductor layer can be improved and defect levels in an energy gap can be reduced. The temperature of the first heat treatment is, for example, higher than or equal to 300° C. and lower than 550° C., or higher than or equal to 400° C. and lower than or equal to 500° C.

The heat treatment can be performed in such a way that, for example, an object is introduced into an electric furnace in which a resistance heating element or the like is used, and heated in a nitrogen atmosphere at 450° C. for an hour. The oxide semiconductor layer 144 is not exposed to the air during the heat treatment so that entry of water and hydrogen can be prevented.

The heat treatment apparatus is not limited to the electric furnace and may be an apparatus for heating an object by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object. Note that the inert gas may be changed to a gas containing oxygen during the process. This is because defect levels in an energy gap caused by oxygen deficiency can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is 6 N (99.9999%) or higher, preferably 7 N (99.99999%) or higher (i.e., the impurity concentration is 1 ppm or lower, preferably 0.1 ppm or lower).

In any case, the i-type (intrinsic) or substantially i-type oxide semiconductor layer 144 in which impurities are reduced by the first heat treatment is formed, which enables a transistor having extremely excellent characteristics to be realized.

The above heat treatment (first heat treatment) can be referred to as dehydration treatment, dehydrogenation treatment, or the like because of its effect of removing hydrogen, water, and the like. The dehydration treatment or dehydrogenation treatment can be performed, for example, after the oxide semiconductor layer is formed, after the gate insulating layer is formed, or after the gate electrode is formed. Such dehydration treatment or dehydrogenation treatment may be performed once or plural times.

Figure 6A:
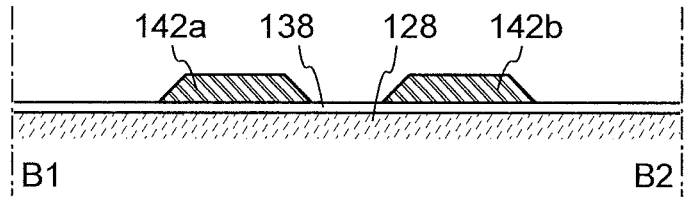
FIGS. 6A to 6E are cross-sectional views relating to manufacturing steps of a semiconductor device.
Figure 6B:
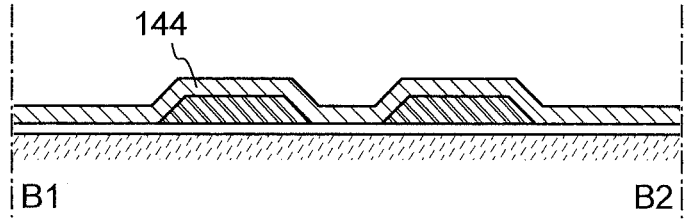
Figure 6C:
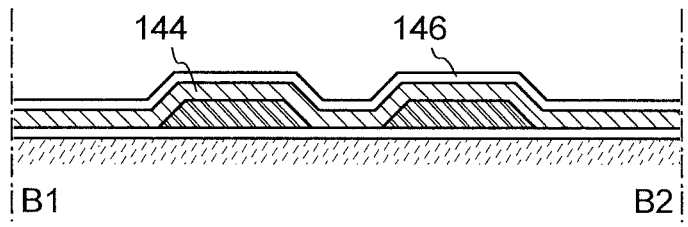

Next, the gate insulating layer 146 which is in contact with the oxide semiconductor layer 144 is formed (see FIG. 6C). The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$(x>0, y>0, z>0)), or the like. The gate insulating layer 146 may have a single-layer structure or a layered structure. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

As described above, when the gate insulating layer 146 is thin, there is a problem of gate leakage due to a tunneling effect or the like. In order to solve the problem of gate leakage, a high dielectric constant (high-k) material such as hafnium oxide, tantalum oxide, yttrium oxide, hafnium silicate (HfSi$_x$O$_y$, (x>0, y>0)), hafnium silicate to which nitrogen is added (HfSi$_x$O$_y$N$_z$ (x>0, y>0, z>0)), or hafnium aluminate to which nitrogen is added (HfAl$_x$O$_y$N$_z$ (x>0, y>0, z>0)) is preferably used for the gate insulating layer 146. By using a high-k material for the gate insulating layer 146, electrical characteristics can be ensured and the thickness can be large to prevent gate leakage. Note that a layered structure of a film containing a high-k material and a film containing any one of silicon oxide, silicon nitride, silicon oxynitride, silicon nitride oxide, aluminum oxide, and the like may be employed.

After the gate insulating layer 146 is formed, second heat treatment is desirably performed in an inert gas atmosphere or an oxygen atmosphere. The temperature of the heat treatment is set to higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electrical characteristics of the transistor. Further, in the case where the gate insulating layer 146 contains oxygen, oxygen is supplied to the oxide semiconductor layer 144 to cover oxygen deficiency in the oxide semiconductor layer 144, so that an i-type (intrinsic semiconductor) or substantially i-type oxide semiconductor layer can be formed.

Note that the second heat treatment is performed in this embodiment after the gate insulating layer 146 is formed; the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

Figure 6D:
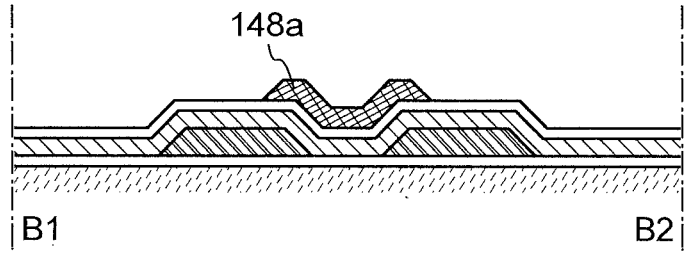

Next, the gate electrode 148a is formed over the gate insulating layer 146 in a region overlapping with the oxide semiconductor layer 144 (see FIG. 6D). The gate electrode 148a can be formed in such a manner that a conductive layer is formed over the gate insulating layer 146 and then selectively etched. The conductive layer to be the gate electrode 148a can be formed by a PVD method typified by a sputtering method or a CVD method such as a plasma CVD method. The details are similar to those of the source or drain electrode 142a or the like; thus, the description thereof can be referred to. Note that in forming the gate electrode 148a, the electrode 148b of the capacitor 164 in the above embodiment can also be formed.

Figure 6E:
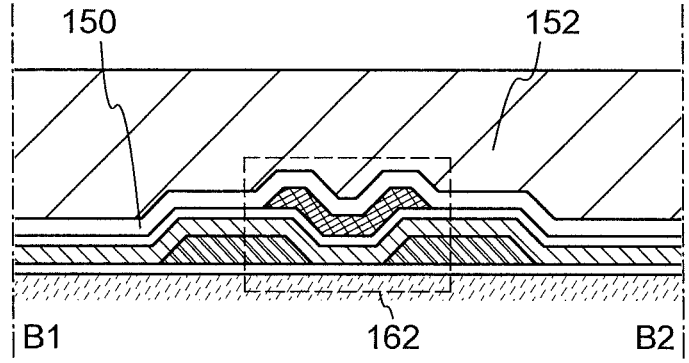

Next, the interlayer insulating layer 150 and the interlayer insulating layer 152 are formed over the gate insulating layer 146 and the gate electrode 148a (see FIG. 6E). The interlayer insulating layers 150 and 152 can be formed by a PVD method, a CVD method, or the like. The interlayer insulating layers 150 and 152 can be formed using a material containing an inorganic insulating material such as silicon oxide, silicon oxynitride, silicon nitride, hafnium oxide, aluminum oxide, or tantalum oxide. Note that a layered structure of the interlayer insulating layers 150 and 152 is used in this embodiment, but one embodiment of the disclosed invention is not limited to this example. A single-layer structure or a layered structure including three or more layers can also be used. Alternatively, a structure in which an interlayer insulating layer is not provided can be employed.

Note that the interlayer insulating layer 152 is desirably formed so as to have a planarized surface. This is because an electrode, a line, or the like can be favorably formed over the interlayer insulating layer 152 even in the case where the semiconductor device is miniaturized, for example. The interlayer insulating layer 152 can be planarized using a method such as CMP (chemical mechanical polishing).

Through the above steps, the transistor 162 using the highly purified oxide semiconductor layer 144 is completed (see FIG. 6E).

The transistor 162 illustrated in FIG. 6E includes the oxide semiconductor layer 144, the source or drain electrode 142a and the source or drain electrode 142b which are electrically connected to the oxide semiconductor layer 144, the gate insulating layer 146 covering the oxide semiconductor layer 144, the source or drain electrode 142a, and the source or drain electrode 142b, the gate electrode 148a over the gate insulating layer 146, the interlayer insulating layer 150 over the gate insulating layer 146 and the gate electrode 148a, and the interlayer insulating layer 152 over the interlayer insulating layer 150.

Since the oxide semiconductor layer 144 is highly purified in the transistor 162 illustrated in this embodiment, the hydrogen concentration is $5\times10^{19}$ atoms/cm$^3$ or lower, preferably $5\times10^{18}$ atoms/cm$^3$ or lower, more preferably $5\times10^{17}$ atoms/cm$^3$ or lower. In addition, the value of the carrier concentration of the oxide semiconductor layer 144 is sufficiently low (e.g., lower than $1\times10^{12}$/cm$^3$, preferably lower than $1.45\times10^{10}$/cm$^3$) in comparison with that of a general silicon wafer (approximately $1\times10^{14}$/cm$^3$). Thus, the off current is sufficiently low. For example, the off current density (a value obtained by dividing the off current by the channel width of the transistor) of the transistor 162 at room temperature is approximately 10 zA/μm to 100 zA/μm (1 zA (zeptoampere) is $1\times10^{-21}$ A).

With the use of the oxide semiconductor layer 144 which is highly purified and becomes intrinsic, the off current of the transistor can be sufficiently reduced. Then, by using such a transistor, a semiconductor device in which stored data can be stored for an extremely long time can be obtained.

The structures, methods, and the like described in this embodiment can be combined as appropriate with any of the structures, methods, and the like described in the other embodiments.

Embodiment 31

In this embodiment, a manufacturing method of a transistor using an oxide semiconductor (especially, an oxide semiconductor having an amorphous structure) will be described with reference to FIGS. 7A to 7E. The transistor can be used instead of the transistor 162 or the like in any of the above embodiments. A structure of the transistor according to this embodiment and the structure of the transistor according to any of the above embodiments are partly common to each other. Therefore, a difference is mainly described below. A top-gate transistor is described below as an example; however, a structure of the transistor is not limited to a top-gate structure.

First, an insulating layer 202 is formed over an object 200. After that, an oxide semiconductor layer 206 is formed over the insulating layer 202 (see FIG. 7A).

The object 200 is, for example, the interlayer insulating layer 128 in any of the above embodiments. Arithmetic mean deviation ($R_a$) of a surface of the object 200 is preferably 1 nm or less, more preferably 0.5 nm or less. Although demand for a condition of light-exposure to a mask used for patterning is increasing, high demand for the condition of the light-exposure can be easily met when the surface has such a high planarity. Note that the above arithmetic mean deviation can be measured, for example, in a region of 10 square micrometers.

The insulating layer 202 corresponds to the insulating layer 138 in any of the above embodiments and functions as a base. Any of the above embodiments can be referred to for details. Note that a structure in which the insulating layer 202 is not provided can also be employed.

The oxide semiconductor layer 206 corresponds to the oxide semiconductor layer 144 in any of the above embodiments. Any of the above embodiments can be referred to for the details of the material, the manufacturing method, and the like that can be used.

In this embodiment, the oxide semiconductor layer 206 having an amorphous structure is formed by a sputtering method using an In—Ga—Zn—O-based metal oxide target.

Next, the oxide semiconductor layer 206 is processed by a method such as etching using a mask, so that an island-shaped oxide semiconductor layer 206a is formed.

As an etching method for the oxide semiconductor layer 206, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, a parallel plate RIE (reactive ion etching) method or an ICP (inductively coupled plasma) etching method can be used. In order to etch the oxide semiconductor layer into a desired shape, etching conditions (e.g., the amount of electric power applied to a coiled electrode, the amount of electric power applied to an electrode on the object side, and the electrode temperature on the object side) are set as appropriate.

As an etchant used for wet etching, a mixed solution of phosphoric acid, acetic acid, and nitric acid or the like can be used. An etchant such as ITO07 N (produced by KANTO CHEMICAL CO., INC.) may also be used.

The oxide semiconductor layer 206 is preferably etched so that edge portions of the oxide semiconductor layer 206a are tapered. Here, a taper angle is preferably greater than or equal to 30° and less than or equal to 60°, for example. Note that a "taper angle" means an inclination angle formed by the side surface and the bottom surface of the layer having a tapered shape (e.g., the oxide semiconductor layer 206a) when being observed in a direction perpendicular to the cross section (plane which is perpendicular to the surface of the object). The edge portions of the oxide semiconductor layer 206a are etched so as to be tapered; accordingly, the coverage of a source or drain electrode 208a and a source or drain electrode 208b to be formed later is improved and disconnection can be prevented.

After that, heat treatment (first heat treatment) is preferably performed on the oxide semiconductor layer 206a. Excess hydrogen (including water and a hydroxyl group) contained in the oxide semiconductor layer 206a can be removed by this first heat treatment; thus, the structure of the oxide semiconductor layer can be improved and defect levels in an energy gap can be reduced. The above embodiment can be referred to for details. In the case where the heat treatment (first heat treatment) is performed after the etching as described here, even when wet etching is used, etching can be performed in a state where the etching rate is high; therefore, there is an advantage in that time required for etching can be shortened.

Note that the first heat treatment can be performed on the oxide semiconductor layer 206 that has not yet been processed into the island-shaped oxide semiconductor layer 206a. In that case, after the first heat treatment, the object 200 is taken out of the heating apparatus and a photolithography step is performed.

The above heat treatment (first heat treatment) can be referred to as dehydration treatment, dehydrogenation treatment, or the like because of its effect of removing hydrogen, water, and the like. The dehydration treatment or dehydrogenation treatment can be performed, for example, after the oxide semiconductor layer is formed, after the source and drain electrodes are formed over the oxide semiconductor layer 206a, or after a gate insulating layer is formed. Such dehydration treatment or dehydrogenation treatment may be performed once or plural times.

Next, a conductive layer is formed so as to be in contact with the oxide semiconductor layer 206a. The conductive layer is selectively etched, so that the source or drain electrode 208a and the source or drain electrode 208b are formed (see FIG. 7B). The description regarding the conductive layer, the source or drain electrode, and the like in any of the above embodiments can be referred to for the details of the conductive layer, the source or drain electrode 208a, the source or drain electrode 208b, and the like.

Figure 7A:
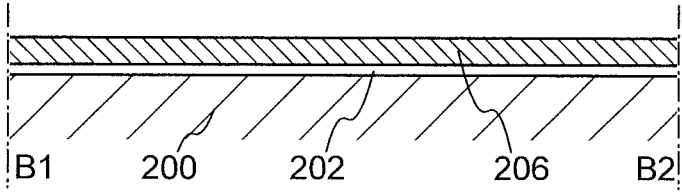
FIGS. 7A to 7E are cross-sectional views relating to manufacturing steps of a semiconductor device.
Figure 7B:
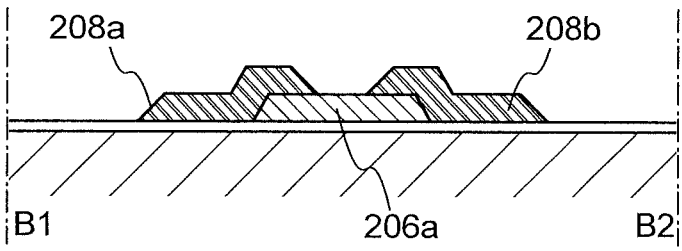
Figure 7C:
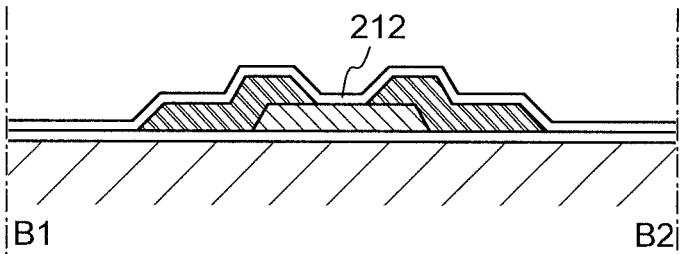

Next, a gate insulating layer 212 which is in contact with part of the oxide semiconductor layer 206a is formed (see FIG. 7C). The description regarding the gate insulating layer and the like in any of the above embodiments can be referred to for the details of the gate insulating layer 212.

After the gate insulating layer 212 is formed, second heat treatment is desirably performed in an inert gas atmosphere or an oxygen atmosphere. The above embodiment can be referred to for the details of the second heat treatment.

Note that the second heat treatment is performed in this embodiment after the gate insulating layer 212 is formed; the timing of the second heat treatment is not limited thereto. For example, the second heat treatment may be performed after the gate electrode is formed.

Figure 7D:
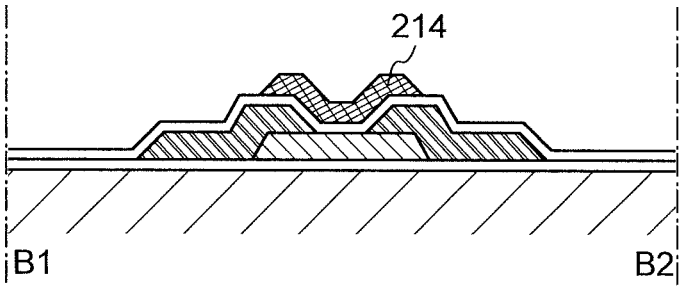

Next, a gate electrode 214 is formed over the gate insulating layer 212 in a region overlapping with the oxide semiconductor layer 206a (see FIG. 7D). The gate electrode 214 can be formed in such a manner that a conductive layer is formed over the gate insulating layer 212 and then selectively etched. The above embodiment can be referred to for the details of the gate electrode 214. Note that in forming the gate electrode 214, the electrode of the capacitor in any of the above embodiments can be also formed.

Figure 7E:
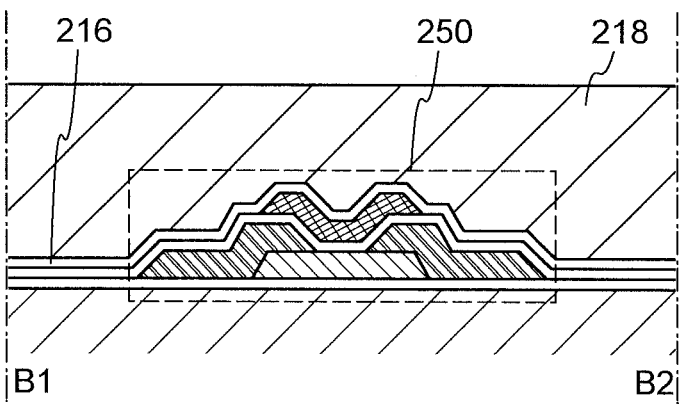

Next, an interlayer insulating layer 216 and an interlayer insulating layer 218 are formed over the gate insulating layer 212 and the gate electrode 214 (see FIG. 7E). The above embodiment can be referred to for details. Alternatively, a structure in which an interlayer insulating layer is not provided can be employed.

Through the above steps, a transistor 250 using the highly purified oxide semiconductor layer 206a having an amorphous structure is completed (see FIG. 7E). Note that crystal components slightly may exist in the oxide semiconductor layer 206a depending on conditions of the heat treatment.

With the use of the oxide semiconductor layer 206a which is highly purified and becomes intrinsic, the off current of the transistor can be sufficiently reduced. Then, by using such a transistor, a semiconductor device in which stored data can be stored for an extremely long time can be obtained.

Note that in this embodiment, a structure in which lower portions of a source and drain electrodes and an upper portion of an oxide semiconductor layer are in contact with each other in a top-gate transistor is described; however, a transistor to which the structure in this embodiment can be applied is not limited thereto. For example, part of the structure in this embodiment can be applied to a structure in which upper portions of a source and drain electrodes and a lower portion of an oxide semiconductor layer are in contact with each other (the structure illustrated in FIGS. 2A and 2B or FIG. 4A, FIG. 4B, and FIG. 4C, or the like) in a top-gate transistor. Alternatively, part of the structure in this embodiment can be applied to a structure in which lower portions of a source and drain electrodes and an upper portion of an oxide semiconductor layer are in contact with each other in a bottom-gate transistor, a structure in which upper portions of a source and drain electrodes and a lower portion of an oxide semiconductor layer are in contact with each other in a bottom-gate transistor, or the like. In other words, according to this embodiment, a variety of transistors including an oxide semiconductor having an amorphous structure can be realized.

The structures, methods, and the like described in this embodiment can be combined as appropriate with any of the structures, methods, and the like described in the other embodiments.

Embodiment 4

In this embodiment, a manufacturing method of a transistor using an oxide semiconductor will be described with reference to FIGS. 8A to 8E. In this embodiment, the case where a first oxide semiconductor layer including a crystal region and a second oxide semiconductor layer formed by crystal growth from the crystal region of the first oxide semiconductor layer are used as an oxide semiconductor layer is described in detail. The transistor can be used instead of the transistor 162 or the like in any of the above embodiments. A structure of the transistor according to this embodiment and the structure of the transistor according to any of the above embodiments are partly common to each other. Therefore, a difference is mainly described below.

Note that when a thickness to be needed can be obtained just by the first oxide semiconductor layer, the second oxide semiconductor layer is not necessary. Further, an example of a top-gate transistor is described below; however, a structure of the transistor is not limited to a top-gate structure.

First, an insulating layer 302 is formed over an object 300. Next, a first oxide semiconductor layer is formed over the insulating layer 302 and a region including at least a surface of the first oxide semiconductor layer is crystallized by first heat treatment, so that a first oxide semiconductor layer 304 is formed (see FIG. 8A).

The above embodiment can be referred to for the details of the object 300 (details of the surface and the like of the object).

The insulating layer 302 functions as a base. Any of the above embodiments can be referred to for the details of the insulating layer 302. Note that a structure in which the insulating layer 302 is not provided may be employed.

The first oxide semiconductor layer can be formed in a manner similar to that of the oxide semiconductor layer in any of the above embodiments. Thus, any of the above embodiments may be referred to for the details of the first oxide semiconductor layer and the manufacturing method thereof. Note that in this embodiment, the first oxide semiconductor layer is preferably formed using an oxide semiconductor which is easily crystallized, in order to crystallize the first oxide semiconductor layer intentionally by the first heat treatment. As such an oxide semiconductor, for example, ZnO is given. Among In—Ga—Zn—O-based oxide semiconductors, for example, one with high concentration of Zn is easily crystallized and one in which proportion of Zn in metal elements (In, Ga, and Zn) is 60 atomic % or higher is preferably used for this purpose. The thickness of the first oxide semiconductor layer is preferably set to greater than or equal to 1 nm and less than or equal to 10 nm. In this embodiment, the thickness is set to 3 nm as an example. Note that the appropriate thickness of the first oxide semiconductor layer differs depending on the oxide semiconductor material to be used, the usage of the semiconductor device, or the like: therefore, the thickness may be determined as appropriate in accordance with the material, the usage, or the like.

The temperature of the first heat treatment is set to higher than or equal to 550° C. and lower than or equal to 850° C., preferably higher than or equal to 600° C. and lower than or equal to 750° C. In addition, the length of time of the heat treatment is preferably greater than or equal to 1 minute and less than or equal to 24 hours. Note that the temperature of the heat treatment and the length of time of the heat treatment differ depending on the kind of the oxide semiconductor or the like.

In addition, the atmosphere of the first heat treatment is preferably an atmosphere which does not contain hydrogen, water, or the like. For example, a nitrogen atmosphere, an oxygen atmosphere, or a rare gas (helium, neon, argon, or the like) atmosphere, from which water is sufficiently removed can be employed.

As a heat treatment apparatus which can be used, there is an apparatus for heating an object by thermal conduction or thermal radiation from a medium such as a heated gas in addition to an electric furnace. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

Through the above first heat treatment, the region including at least the surface of the first oxide semiconductor layer is crystallized. The crystal region is formed in such a manner that crystal growth proceeds from the surface of the first oxide semiconductor layer toward the inside of the first oxide semiconductor layer. Note that the crystal region includes plate-like crystals whose average thickness is greater than or equal to 1 nm and less than or equal to 10 nm in some cases. Further, the crystal region includes crystals whose c-axis is oriented in a direction substantially perpendicular to the surface of the oxide semiconductor layer in some cases. Here, a "substantially parallel direction" means a direction within ±10° from a parallel direction and a "substantially perpendicular direction" means a direction within ±10° from a perpendicular direction.

By the first heat treatment, hydrogen (including water and a hydroxyl group) or the like contained in the first oxide semiconductor layer is preferably removed while the crystal region is formed. In the case where hydrogen or the like is removed, the first heat treatment is preferably performed in a nitrogen atmosphere, an oxygen atmosphere, or a rare gas (helium, neon, argon, or the like) atmosphere whose purity is 6 N (99.9999%) or higher (that is, the impurity concentration is 1 ppm or lower). More preferably, an atmosphere whose purity is 7 N (99.99999%) or higher (that is, the impurity concentration is 0.1 ppm or lower) is used. The first heat treatment may be performed in ultra-dry air with an $H_2O$ concentration of 20 ppm or lower, preferably ultra-dry air with an $H_2O$ concentration of 1 ppm or lower.

Moreover, by the first heat treatment, oxygen is preferably supplied to the first oxide semiconductor layer while the crystal region is formed. For example, with the use of an oxygen atmosphere as the atmosphere of the heat treatment, oxygen can be supplied to the first oxide semiconductor layer.

The first heat treatment in this embodiment is as follows: hydrogen or the like is removed from the oxide semiconductor layer by heat treatment in a nitrogen atmosphere at 700° C. for 1 hour, and then the atmosphere is changed to an oxygen atmosphere so that oxygen is supplied to the inside of the first oxide semiconductor layer. Note that since a main object of the first heat treatment is formation of the crystal region, treatment for removing hydrogen or the like or treatment for supplying oxygen can be separately performed. For example, after the heat treatment for removing hydrogen or the like or treatment for supplying oxygen is performed, heat treatment for crystallization can be performed.

By such first heat treatment, the first oxide semiconductor layer which includes the crystal region, from which hydrogen (including water and a hydroxyl group) or the like is removed and to which oxygen is supplied can be obtained.

Next, a second oxide semiconductor layer 305 is formed over the first oxide semiconductor layer 304 including the crystal region in the region including at least the surface (see FIG. 8B). Note that when a thickness to be needed can be obtained just by the first oxide semiconductor layer 304, the second oxide semiconductor layer 305 is not necessary. In this case, steps relating to the second oxide semiconductor layer 305 can be omitted.

The second oxide semiconductor layer 305 can be formed in a manner similar to that of the oxide semiconductor layer in any of the above embodiments. Thus, any of the above embodiments may be referred to for the details of the second oxide semiconductor layer 305 and the manufacturing method thereof. Note that the second oxide semiconductor layer 305 is preferably formed thicker than the first oxide semiconductor layer 304. The second oxide semiconductor layer 305 is preferably formed so that the total thickness of the first oxide semiconductor layer 304 and the second oxide semiconductor layer 305 is greater than or equal to 1 nm and less than or equal to 50 nm, preferably greater than or equal to 1 nm and less than or equal to 10 nm. In this embodiment, the thickness is set to 7 nm as an example. Note that the appropriate thickness of the second oxide semiconductor layer differs depending on the oxide semiconductor material to be used, the usage of the semiconductor device, or the like; therefore, the thickness may be determined as appropriate in accordance with the material, the usage, or the like.

It is preferable that the second oxide semiconductor layer 305 be formed using a material which contains the same main component as the first oxide semiconductor layer 304 and lattice constants after crystallization of which is close to those of the first oxide semiconductor layer 304 (lattice mismatch is 1% or less). This is because when such a material is used, in the crystallization of the second oxide semiconductor layer 305, crystal growth using the crystal region of the first oxide semiconductor layer 304 as a seed crystal easily proceeds. Further, in the case where a material containing the same main component is used, favorable interface properties or electrical characteristics can be obtained.

Note that when desired film quality can be obtained by the crystallization, the second oxide semiconductor layer 305 may be formed using a material containing a different main component.

Next, the second heat treatment is performed on the second oxide semiconductor layer 305 to cause crystal growth using the crystal region of the first oxide semiconductor layer 304 as a seed crystal, so that a second oxide semiconductor layer 306 is formed (see FIG. 8C). In the case where the second oxide semiconductor layer 305 is not formed, the step can be omitted.

The temperature of the second heat treatment is set to higher than or equal to 550° C. and lower than or equal to 850° C., preferably higher than or equal to 600° C. and lower than or equal to 750° C. The length of time of the second heat treatment is greater than or equal to 1 minute and less than or equal to 100 hours, preferably greater than or equal to 5 hours and less than or equal to 20 hours, typically 10 hours. Note that it is preferable that also in the second heat treatment, hydrogen, water, and the like be not contained in the atmosphere of the heat treatment.

The details of the atmosphere and effects of the heat treatment are similar to those of the first heat treatment. In addition, a heat treatment apparatus which can be used is also similar to the apparatus in the first heat treatment. For example, at the time of increasing the temperature in the second heat treatment, the inside of a furnace is set to a nitrogen atmosphere and the inside of the furnace is set to an oxygen atmosphere at the time of performing cooling, whereby hydrogen or the like can be removed in a nitrogen atmosphere and oxygen can be supplied in an oxygen atmosphere.

By performing the second heat treatment as described above, crystal growth proceeds from the crystal region formed in the first oxide semiconductor layer 304 to the whole second oxide semiconductor layer 305, so that the second oxide semiconductor layer 306 can be formed. Further, the second oxide semiconductor layer 306 from which hydrogen (including water and a hydroxyl group) or the like is removed and to which oxygen is supplied can be formed. Furthermore, orientation of the crystal region of the first oxide semiconductor layer 304 can be improved by the second heat treatment.

In the case where an In—Ga—Zn—O-based oxide semiconductor material is used for the second oxide semiconductor layer 306, the second oxide semiconductor layer 306 can include a crystal represented by $InGaO_3(ZnO)_m$ (m is not limited to a natural number), a crystal represented by $In_2Ga_2ZnO_7$ (In:Ga:Zn:O=2:2:1:7 [atomic ratio]), or the like. Such a crystal is oriented so that the c-axis is in a substantially perpendicular direction to a surface of the second oxide semiconductor layer 306 by the second heat treatment.

Here, the above-described crystal has a layered structure of layers parallel to the a-axis and the b-axis. In addition, each layer contains In, Ga, or Zn. Specifically, the above-described crystal has a structure in which a layer containing In and a layer not containing In (a layer containing Ga or Zn) are stacked in the c-axis direction.

In an In—Ga—Zn—O-based oxide semiconductor crystal, the conductivity of the layer containing In in an in-plane direction, that is, in a direction parallel to the a-axis and the b-axis is favorable. This is due to the fact that electric conductivity is mainly controlled by In in the In—Ga—Zn—O-based oxide semiconductor crystal, the fact that the 5 s orbital of one In atom overlaps with the 5 s orbital of an adjacent In atom, so that a carrier path is formed, and the like.

In the case where the first oxide semiconductor layer 304 includes an amorphous region in the vicinity of the interface between the first oxide semiconductor layer 304 and the insulating layer 302, the second heat treatment may cause crystal growth from the crystal region formed on the surface of the first oxide semiconductor layer 304 toward the bottom surface of the first oxide semiconductor layer 304 and may crystallize the amorphous region in some cases. Note that depending on the material for forming the insulating layer 302, heat treatment conditions, or the like, the amorphous region may remain.

In the case where the first oxide semiconductor layer 304 and the second oxide semiconductor layer 305 are formed using oxide semiconductor materials containing the same main component, as illustrated in FIG. 8C, the first oxide semiconductor layer 304 and the second oxide semiconductor layer 306 have the same crystal structure in some cases. Therefore, although the boundary between the first oxide semiconductor layer 304 and the second oxide semiconductor layer 306 is indicated by a dotted line in FIG. 8C, it sometimes cannot be identified, and the first oxide semiconductor layer 304 and the second oxide semiconductor layer 306 can be sometimes regarded as one layer.

Next, the first oxide semiconductor layer 304 and the second oxide semiconductor layer 306 are processed by a method such as etching using a mask; thus, an island-shaped first oxide semiconductor layer 304a and an island-shaped second oxide semiconductor layer 306a are formed (see FIG. 8D). Note that processing into the island-shaped oxide semiconductor layers is performed after the second heat treatment here; however, the second heat treatment may be performed after the processing into the island-shaped oxide semiconductor layers. In this case, even when wet etching is used, etching can be performed in a state where the etching rate is high; therefore, there is an advantage in that time required for etching can be shortened.

As a method for etching the first oxide semiconductor layer 304 and the second oxide semiconductor layer 306, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layers can be etched into a desired shape. The first oxide semiconductor layer 304 and the second oxide semiconductor layer 306 can be etched in a manner similar to that of the oxide semiconductor layer in any of the above embodiments. Any of the above embodiments may be referred to for details.

Note that in the oxide semiconductor layer, a region to be a channel formation region preferably has a planarized surface. For example, the difference in height of the surface of the second oxide semiconductor layer 306 (P–V) is preferably 1 nm or less (preferably 0.5 nm or less) in a region overlapping with a gate electrode (the channel formation region). Note that the above-described difference in height can be measured, for example, in a region of 10 square micrometers.

Next, a conductive layer is formed so as to be in contact with the second oxide semiconductor layer 306a. The conductive layer is selectively etched, so that the source or drain electrode 308a and the source or drain electrode 308b are formed (see FIG. 8D). Any of the above embodiments may be referred to for details.

Note that in a step illustrated in FIG. 8D, a crystal region of the first oxide semiconductor layer 304a or the second oxide semiconductor layer 306a which is in contact with the source or drain electrode 308a and the source or drain electrode 308b becomes amorphous in some cases. Therefore, all regions of the first oxide semiconductor layer 304a and the second oxide semiconductor layer 306a are not necessarily crystalline.

Next, a gate insulating layer 312 which is in contact with part of the second oxide semiconductor layer 306a is formed. Any of the above embodiments may be referred to for details. After that, a gate electrode 314 is formed over the gate insulating layer 312 in a region overlapping with the first oxide semiconductor layer 304a and the second oxide semiconductor layer 306a. Next, an interlayer insulating layer 316 and an interlayer insulating layer 318 are formed over the gate insulating layer 312 and the gate electrode 314 (see FIG. 8E). Any of the above embodiments may be referred to for details.

After the gate insulating layer 312 is formed, third heat treatment is desirably performed in an inert gas atmosphere or an oxygen atmosphere. The temperature of the third heat treatment is set to higher than or equal to 200° C. and lower than or equal to 450° C., preferably higher than or equal to 250° C. and lower than or equal to 350° C. For example, the heat treatment may be performed at 250° C. for 1 hour in an atmosphere containing oxygen. The third heat treatment can reduce variation in electrical characteristics of the transistor. Further, in the case where the gate insulating layer 312 is an insulating layer containing oxygen, oxygen can be supplied to the second oxide semiconductor layer 306a.

Note that the third heat treatment is performed in this embodiment after the gate insulating layer 312 is formed; the timing of the third heat treatment is not limited thereto. Further, in the case where oxygen is supplied to the second oxide semiconductor layer 306a by another treatment, for example, the second heat treatment or the like, the third heat treatment may be omitted.

Through the above steps, a transistor 350 using the first oxide semiconductor layer 304a and the second oxide semiconductor layer 306a is completed (see FIG. 8E).

With the use of the first oxide semiconductor layer 304a and the second oxide semiconductor layer 306a which are highly purified and become intrinsic, the off current of the transistor can be sufficiently reduced. Then, by using such a transistor, a semiconductor device in which stored data can be stored for an extremely long time can be obtained.

Note that in this embodiment, a structure in which lower portions of a source and drain electrodes and an upper portion of an oxide semiconductor layer are in contact with each other in a top-gate transistor is described; however, a transistor to which the structure in this embodiment can be applied is not limited thereto. For example, part of the structure in this embodiment can be applied to a structure in which upper portions of a source and drain electrodes and a lower portion of an oxide semiconductor layer are in contact with each other (the structure illustrated in FIGS. 2A and 2B or FIG. 4A, FIG. 4B, and FIG. 4C, or the like) in a top-gate transistor. Alternatively, part of the structure in this embodiment can be applied to a structure in which lower portions of a source and drain electrodes and an upper portion of an oxide semiconductor layer are in contact with each other in a bottom-gate transistor, a structure in which upper portions of a source and drain electrodes and a lower portion of an oxide semiconductor layer are in contact with each other in a bottom-gate transistor, or the like. In other words, according to this embodiment, a variety of transistors including an oxide semiconductor layer including a crystal region can be realized.

Further, in this embodiment, the first oxide semiconductor layer 304a including the crystal region and the second oxide semiconductor layer 306a formed by crystal growth from the crystal region of the first oxide semiconductor layer 304a are used as the oxide semiconductor layer; therefore, field-effect mobility can be improved and a transistor having favorable electrical characteristics can be realized. For example, it can be realized that field-effect mobility $\rho > 100$ cm$^2$/V·s. Thus, the above transistor can be applied to a variety of logic circuits which require high speed operation.

The structures, methods, and the like described in this embodiment can be combined as appropriate with any of the structures, methods, and the like described in the other embodiments.

Embodiment 5

In this embodiment, a manufacturing method of a transistor using an oxide semiconductor will be described with reference to FIGS. 9A to 9E. The transistor can be used instead of the transistor 162 or the like in any of the above embodiments. A structure of the transistor according to this embodiment and the structure of the transistor according to any of the above embodiments are partly common to each other. Therefore, a difference is mainly described below. Further, a top-gate transistor is described as an example below; however, a structure of the transistor is not limited to a top-gate structure.

First, an insulating layer 402 is formed over an object 400. Next, an oxide semiconductor layer 406 is formed over the insulating layer 402 (see FIG. 9A). Any of the above embodiments may be referred to for details.

Next, the oxide semiconductor layer 406 is processed by a method such as etching using a mask, so that an island-shaped oxide semiconductor layer 406a is formed. A conductive layer 408 and an insulating layer 410 are formed so as to cover the oxide semiconductor layer 406a (see FIG. 9B). Note that the insulating layer 410 is not an essential component but is effective in selectively oxidizing side surfaces of a source electrode and a drain electrode to be formed later. Further, it is also effective in reducing capacitance formed between the gate electrode and the source electrode and between the gate electrode and the drain electrode.

Any of the above embodiments can be referred to for the details of formation of the island-shaped oxide semiconductor layer 406a, heat treatment, and the like. Any of the above embodiments may be referred to for the details of the conductive layer 408.

The insulating layer 410 can be formed by a CVD method, a sputtering method, or the like. The insulating layer 410 is preferably formed so as to contain silicon oxide, silicon nitride, silicon oxynitride, aluminum oxide, hafnium oxide, tantalum oxide, or the like. Note that the insulating layer 410 may have a single-layer structure or a layered structure. There is no particular limitation on the thickness of the insulating layer 410. For example, the thickness can be set to greater than or equal to 10 nm and less than or equal to 200 nm.

Figure 9A:
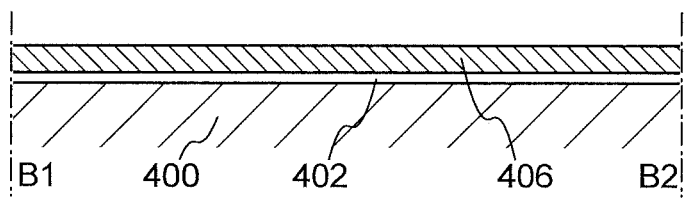
FIGS. 9A to 9E are cross-sectional views relating to manufacturing steps of a semiconductor device.
Figure 9B:
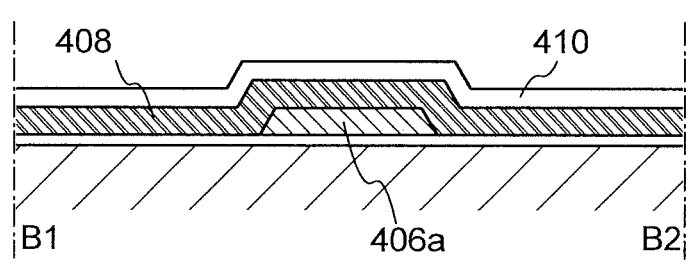
Figure 9C:
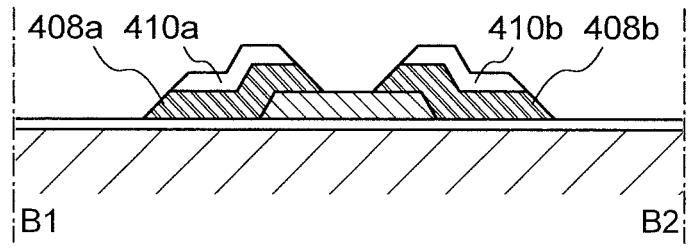

Next, the conductive layer 408 and the insulating layer 410 are selectively etched, so that a source or drain electrode 408a, a source or drain electrode 408b, an insulating layer 410a, and an insulating layer 410b are formed (see FIG. 9C). The details are similar to those of a formation step of the source or drain electrode in any of the above embodiments. Note that a material, for example, aluminum, titanium, molybdenum, copper, or the like, is suitable for plasma oxidation treatment to be performed later and suitable as a material of the source or drain electrode 408a, the source or drain electrode 408b, and the like.

Figure 9D:
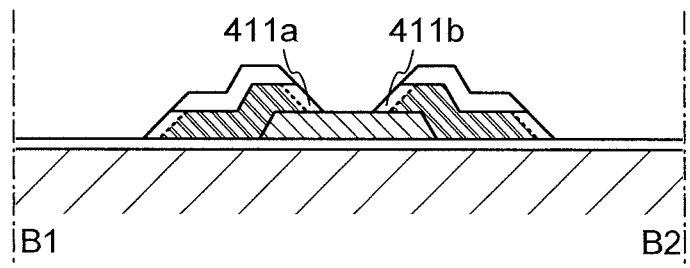
Figure 9E:
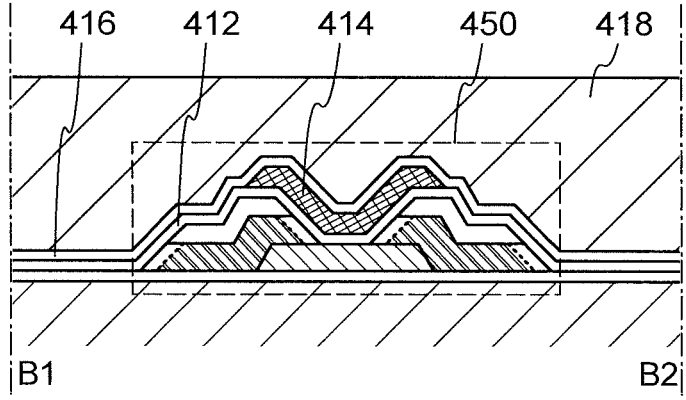

Next, oxidation treatment for supplying oxygen to the oxide semiconductor layer 406a is performed (see FIG. 9D). By the oxidation treatment, an oxide region 411a is formed in part of the source or drain electrode 408a (especially, portion corresponding to the side surface) and an oxide region 411b is formed in part of the source or drain electrode 408b (especially, portion corresponding to the side surface) (see FIG. 9D). In addition, by the oxidation treatment, oxide regions are also formed in peripheral portions of the source or drain electrode 408a and the source or drain electrode 408b.

The oxidation treatment is preferably performed using oxygen plasma excited with a microwave (300 MHz to 300 GHz), which may be referred to as plasma oxidation treatment. The reason is that high-density plasma is realized by plasma excitation with a microwave and damage to the oxide semiconductor layer 406a can be sufficiently reduced.

Specifically, the above treatment can be performed, for example, at a frequency of 300 MHz to 300 GHz (typically 2.45 GHz) under a pressure of 50 Pa to 5000 Pa (typically 500 Pa) at a temperature of the object of 200° C. to 400° C. (typically 300° C.) with the use of a mixed gas of oxygen and argon.

By the above oxidation treatment, oxygen is supplied to the oxide semiconductor layer 406a. Therefore, damage to the oxide semiconductor layer 406a can be sufficiently reduced, and in addition, defect levels in an energy gap due to oxygen deficiency can be reduced. In other words, characteristics of the oxide semiconductor layer 406a can be further improved.

Note that without limitation to the plasma oxidation treatment with a microwave, any other method that enables a sufficient reduction in damage to the oxide semiconductor layer 406a and a supply of oxygen to the oxide semiconductor layer 406a can be used. For example, a method such as heat treatment in an atmosphere containing oxygen can be used.

In combination with the oxidation treatment, treatment for removing water, hydrogen, or the like from the oxide semiconductor layer 406a may be performed. In this case, for example, plasma treatment using a gas such as nitrogen or argon can be used.

Note that the oxide region 411a and the oxide region 411b formed by the oxidation treatment are effective particularly when a transistor 450 is miniaturized (for example, when the channel length is less than 1000 nm). With the miniaturization of the transistor, the gate insulating layer needs to have a smaller thickness. The reason why the oxide regions are provided is that the oxide regions can prevent short circuit between the gate electrode and the source or drain electrode, which may be caused by a reduction in thickness of the gate insulating layer or defective coverage therewith. Note that the oxide regions are sufficiently effective when having a thickness of 5 nm or more (preferably 10 nm or more).

The oxidation treatment is effective also in terms of improvement in film quality of an exposed portion of the insulating layer 402.

Note that the insulating layer 410a and the insulating layer 410b are important in that these insulating layers function to prevent oxidation of upper portions of the source or drain electrode 408a and the source or drain electrode 408b. This is because it is significantly difficult to perform the plasma treatment while the mask used for etching remains.

Next, a gate insulating layer 412 is formed in contact with part of the oxide semiconductor layer 406a without exposure to the air. Then, a gate electrode 414 is formed over the gate insulating layer 412 in a region overlapping with the oxide semiconductor layer 406a, and an interlayer insulating layer 416 and an interlayer insulating layer 418 are formed over the gate insulating layer 412 and the gate electrode 414 (see FIG. 9E). Any of the above embodiments can be referred to for details.

Through the above steps, the transistor 450 using an oxide semiconductor is completed.

In this embodiment, oxygen plasma treatment is performed on the oxide semiconductor layer 406a in order to supply oxygen to the oxide semiconductor layer 406a. Accordingly, the transistor 450 has better characteristics. Further, a region corresponding to a side surface of the source or drain electrode is oxidized; thus, short circuit between the gate electrode and the source electrode (or the drain electrode), which may be caused by a reduction in thickness of the gate insulating layer, can be prevented. Furthermore, an appropriate off-set region can be formed by the oxide region 411a and the oxide region 411b; thus, change in an electric field from the oxide semiconductor layer to an interface with the source electrode (or the drain electrode) can be made small.

Moreover, by providing an insulating layer over the source electrode and the drain electrode, capacitance (parasitic capacitance) formed between the gate electrode and the source electrode and between the gate electrode and the drain electrode can be reduced and higher speed operation can be realized.

Note that in this embodiment, a structure in which lower portions of a source and drain electrodes and an upper portion of an oxide semiconductor layer are in contact with each other in a top-gate transistor is described; however, a transistor to which the structure in this embodiment can be applied is not limited thereto. For example, part of the structure in this embodiment can be applied to a structure in which lower portions of a source and drain electrodes and an upper portion of an oxide semiconductor layer are in contact with each other in a bottom-gate transistor. In other words, according to this embodiment, a variety of transistors including an oxide semiconductor to which oxygen is supplied, an electrode including an oxide region, and the like can be realized.

The structures, methods, and the like described in this embodiment can be combined as appropriate with any of the structures, methods, and the like described in the other embodiments.

Embodiment 6

In this embodiment, a manufacturing method of a semiconductor device using a semiconductor material other than an oxide semiconductor, specifically, a manufacturing method of the transistor 170 in a lower portion in FIG. 2A is described with reference to FIGS. 10A to 10H and FIG. 2A.

Figure 10A:
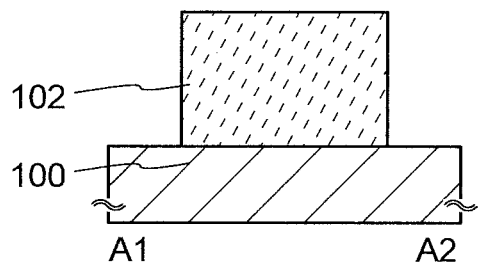
FIGS. 10A to 10F are cross-sectional views relating to manufacturing steps of a semiconductor device.
Figure 10E:
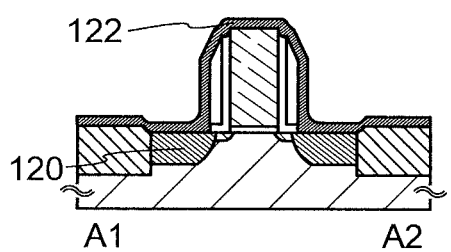

First, the substrate 100 containing a semiconductor material is prepared (see FIG. 10A). As the substrate 100 containing a semiconductor material, a single crystal semiconductor substrate or a polycrystalline semiconductor substrate formed using silicon, silicon carbide, or the like; a compound semiconductor substrate formed using silicon germanium or the like; an SOI substrate; or the like can be used. Here, an example of using a single crystal silicon substrate as the substrate 100 containing a semiconductor material is described. Note that in general, the term "SOI substrate" means a substrate where a silicon layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon layer. Examples of the SOI substrate include a substrate which has a semiconductor layer over its insulating substrate such as a glass substrate, with an insulating layer between the semiconductor layer and the insulating substrate.

A protective layer 102 serving as a mask for forming an element isolation insulating layer is formed over the substrate 100 (see FIG. 10A). As the protective layer 102, an insulating layer formed using silicon oxide, silicon nitride, silicon oxynitride, or the like can be used, for example. Note that before or after this step, an impurity element imparting n-type conductivity or an impurity element imparting p-type conductivity may be added to the substrate 100 in order to control the threshold voltage of the transistor. When the semiconductor material contained in the substrate 100 is silicon, phosphorus, arsenic, or the like can be used as the impurity imparting n-type conductivity. Boron, aluminum, gallium, or the like can be used as the impurity imparting p-type conductivity.

Next, part of the substrate 100 in a region that is not covered with the protective layer 102 (i.e., an exposed region) is removed by etching with the use of the protective layer 102 as a mask. Thus, a semiconductor region 104 which is separated from another semiconductor region is formed (see FIG. 10B). As the etching, dry etching is preferably employed, but wet etching may be performed. An etching gas and an etchant can be selected as appropriate depending on a material of a layer to be etched.

Figure 10B:
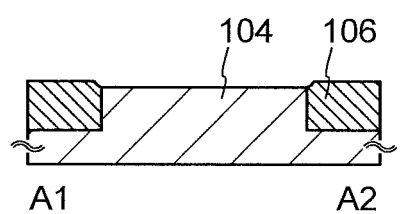
Figure 10F:
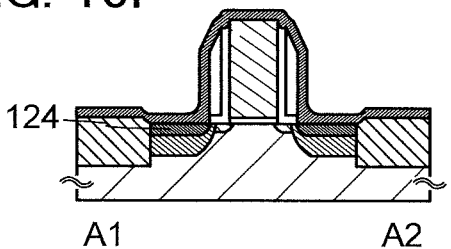

Then, an insulating layer is formed so as to cover the semiconductor region 104, and the insulating layer in a region overlapping with the semiconductor region 104 is selectively removed, so that the element isolation insulating layer 106 is formed (see FIG. 10B). The insulating layer is formed using silicon oxide, silicon nitride, silicon oxynitride, or the like. As a method for removing the insulating layer, any of etching treatment and polishing treatment such as CMP can be employed. Note that the protective layer 102 is removed after the formation of the semiconductor region 104 or after the formation of the element isolation insulating layer 106.

Next, an insulating layer is formed over the semiconductor region 104, and a layer containing a conductive material is formed over the insulating layer.

The insulating layer is to be a gate insulating layer later and preferably has a single-layer structure or a layered structure using a film containing silicon oxide, silicon oxynitride, silicon nitride, hafnium oxide, aluminum oxide, tantalum oxide, yttrium oxide, hafnium silicate (HfSi$_x$O$_y$, (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$, (x>0, y>0, z>0)), or the like which is obtained by a CVD method, a sputtering method, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe, oxygen, nitrogen oxide, ammonia, nitrogen, or hydrogen. The thickness of the insulating layer can be, for example, greater than or equal to 1 nm and less than or equal to 100 nm, preferably greater than or equal to 10 nm and less than or equal to 50 nm.

The layer containing a conductive material can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and a variety of film formation methods such as an evaporation method, a CVD method, a sputtering method, and a spin coating method can be employed. Note that this embodiment describes an example of the case where the layer containing a conductive material is formed using a metal material.

Figure 10C:
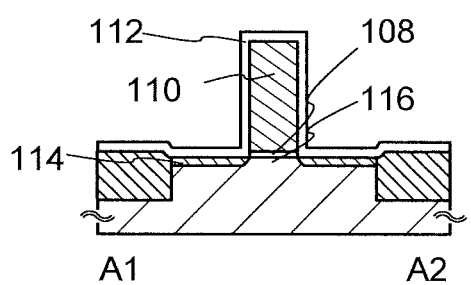

After that, the insulating layer and the layer containing a conductive material are selectively etched, so that the gate insulating layer 108 and the gate electrode 110 are formed (see FIG. 10C).

Next, an insulating layer 112 that covers the gate electrode 110 is formed (see FIG. 10C). Then, impurity regions 114 with a shallow junction depth are formed by adding phosphorus (P), arsenic (As), or the like to the semiconductor region 104 (see FIG. 10C). Note that phosphorus or arsenic is added here in order to form an n-channel transistor; an impurity element such as boron (B) or aluminum (Al) may be added in the case of forming a p-channel transistor. With the formation of the impurity regions 114, the channel formation region 116 is formed in the semiconductor region 104 below the gate insulating layer 108 (see FIG. 10C). Here, the concentration of the impurity added can be set as appropriate; the concentration is preferably increased when a semiconductor element is highly miniaturized. The step in which the impurity regions 114 are formed after the formation of the insulating layer 112 is employed here; alternatively, the insulating layer 112 may be formed after the formation of the impurity regions 114.

Figure 10G:
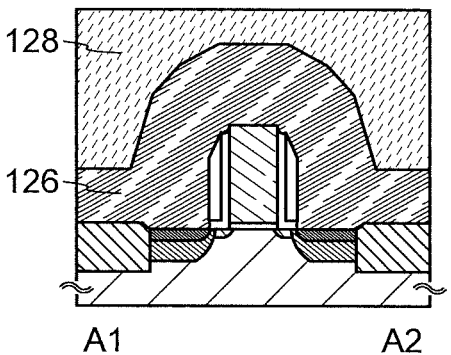
Figure 10D:
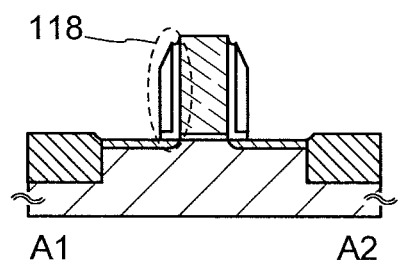

Next, the sidewall insulating layers 118 are formed (see FIG. 10D). An insulating layer is formed so as to cover the insulating layer 112 and then subjected to highly anisotropic etching, whereby the sidewall insulating layers 118 can be formed in a self-aligned manner. At this time, it is preferable to partly etch the insulating layer 112 so that a top surface of the gate electrode 110 and top surfaces of the impurity regions 114 are exposed. Note that the sidewall insulating layers 118 are not provided in some cases so that high integration or the like are realized.

Then, an insulating layer is formed so as to cover the gate electrode 110, the impurity regions 114, the sidewall insulating layers 118, and the like. Next, phosphorus (P), arsenic (As), or the like is added to regions which are in contact with the impurity regions 114, so that the high-concentration impurity regions 120 are formed (see FIG. 10E). After that, the insulating layer is removed, and a metal layer 122 is formed so as to cover the gate electrode 110, the sidewall insulating layers 118, the high-concentration impurity regions 120, and the like (see FIG. 10E). A variety of film formation methods such as a vacuum evaporation method, a sputtering method, and a spin coating method can be employed for forming the metal layer 122. The metal layer 122 is preferably formed using a metal material that reacts with a semiconductor material contained in the semiconductor region 104 to be a low-resistance metal compound. Examples of such a metal material are titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 10F). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 122 is removed after the metal compound regions 124 are formed.

Then, the interlayer insulating layer 126 and the interlayer insulating layer 128 are formed so as to cover the components formed in the above steps (see FIG. 10G). The interlayer insulating layers 126 and 128 can be formed using a material containing an inorganic insulating material such as silicon oxide, silicon oxynitride, silicon nitride, hafnium oxide, aluminum oxide, or tantalum oxide. Moreover, the interlayer insulating layers 126 and 128 can be formed using an organic insulating material such as polyimide or an acrylic resin. Note that although a layered structure of the interlayer insulating layer 126 and the interlayer insulating layer 128 is employed here, one embodiment of the disclosed invention is not limited thereto. A single-layer structure or a layered structure including three or more layers can also be used. After the formation of the interlayer insulating layer 128, a surface of the interlayer insulating layer 128 is preferably planarized by CMP, etching, or the like.

Figure 10H:
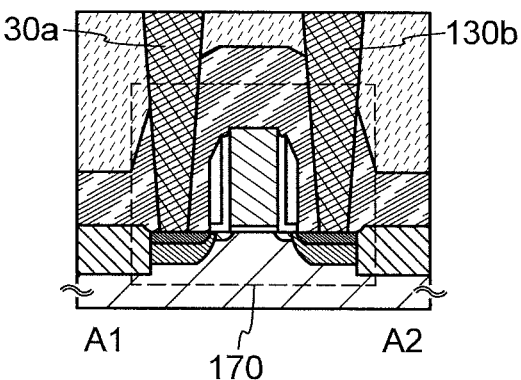

Then, openings that reach the metal compound regions 124 are formed in the interlayer insulating layers 126 and 128, and the source or drain electrode 130a and the source or drain electrode 130b are formed in the openings (see FIG. 10H). The source or drain electrode 130a and the source or drain electrode 130b can be formed in such a manner, for example, that a conductive layer is formed in a region including the openings by a PVD method, a CVD method, or the like and then part of the conductive layer is removed by etching, CMP, or the like.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of reducing an oxide film (e.g., a natural oxide film) formed on a surface over which the titanium film is formed, to decrease the contact resistance with the lower electrode (the metal compound region 124, here). The titanium nitride film formed after the formation of the titanium film has a barrier function of preventing diffusion of the conductive material. A copper film may be formed by a plating method after the formation of the barrier film of titanium, titanium nitride, or the like.

Note that in the case where the source or drain electrode 130*a* and the source or drain electrode 130*b* are formed by removing part of the conductive layer, the step is preferably performed so that the surfaces are planarized. For example, when a thin titanium film and a thin titanium nitride film are formed in a region including the openings and then a tungsten film is formed so as to be embedded in the openings, an excess tungsten film, an excess titanium film, an excess titanium nitride film, or the like is removed and the planarity of the surface can be improved by subsequent CMP. The surface including the source or drain electrode 130*a* and the source or drain electrode 130*b* is planarized in such a manner, so that an electrode, a line, an insulating layer, a semiconductor layer, and the like can be favorably formed in later steps.

Note that only the source or drain electrode 130*a* and the source or drain electrode 130*b* which are in contact with the metal compound regions 124 are shown here; however, an electrode that is in contact with the gate electrode 110, and the like can also be formed in this step. There is no particular limitation on a material used for the source or drain electrode 130*a* and the source or drain electrode 130*b*, and a variety of conductive materials can be used. For example, a conductive material such as molybdenum, titanium, chromium, tantalum, tungsten, aluminum, copper, neodymium, or scandium can be used. In view of heat treatment performed later, it is preferable that the source or drain electrode 130*a* and the source or drain electrode 130*b* be formed using a material having heat resistance high enough to withstand the heat treatment.

Through the above steps, the transistor 170 using the substrate 100 containing a semiconductor material is formed (see FIG. 10I). Since the transistor 170 using a material other than an oxide semiconductor can operate at high speed, a logic circuit (also referred to as an arithmetic circuit) or the like can be formed using the transistor. Further, the transistor can be used in a driver circuit for driving the memory circuit described in the above embodiment.

Note that an electrode, a line, an insulating layer, or the like may be further formed after the above steps. When a line has a multi-layer structure including a layered structure of an interlayer insulating layer and a conductive layer, a highly integrated semiconductor device can be provided.

For example, the insulating layer 138 may be formed after the above steps and openings may be formed in the insulating layer 138. Further, an electrode 142*c* connected to the source or drain electrode 130*a* and an electrode 142*d* connected to the source or drain electrode 130*b* may be formed in the openings (see FIG. 2A).

The structures, methods, and the like described in this embodiment can be combined as appropriate with any of the structures, methods, and the like described in the other embodiments.

Embodiment 71

In this embodiment, a manufacturing method of a semiconductor device using a semiconductor material other than an oxide semiconductor, specifically, a manufacturing method of a transistor 570 in a lower portion in FIG. 28, is described with reference to FIGS. 11A to 11H and FIGS. 12A to 12H. Hereinafter, first of all, a manufacturing method of an SOI substrate where a single crystal semiconductor layer is provided on a base substrate is described with reference to FIGS. 11A to 11H; then, a manufacturing method of a transistor using the SOI substrate is described with reference to FIGS. 12A to 12H.

<Manufacturing Method of SOI Substrate>

Figure 11A:
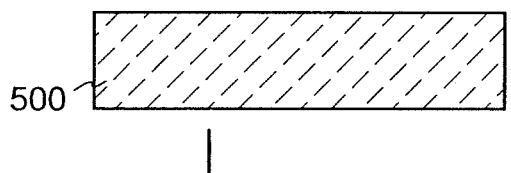
FIGS. 11A to 11H are cross-sectional views relating to manufacturing steps of an SOI substrate.

First, the base substrate 500 is prepared (see FIG. 11A). As the base substrate 500, a substrate formed using an insulator can be used. Specific examples thereof are as follows: a variety of glass substrates used in the electronics industry, such as an aluminosilicate glass substrate, an aluminoborosilicate glass substrate, and a barium borosilicate glass substrate; a quartz substrate; a ceramic substrate; and a sapphire substrate. Further, a ceramic substrate which contains silicon nitride and aluminum oxide as its main components and whose coefficient of thermal expansion is close to coefficient of silicon may be used.

Alternatively, a semiconductor substrate such as a single crystal silicon substrate or a single crystal germanium substrate may be used as the base substrate 500. In the case of using such a semiconductor substrate as the base substrate 500, the upper limit of the heat treatment temperature can be raised compared with the case of using a glass substrate or the like; thus, a high-quality SOI substrate is easily obtained. Here, as a semiconductor substrate, a solar grade silicon (SOG-Si) substrate or the like may be used. Alternatively, a polycrystalline semiconductor substrate may be used. In the case of using a SOG-Si substrate, a polycrystalline semiconductor substrate, or the like, manufacturing cost can be reduced as compared with the case of using a single crystal silicon substrate or the like.

Note that in this embodiment, a description is given of the case where a glass substrate is used as the base substrate 500. Cost reduction can be achieved when a glass substrate which can have a larger size and is inexpensive is used as the base substrate 500.

A surface of the base substrate 500 is preferably cleaned in advance. Specifically, the base substrate 500 is subjected to ultrasonic cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like. Through such cleaning treatment, the surface planarity of the base substrate 500 can be improved and abrasive particles left on the surface of the base substrate 500 can be removed.

Figure 11B:
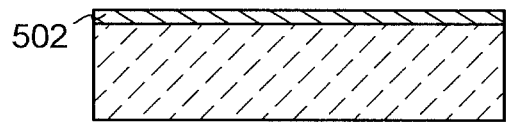
Figure 11C:
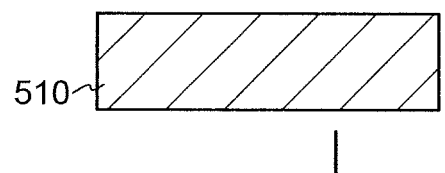

Then, the nitrogen-containing layer 502 (e.g., a layer including an insulating film containing nitrogen, such as a silicon nitride (SiN) film or a silicon nitride oxide (SiN$_x$O$_y$ (x>y)) film) is formed over the surface of the base substrate 500 (see FIG. 11B). The nitrogen-containing layer 502 can be formed by a CVD method, a sputtering method, or the like.

The nitrogen-containing layer 502 formed in this embodiment corresponds to a layer for bonding a single crystal semiconductor layer (a bonding layer). The nitrogen-containing layer 502 also functions as a barrier layer for preventing impurity contained in the base substrate, such as sodium (Na), from diffusing into the single crystal semiconductor layer.

As described above, since the nitrogen-containing layer 502 is used as the bonding layer in this embodiment, it is preferable that the nitrogen-containing layer 502 be formed to have a certain level of surface planarity. Specifically, the nitrogen-containing layer 502 is formed such that it has an average surface roughness ($R_a$, which is also referred to as arithmetic mean deviation) of 0.5 nm or less and a root-mean-square surface roughness ($R_{ms}$) of 0.60 nm or less, preferably an average surface roughness of 0.35 nm or less and a root-mean-square surface roughness of 0.45 nm or less. Note that the above arithmetic mean deviation can be measured, for example, in a region of 10 square micrometers. The thickness is in the range of greater than or equal to 10 nm and less than or equal to 200 nm, preferably greater than or equal to 50 nm and less than or equal to 100 nm. With the surface planarity improved as described above, bonding defect of the single crystal semiconductor layer can be prevented.

Next, a bond substrate is prepared. Here, a single crystal semiconductor substrate 510 is used as the bond substrate (see FIG. 1C). Note that although a substrate whose crystallinity is single crystal is used as the bond substrate here, the crystallinity of the bond substrate is not necessarily limited to single crystal.

For example, as the single crystal semiconductor substrate 510, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to circular, and the single crystal semiconductor substrate 510 may be a substrate which has been processed into, for example, a rectangular shape or the like. Further, the single crystal semiconductor substrate 510 can be formed by a Czochralski (CZ) method or a Floating Zone (FZ) method.

Figure 11D:
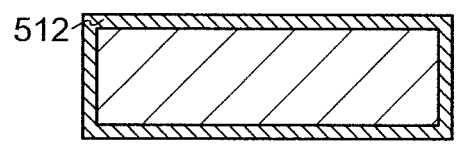

The oxide film 512 is formed over a surface of the single crystal semiconductor substrate 510 (see FIG. 11D). In view of removal of contamination, it is preferable that the surface of the single crystal semiconductor substrate 510 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before the formation of the oxide film 512. Alternatively, diluted hydrofluoric acid and ozone water may be discharged alternately to clean the surface of the single crystal semiconductor substrate 510.

The oxide film 512 can be formed with, for example, a single layer or a stacked layer of a silicon oxide film, a silicon oxynitride film, and the like. As a method for forming the oxide film 512, a thermal oxidation method, a CVD method, a sputtering method, or the like can be used. When the oxide film 512 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 512 (here, a $SiO_x$ film) is formed by performing thermal oxidation treatment on the single crystal semiconductor substrate 510. The thermal oxidation treatment is preferably performed in an oxidizing atmosphere to which a halogen is added.

For example, thermal oxidation treatment of the single crystal semiconductor substrate 510 is performed in an oxidizing atmosphere to which chlorine (Cl) is added, whereby the oxide film 512 can be formed through chlorine oxidation. In this case, the oxide film 512 is a film containing chlorine atoms. By such chlorine oxidation, heavy metal (e.g., Fe, Cr, Ni, or Mo) that is an extrinsic impurity is trapped and chloride of the metal is formed and then removed to the outside; thus, contamination of the single crystal semiconductor substrate 510 can be reduced. Moreover, after the bonding to the base substrate 500, impurity from the base substrate, such as Na, can be fixed, so that contamination of the single crystal semiconductor substrate 510 can be prevented.

Note that the halogen atoms contained in the oxide film 512 are not limited to chlorine atoms. A fluorine atom may be contained in the oxide film 512. As a method for fluorine oxidation of the surface of the single crystal semiconductor substrate 510, a method in which the single crystal semiconductor substrate 510 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Figure 11E:
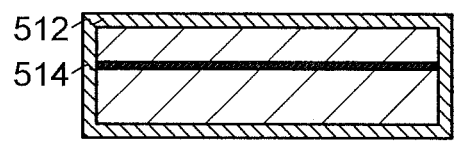
Figure 11F:
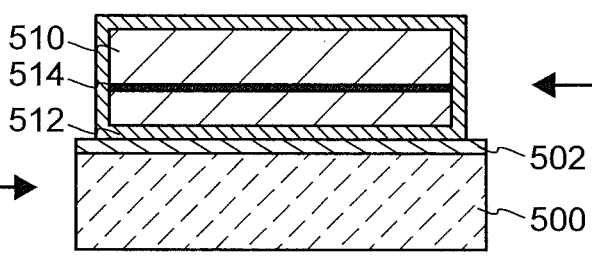

Next, ions are accelerated by an electric field and the single crystal semiconductor substrate 510 is irradiated and added with the ions, whereby an embrittled region 514 where the crystal structure is damaged is formed in the single crystal semiconductor substrate 510 at a predetermined depth (see FIG. 11E).

The depth at which the embrittled region 514 is formed can be controlled by the kinetic energy, mass, charge, or incidence angle of the ions, or the like. The embrittled region 514 is formed at approximately the same depth as the average penetration depth of the ions. Therefore, the thickness of the single crystal semiconductor layer to be separated from the single crystal semiconductor substrate 510 can be adjusted with the depth at which the ions are added. For example, the average penetration depth may be controlled such that the thickness of a single crystal semiconductor layer is approximately greater than or equal to 10 nm and less than or equal to 500 nm, preferably greater than or equal to 50 nm and less than or equal to 200 nm.

The above ion irradiation treatment can be performed with an ion doping apparatus or an ion-implantation apparatus. As a typical example of the ion doping apparatus, there is a non-mass-separation type apparatus in which plasma excitation of a process gas is performed and an object is irradiated with all kinds of ion species generated. In this apparatus, the object is irradiated with ion species of plasma without mass separation. In contrast, an ion implantation apparatus is a mass-separation apparatus. In the ion-implantation apparatus, mass separation of ion species of plasma is performed and the object is irradiated with ion species having predetermined masses.

In this embodiment, an example is described in which an ion doping apparatus is used to add hydrogen to the single crystal semiconductor substrate 510. A gas containing hydrogen is used as a source gas. As for ions used for the irradiation, the proportion of H is preferably set high. Specifically, it is preferable that the proportion of $H_3$ be set to 50% or higher (more preferably 80% or ηιγηερ) with respect to the total amount of $H^+$, $H_2^-$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion doping apparatus, the number of steps can be reduced as compared with the case of performing irradiation of hydrogen and helium in separate steps, and increase in surface roughness of a single crystal semiconductor layer to be formed later can be suppressed.

Note that heavy metal may also be added when the embrittled region 514 is formed with the ion doping apparatus; however, the ion irradiation is performed through the oxide film 512 containing halogen atoms, whereby contamination of the single crystal semiconductor substrate 510 due to the heavy metal can be prevented.

Then, the base substrate 500 and the single crystal semiconductor substrate 510 are disposed to face each other and the surface of the nitrogen-containing layer 502 and the oxide film 512 are disposed in close contact with each other. Thus, the base substrate 500 and the single crystal semiconductor substrate 510 can be bonded to each other (see FIG. 11F).

When bonding is performed, it is preferable that a pressure greater than or equal to 0.001 N/cm$^2$ and less than or equal to 100 N/cm$^2$, e.g., a pressure greater than or equal to 1 N/cm$^2$ and less than or equal to 20 N/cm$^2$, be applied to one part of the base substrate 500 or one part of the single crystal semiconductor substrate 510. When the bonding surfaces are made close to each other and disposed in close contact with each other by applying a pressure, a bonding between the nitrogen-containing layer 502 and the oxide film 512 is generated at the part where the close contact is made, and the bonding spontaneously spreads to almost the entire area. This bonding is performed under the action of the Van der Waals force or hydrogen bonding and can be performed at room temperature.

Note that before the single crystal semiconductor substrate 510 and the base substrate 500 are bonded to each other, surfaces to be bonded to each other are preferably subjected to surface treatment. Surface treatment can improve the bonding strength at the interface between the single crystal semiconductor substrate 510 and the base substrate 500.

As the surface treatment, wet treatment, dry treatment or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. This heat treatment is performed at a temperature at which separation at the embrittled region 514 does not occur (for example, a temperature higher than or equal to room temperature and lower than 400° C.). Alternatively, bonding of the nitrogen-containing layer 502 and the oxide film 512 may be performed while heating them at a temperature in this range. The heat treatment can be performed using a heating furnace such as a resistance heating furnace, a diffusion furnace a rapid thermal annealing (RTA) apparatus, a microwave heating apparatus, or the like. The above temperature condition is merely an example, and one embodiment of the disclosed invention should not be construed as being limited to this example.

Figure 11G:
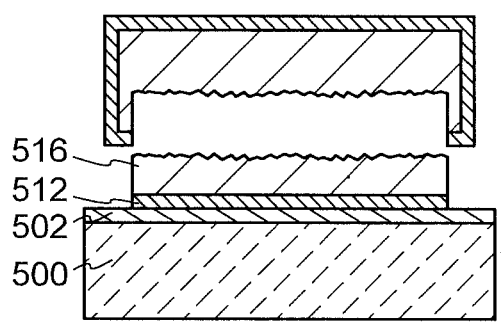

Next, heat treatment is performed for separation of the single crystal semiconductor substrate 510 at the embrittled region, whereby a single crystal semiconductor layer 516 is formed over the base substrate 500 with the nitrogen-containing layer 502 and the oxide film 512 interposed therebetween (see FIG. 11G).

Note that a temperature for the heat treatment in the separation is desirably as low as possible. This is because as the temperature in the separation is low, generation of roughness on the surface of the single crystal semiconductor layer 516 can be suppressed. Specifically, the temperature for the heat treatment in the separation may be higher than or equal to 300° C. and lower than or equal to 600° C. and the heat treatment is more effective when the temperature is higher than or equal to 400° C. and lower than or equal to 500° C.

Note that after the single crystal semiconductor substrate 510 is separated, the single crystal semiconductor layer 516 may be subjected to heat treatment at 500° C. or higher so that concentration of hydrogen remaining in the single crystal semiconductor layer 516 is reduced.

Next, a surface of the single crystal semiconductor layer 516 is irradiated with laser light, whereby a single crystal semiconductor layer 518 where the flatness of the surface planarity is improved and the number of defects is reduced is formed. Note that instead of the laser light irradiation treatment, heat treatment may be performed.

Although the irradiation treatment with the laser light is performed just after the heat treatment for separation of the single crystal semiconductor layer 516 in this embodiment, one embodiment of the disclosed invention is not construed as being limited to this. Etching treatment may be performed after the heat treatment for separation of the single crystal semiconductor layer 516, to remove a region where there are many defects on the surface of the single crystal semiconductor layer 516, and then the laser light irradiation treatment may be performed. Alternatively, after the surface planarity of the single crystal semiconductor layer 516 is improved, the laser light irradiation treatment may be performed. Note that the etching treatment may be either wet etching or dry etching. Further, in this embodiment, a step of reducing the thickness of the single crystal semiconductor layer 516 may be performed after the laser light irradiation. In order to reduce the thickness of the single crystal semiconductor layer 516, any one or both of dry etching and wet etching may be employed.

Figure 11H:
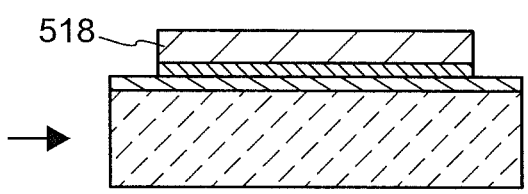

Through the above steps, an SOI substrate having the single crystal semiconductor layer 518 with favorable characteristics can be obtained (see FIG. 11H).

<Manufacturing Method of Transistor>

Next, the manufacturing method of the transistor 570 including the above SOI substrate is described with reference to FIGS. 12A to 12H.

Figure 12A:
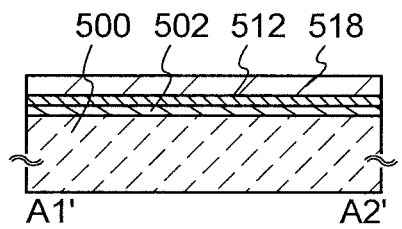
FIGS. 12A to 12H are cross-sectional views relating to manufacturing steps of a semiconductor device.

FIG. 12A is a cross-sectional view illustrating part of an SOI substrate manufactured by the method which is illustrated in FIGS. 11A to 11H.

Figure 12E:
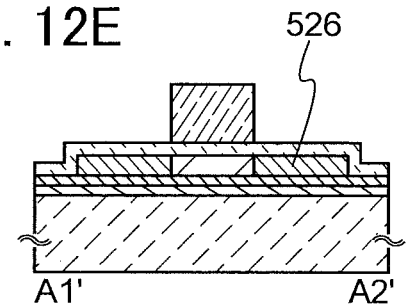
Figure 12B:
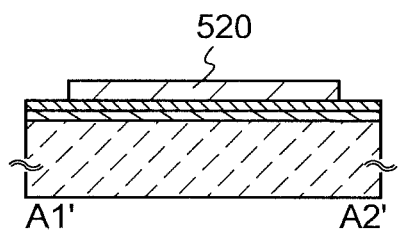
Figure 12F:
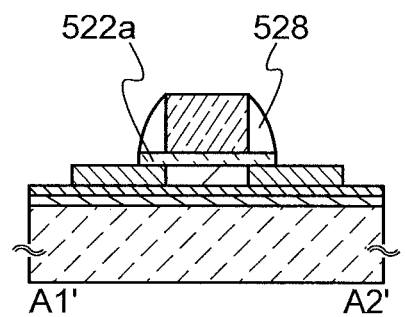

First, the single crystal semiconductor layer 518 is patterned to have an island shape so that a semiconductor layer 520 is formed (see FIG. 12B). Note that before or after this step, an impurity element imparting n-type conductivity or an impurity element imparting p-type conductivity may be added to the semiconductor layer in order to control the threshold voltage of the transistor. When the semiconductor material is silicon, phosphorus, arsenic, or the like can be used as the impurity element imparting n-type conductivity. Boron, aluminum, gallium, or the like can be used as the impurity element imparting p-type conductivity.

Figure 12C:
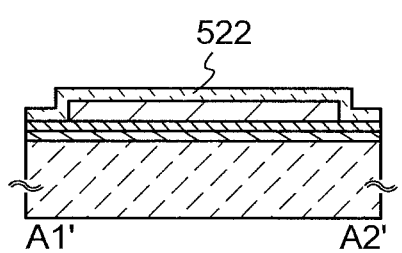
Figure 12G:
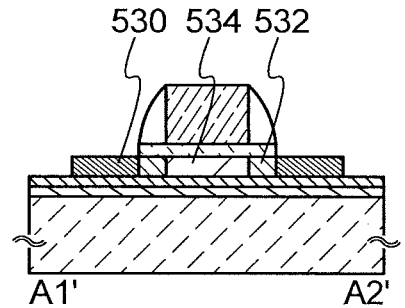

Then, an insulating layer 522 is formed so as to cover the semiconductor layer 520 (see FIG. 12C). The insulating layer 522 is to be a gate insulating layer later. Here, a single-layer silicon oxide film is formed by a plasma CVD method. Description related to the gate insulating layer (e.g., the gate insulating layer 108) in any of the above embodiments can be referred to for a material and a method which are used for forming the insulating layer 522.

Figure 12D:
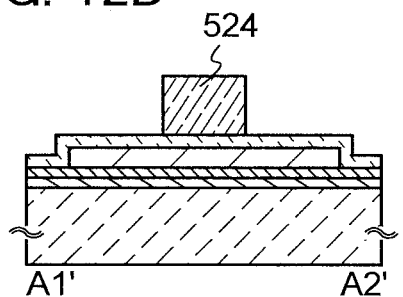

Next, a conductive layer is formed over the insulating layer 522; then, the conductive layer is selectively etched so that the gate electrode 524 is formed above the semiconductor layer 520 (see FIG. 12D). Description related to the gate electrode (e.g., the gate electrode 110) in any of the above embodiments can be referred to for a material and a method which are used for forming the gate electrode 524.

Then, the gate electrode 524 is used as a mask, and an impurity element imparting one conductivity type is added to the semiconductor layer 520 to form impurity regions 526 (see FIG. 12E). Note that phosphorus (P) or arsenic (As) is added here in order to form an n-channel transistor, an impurity element such as boron (B) or aluminum (Al) may be added in the case of forming a p-channel transistor. Here, the concentration of impurity to be added can be set as appropriate.

Next, the sidewall insulating layers 528 are formed on side surfaces of the gate electrode 524. An insulating layer is formed so as to cover the insulating layer 522 and the gate electrode 524 and then subjected to highly anisotropic etching, whereby the sidewall insulating layers 528 can be formed in a self-aligned manner. Further, at this time, it is preferable that part of the insulating layer 522 be etched so that the gate insulating layer 522a is formed and the impurity regions 526 are exposed.

After that, with the use of the gate electrode 524 and the sidewall insulating layers 528 as masks, an impurity element imparting one conductivity type is added to the impurity regions 526. Note that the impurity element added to the impurity regions 526 is an impurity element which imparts the same conductivity type as the impurity element added in the previous step. In addition, the concentration of the impurity element added to the impurity regions 526 is higher than that of the impurity element in the previous step. By the addition of the impurity element, a pair of high-concentration impurity regions 530, a pair of low-concentration impurity regions 532, and the channel formation region 534 are formed in the semiconductor layer 520 (see FIG. 12G). The high-concentration impurity regions 530 function as a source region and a drain region.

Note that when the semiconductor layer 520 is formed using a material containing silicon, a silicide region may be formed by forming silicide in part of the semiconductor layer 520 in order to further reduce the resistance of the source region and the drain region. The siliciding is performed in such a manner that metal is brought into contact with the semiconductor layer, and silicon in the semiconductor layer is made to react with the metal by heat treatment (e.g., a GRTA method or an LRTA method). For the silicide region, cobalt silicide, nickel silicide, or the like may be used. In the case where the semiconductor layer 520 is thin, silicide reaction may proceed to a bottom of the semiconductor layer 520. As a metal material used for forming silicide, titanium, nickel, tungsten, molybdenum, cobalt, zirconium, hafnium, tantalum, vanadium, neodymium, chromium, platinum, palladium, and the like can be given. Further, a silicide region can also be formed by laser light irradiation or the like.

Figure 12H:
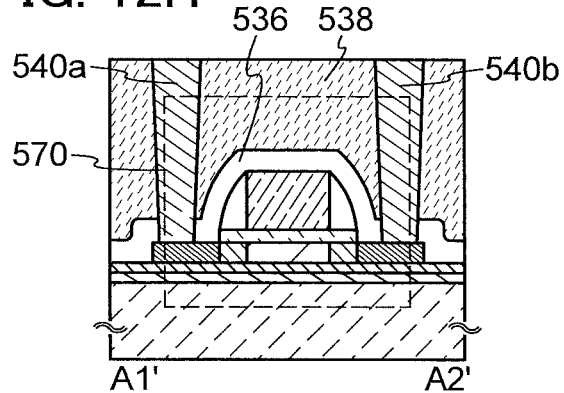

Then, the interlayer insulating layer 536 and the interlayer insulating layer 538 are formed so as to cover the components formed in the above steps (see FIG. 12H). The interlayer insulating layers 536 and 538 can be formed using a material containing an inorganic insulating material such as silicon oxide, silicon oxynitride, silicon nitride, hafnium oxide, aluminum oxide, or tantalum oxide. Moreover, the interlayer insulating layers 536 and 538 can be formed using an organic insulating material such as polyimide or an acrylic resin. Note that although a layered structure of the interlayer insulating layer 536 and the interlayer insulating layer 538 is employed here, one embodiment of the disclosed invention is not limited thereto. A single-layer structure or a layered structure including three or more layers can also be used. After the formation of the interlayer insulating layer 538, a surface of the interlayer insulating layer 538 is preferably planarized by CMP, etching, or the like.

Then, openings that reach the high-concentration impurity regions 530 are formed in the interlayer insulating layers 536 and 538, and the source or drain electrode 540a and the source or drain electrode 540b are formed in the openings (see FIG. 1211). Description related to the source or drain electrode 130a and the source or drain electrode 130b may be referred to for a material and a manufacturing method which are used for the source or drain electrode 540a and the source or drain electrode 540b.

Through the above steps, the transistor 570 including the SOI substrate is formed (see FIG. 1214). Since the transistor 570 using a material other than an oxide semiconductor can operate at high speed, a logic circuit (also referred to as an arithmetic circuit) or the like can be formed using the transistor. Further, the transistor can be used in a driver circuit for driving the memory circuit described in the above embodiment.

Note that an electrode, a line, an insulating layer, or the like may be further formed after the above steps. When the line has a multi-layer structure including a layered structure of an interlayer insulating layer and a conductive layer, a highly integrated semiconductor device can be provided.

The structures, methods, and the like described in this embodiment can be combined as appropriate with any of the structures, methods, and the like described in the other embodiments.

Embodiment 8

In this embodiment, applications of the semiconductor device described in any of the above embodiments are described with reference to FIGS. 13A and 13B and FIGS. 14A to 14C.

Figure 13A:
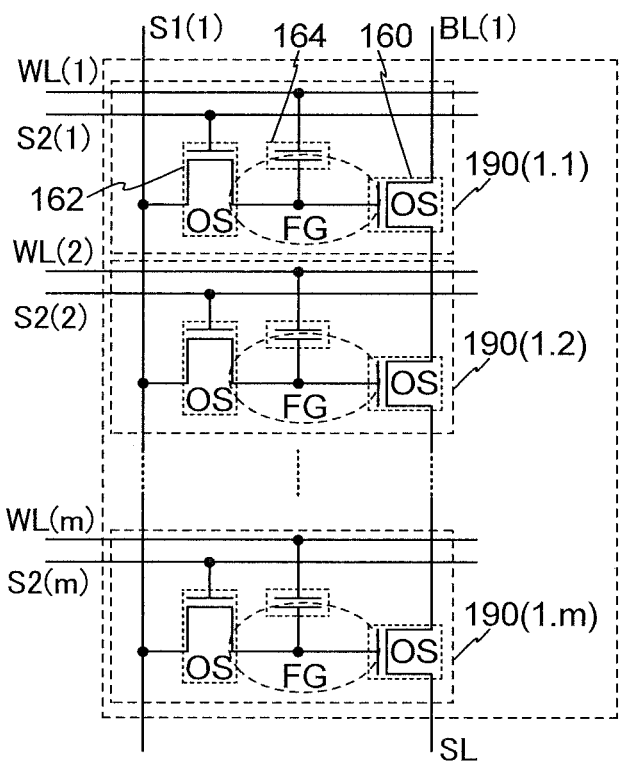
FIGS. 13A and 13B are circuit diagrams of a semiconductor device.
Figure 13B:
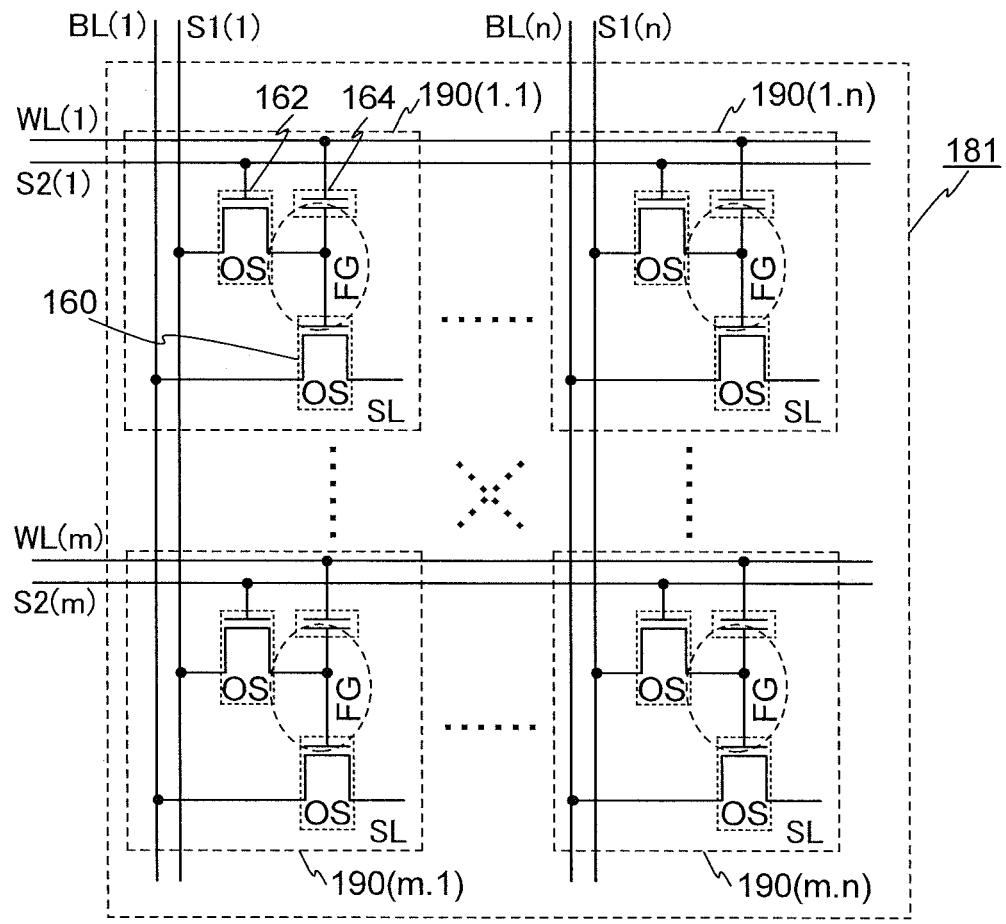

FIGS. 13A and 13B are examples of circuit diagrams of semiconductor devices each including a plurality of semiconductor devices (hereinafter also referred to as memory cells 190) illustrated in FIG. 5A1. FIG. 13A is a circuit diagram of a so-called NAND semiconductor device in which the memory cells 190 are connected in series, and FIG. 13B is a circuit diagram of a so-called NOR semiconductor device in which the memory cells 190 are connected in parallel.

The semiconductor device in FIG. 13A includes a source line SL, a bit line BL, a first signal line S1, m second signal lines S2, m word lines WL, and a plurality of memory cells 190 (1, 1) to 190 (m, 1) which is arranged in a matrix of m (rows) (in a vertical direction)×1 (a column) (in a horizontal direction). Note that in FIG. 13A, one source line SL and one bit line BL are provided in the semiconductor device; however, one embodiment of the disclosed invention is not limited to this. n source lines SL and n bit lines BL may be provided so that a memory cell array where the memory cells are arranged in a matrix of m (rows) (in a vertical direction)×n (columns) (in a horizontal direction) is formed.

In each of the memory cells 190, a gate electrode of the transistor 160, one of a source electrode and a drain electrode of the transistor 162, and one electrode of the capacitor 164 are electrically connected to one another. The first signal line SI and the other of the source electrode and the drain electrode of the transistor 162 are electrically connected to each other, and the second signal line S2 and a gate electrode of the transistor 162 are electrically connected to each other. The word line WL and the other electrode of the capacitor 164 are electrically connected to each other.

Further, a source electrode of the transistor 160 included in the memory cell 190 and a drain electrode of the transistor 160 included in the adjacent memory cell 190 are electrically connected to each other. The drain electrode of the transistor 160 included in the memory cell 190 and the source electrode of the transistor 160 included in the adjacent memory cell 190 are electrically connected to each other. Note that the drain electrode of the transistor 160 included in the memory cell 190 of the plurality of memory cells connected in series, which is provided at one end, and the bit line are electrically connected to each other. The source electrode of the transistor 160 included in the memory cell 190 of the plurality of memory cells connected in series, which is provided at the other end, and the source line are electrically connected to each other.

In the semiconductor device illustrated in FIG. 13A, writing operation and reading operation are performed in each row. The writing operation is performed as follows. Potential at which the transistor 162 is turned on is supplied to the second signal line S2 in a row where writing is performed, so that the transistor 162 in the row where writing is performed is turned on. Accordingly, the potential of the first signal line SI is supplied to the gate electrode of the transistor 160 in the specified row, so that predetermined charge is given to the gate electrode. Thus, data can be written to the memory cell in the specified row.

Further, the reading operation is performed as follows. First, potential at which the transistor 160 is turned on regardless of charge of the gate electrode thereof is supplied to the word lines WL in the rows other than the row where reading is performed, so that the transistors 160 in the rows other than the row where reading is performed are turned on. Then, potential (reading potential) at which an on state or an off state of the transistor 160 is determined depending on charge of the gate electrode of the transistor 160 is supplied to the word line WL in the row where reading is performed. After that, predetermined potential is supplied to the source line SL so that a reading circuit (not illustrated) connected to the bit line BL operates. Here, the plurality of transistors 160 between the source line SL and the bit line BL are on except the transistors 160 in the row where reading is performed; therefore, conductance between the source line SL and the bit line BL is determined by a state of the transistors 160 in the row where reading is performed. That is, the potential of the bit line BL which is read by the reading circuit varies depending on charge of the gate electrodes of the transistors 160 in the row where reading is performed. In this manner, data can be read from the memory cell in the specified row.

The semiconductor device illustrated in FIG. 13B includes n source lines SL, n bit lines BL, n first signal lines S1, m second signal lines S2, m word lines WL, and a memory cell array 181 including and the plurality of memory cells 190 (1, 1) to 190 (m, n) which is arranged in a matrix of m (rows) (in a vertical direction)×n (columns) (in a horizontal direction). A gate electrode of the transistor 160, one of the source electrode and the drain electrode of the transistor 162, and the one electrode of the capacitor 164 are electrically connected to one another. The source line SL and the source electrode of the transistor 160 are electrically connected to each other. The bit line BL and the drain electrode of the transistor 160 are electrically connected to each other. The first signal line S1 and the other of the source electrode and the drain electrode of the transistor 162 are electrically connected to each other, and the second signal line S2 and the gate electrode of the transistor 162 are electrically connected to each other. The word line WL and the other electrode of the capacitor 164 are electrically connected to each other.

In the semiconductor device illustrated in FIG. 13B, writing operation and reading operation are performed in each row. The writing operation is performed in a manner similar to that in the semiconductor device illustrated in FIG. 13A. The reading operation is performed as follows. First, potential at which the transistor 160 is turned off regardless of charge of the gate electrode thereof is supplied to the word lines WL in the rows other than the row where reading is performed, so that the transistors 160 in the rows other than the row where reading is performed are turned off. Then, potential (reading potential) at which an on state or an off state of the transistor 160 is determined depending on charge of the gate electrode of the transistor 160 is supplied to the word line WL in the row where reading is performed. After that, predetermined potential is supplied to the source line SL so that a reading circuit (not illustrated) connected to the bit line BL operates. Here, conductance between the source line SL and the bit line BL is determined by a state of the transistors 160 in the row where reading is performed. That is, the potential of the bit line BL which is read by the reading circuit varies depending on charge of the gate electrodes of the transistors 160 in the row where reading is performed. In this manner, data can be read from the memory cell in the specified row.

Next, examples of reading circuits which can be used for the semiconductor devices illustrated in FIGS. 13A and 13B, or the like will be described with reference to FIGS. 14A to 14C.

Figure 14A:
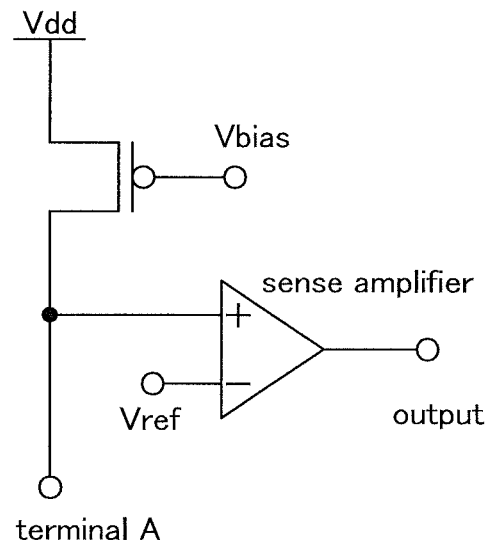
FIGS. 14A to 14C are circuit diagrams of a semiconductor device.

FIG. 14A illustrates an outline of a reading circuit. The reading circuit includes a transistor and a sense amplifier circuit.

At the time of reading of data, a terminal A is connected to a bit line to which a memory cell from which data is read is connected. Further, bias potential $V_{bias}$ is applied to a gate electrode of a transistor so that the potential of the terminal A is controlled.

The resistance of the memory cell 190 varies depending on stored data. Specifically, when the transistor 160 of the selected memory cell 190 is on, the memory cell 190 has low resistance, whereas when the transistor 160 of the selected memory cell 190 is off, the memory cell 190 has high resistance.

When the memory cell has high resistance, the potential of the terminal A is higher than reference potential $V_{ref}$ and the sense amplifier circuit outputs potential (data "I") corresponding to the potential of the terminal A. On the other hand, when the memory cell has low resistance, the potential of the terminal A is lower than the reference potential $V_{ref}$ and the sense amplifier circuit outputs potential (data "0") corresponding to the potential of the terminal A.

Thus, by using the reading circuit, data can be read from the memory cell. Note that the reading circuit of this embodiment is an example. Alternatively, another known circuit may be used. The reading circuit may further include a precharge circuit. Instead of the reference potential $V_{ref}$, a reference bit line may be connected to the sense amplifier circuit.

Figure 14B:
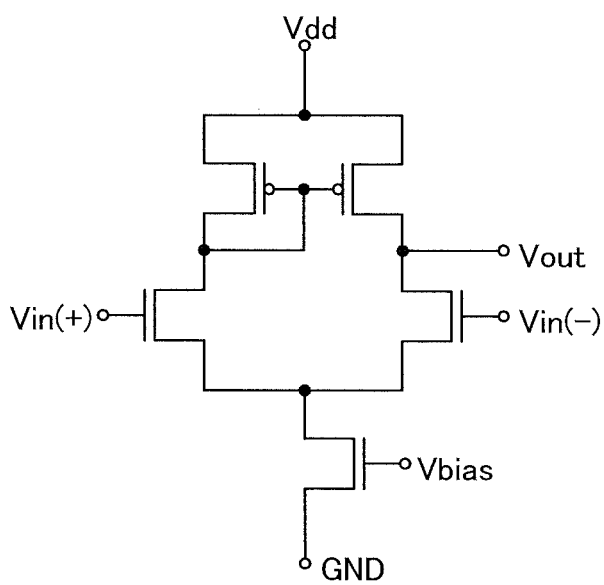

FIG. 14B illustrates a differential sense amplifier which is an example of sense amplifier circuits. The differential sense amplifier includes input terminals Vin(+) and Vin(−) and an output terminal Vout, and amplifies a difference between Vin(+) and Vin(−). Vout is approximately high output when Vin(+)>Vin(−), and is approximately low output when Vin(+)<Vin(−).

Figure 14C:
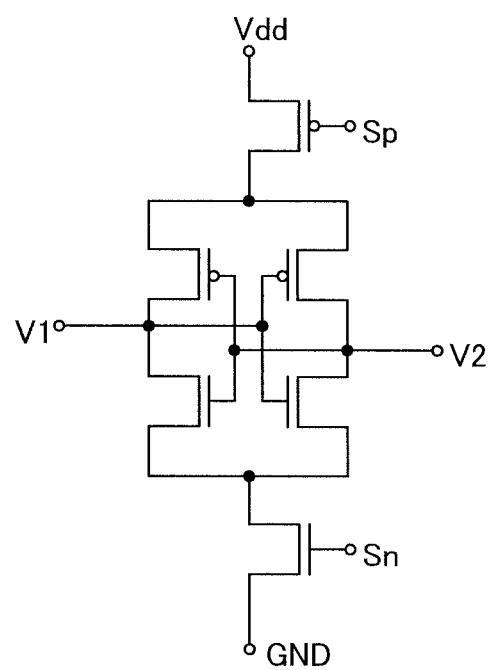

FIG. 14C illustrates a latch sense amplifier which is an example of sense amplifier circuits. The latch sense amplifier has input/output terminals V1 and V2 and input terminals of control signals Sp and Sn. First, the control signals Sp and Sn are set to a signal High and a signal Low, respectively, and power supply potential ($V_{dd}$) is interrupted. Then, potentials for comparison are supplied to V1 and V2. After that, the control signals Sp and Sn are set to a signal Low and a signal High, respectively, and power supply potential ($V_{dd}$) is supplied. If $V_{1in} > V_{2in}$ is satisfied for potentials for comparison $V_1$ and $V_{2in}$, output from V1 is a signal High and output from V2 is a signal Low, whereas output from V1 is a signal Low and output from V2 is a signal High if $V_{1in} < V_{2in}$ is satisfied. By utilizing such a relation, the difference between $V_{1in}$ and $V_{2in}$ can be amplified.

The structures, methods, and the like described in this embodiment can be combined as appropriate with any of the structures, methods, and the like described in the other embodiments.

Embodiment 9

In this embodiment, examples of a semiconductor device using the transistor described in any of the above embodiments are described with reference to FIGS. 15A and 15B.

Figure 15A:
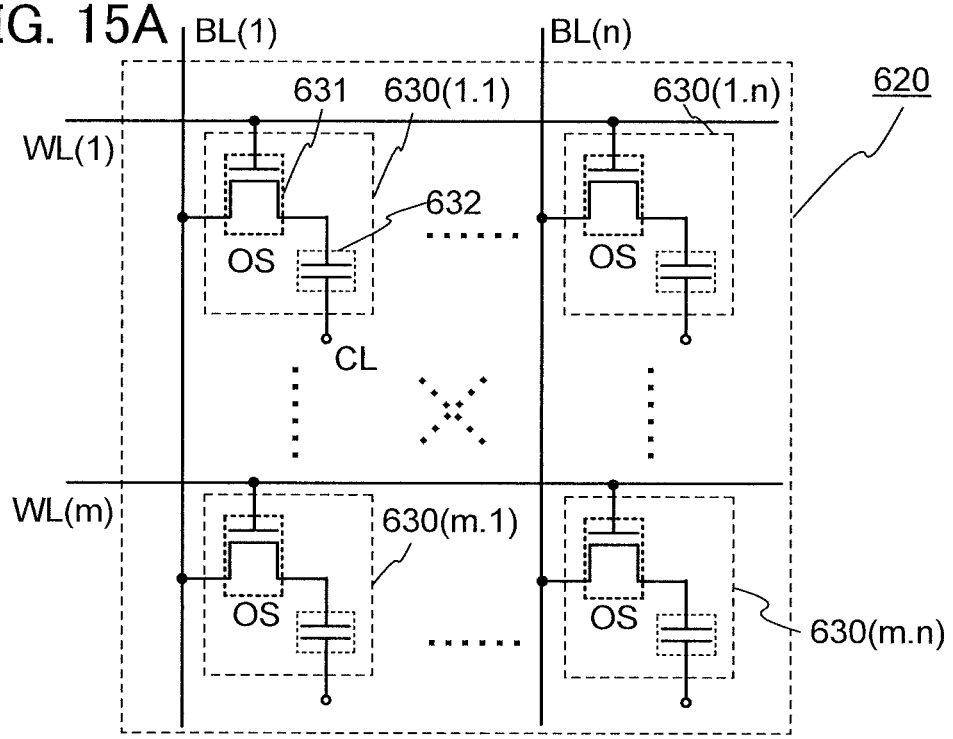
FIGS. 15A and 15B are circuit diagrams of a semiconductor device.

In FIG. 15A, an example of a semiconductor device having a structure corresponding to a so-called dynamic random access memory (DRAM) is illustrated. A memory cell array 620 illustrated in FIG. 15A has a structure in which a plurality of memory cells 630 is arranged in a matrix. Further, the memory cell array 620 includes m first lines and n second lines. Note that the memory cell 630 corresponds to the semiconductor device illustrated in FIG. 5B. Note also that in this embodiment, the first line and the second line in FIG. 5B are called a bit line BL and a word line WL, respectively.

The memory cell 630 includes a transistor 631 and a capacitor 632. A gate electrode of the transistor 631 is connected to the first line (word line WL). Further, one of a source electrode and a drain electrode of the transistor 631 is connected to the second line (bit line BL). The other of the source electrode and the drain electrode of the transistor 631 is connected to one electrode of the capacitor. The other electrode of the capacitor is connected to a capacitor line CL and is supplied with predetermined potential. The transistor described in any of the above embodiments is applied to the transistor 631.

The transistor described in any of the above embodiments has an extremely low off current. Accordingly, when the transistor is applied to the semiconductor device illustrated in FIG. 15A, which is regarded as a so-called DRAM, a substantially nonvolatile memory can be obtained.

Figure 15B:
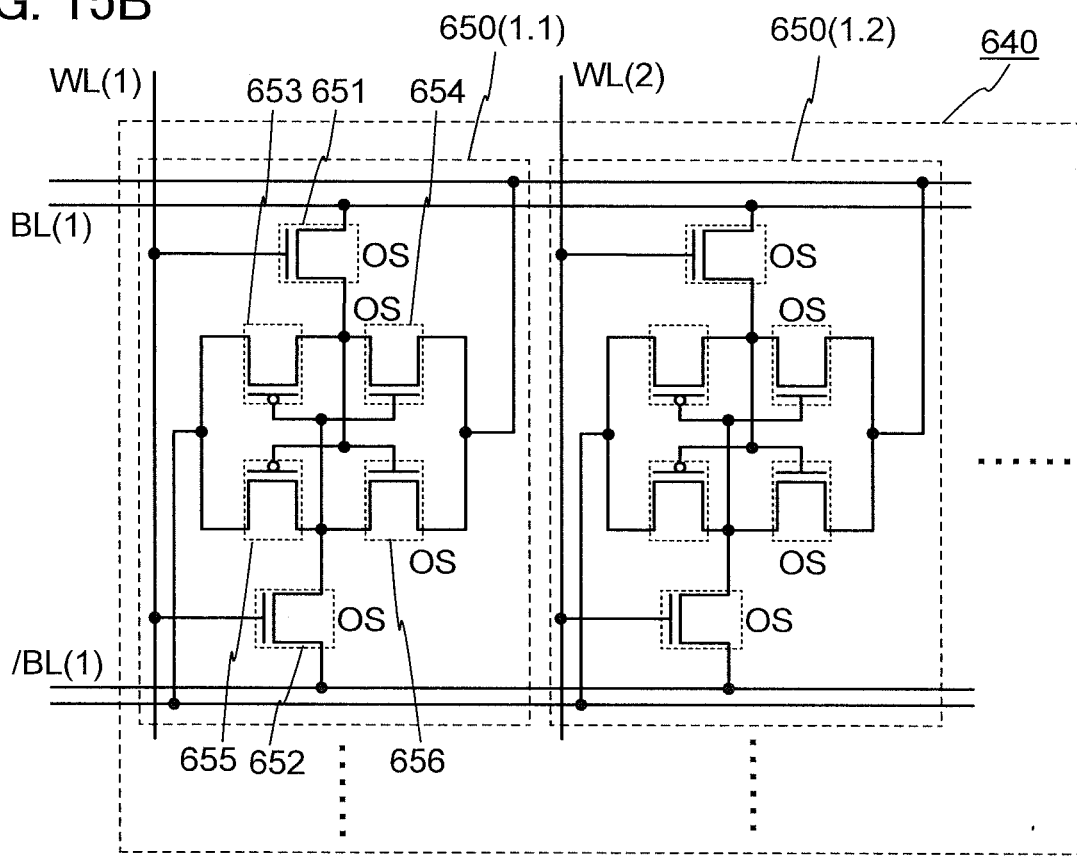

In FIG. 15B, an example of a semiconductor device having a structure corresponding to a so-called static random access memory (SRAM) is illustrated. A memory cell array 640 illustrated in FIG. 15B has a structure in which a plurality of memory cells 650 is arranged in a matrix. Further, the memory cell array 640 includes a plurality of first lines (word lines WL), a plurality of second lines (bit lines BL), and a plurality of third lines (inverted bit lines/BL).

The memory cell 650 includes first to sixth transistors 651 to 656. The first transistor 651 and the second transistor 652 function as selection transistors. Further, one of the third transistor 653 and the fourth transistor 654 (here, the fourth transistor 654) is an n-channel transistor and the other (here, the third transistor 653) is a p-channel transistor. In other words, a CMOS circuit is formed with the third transistor 653 and the fourth transistor 654. Similarly, a CMOS circuit is formed with the fifth transistor 655 and the sixth transistor 656.

The first transistor 651, the second transistor 652, the fourth transistor 654, and the sixth transistor 656 are n-channel transistors and the transistor described in any of the above embodiments can be applied to these transistors. The third transistor 653 and the fifth transistor 655 are p-channel transistors and can be formed using an oxide semiconductor or a material (e.g., silicon) other than an oxide semiconductor.

The structures, methods, and the like described in this embodiment can be combined as appropriate with any of the structures, methods, and the like described in the other embodiments.

Embodiment 10

In this embodiment, application of the semiconductor device described in any of the above embodiments to an electronic device is described with reference to FIGS. 16A to 16F. In this embodiment, application of the above-described semiconductor device to electronic devices such as a computer, a cellular phone (also referred to as a mobile phone or a mobile phone set), a portable information terminal (including a portable game machine, an audio reproducing device, and the like), a camera such as a digital camera or a digital video camera, electronic paper, and a television set (also referred to as a television or a television receiver) is described.

Figure 16A:
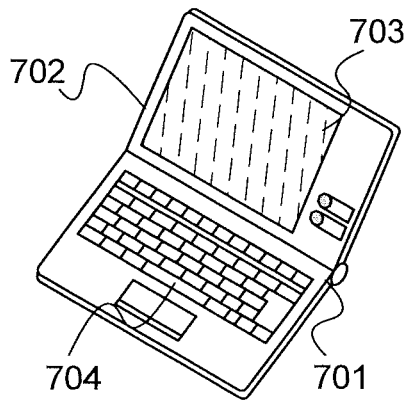
FIG. 16A to 16F are diagrams each illustrating an electronic device which includes a semiconductor device.

FIG. 16A illustrates a laptop personal computer that includes a housing 701, a housing 702, a display portion 703, a keyboard 704, and the like. In each of the housings 701 and 702, the semiconductor device described in any of the above embodiments is provided. In the semiconductor device described in any of the above embodiments, writing and reading of data can be performed at high speed, data can be stored for a long time, and power consumption is sufficiently reduced. Therefore, a laptop personal computer in which writing and reading of data are performed at high speed, data is stored for a long time, and power consumption is sufficiently reduced can be realized.

Figure 16D:
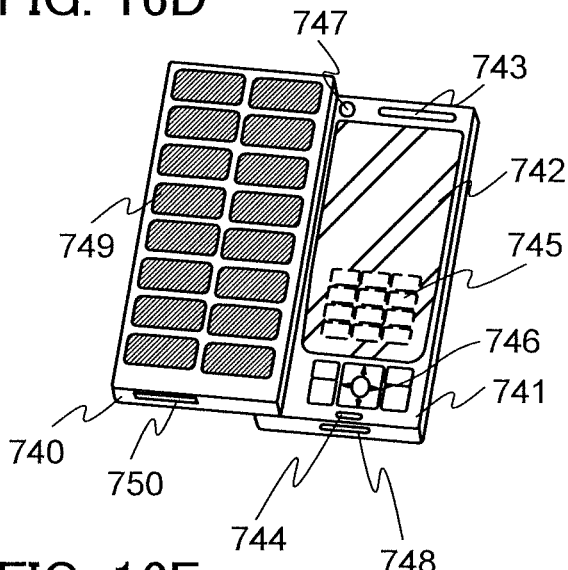
Figure 16B:
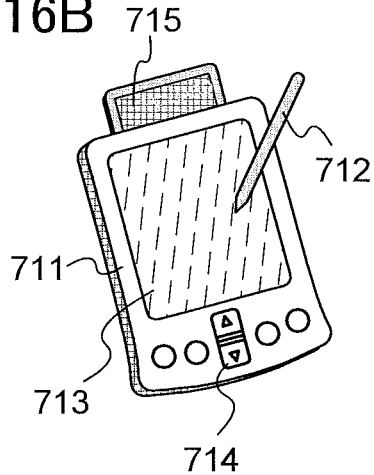

FIG. 16B illustrates a portable information terminal (personal digital assistance (PDA)). In a main body 711, a display portion 713, an external interface 715, an operation button 714, and the like are provided. Further, a stylus 712 and the like for operation of the portable information terminal are provided. In the main body 711, the semiconductor device described in any of the above embodiments is provided. In the semiconductor device described in any of the above embodiments, writing and reading of data can be performed at high speed, data can be stored for a long time, and power consumption is sufficiently reduced. Therefore, a portable information terminal in which writing and reading of data are performed at high speed, data is stored for a long time, and power consumption is sufficiently reduced can be realized.

Figure 16E:
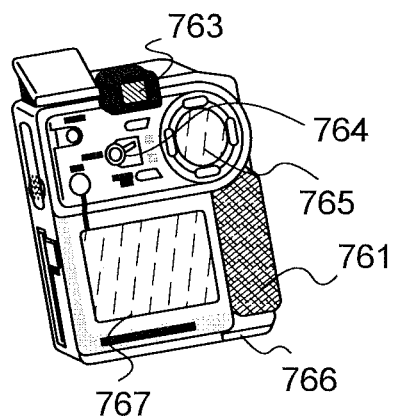
Figure 16C:
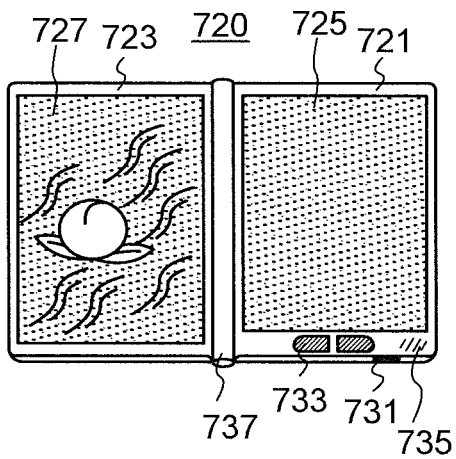

FIG. 16C illustrates an e-book reader 720 mounted with electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housings 721 and 723 is provided with the semiconductor device described in any of the above embodiments. In the semiconductor device described in any of the above embodiments, writing and reading of data can be performed at high speed, data can be stored for a long time, and power consumption is sufficiently reduced. Therefore, an e-book reader in which writing and reading of data are performed at high speed, data is stored for a long time, and power consumption is sufficiently reduced can be realized.

FIG. 16D illustrates a cellular phone which includes two housings, a housing 740 and a housing 741. Moreover, the housings 740 and 741 which are shown unfolded in FIG. 16D can overlap with each other by sliding, thus, the size of the cellular phone can be reduced, which makes the cellular phone suitable for being carried. The housing 741 includes a display panel 742, a speaker 743, a microphone 744, an operation key 745, a pointing device 746, a camera lens 747, an external connection terminal 748, and the like. The housing 740 includes a solar cell 749 for charging the cellular phone, an external memory slot 750, and the like. In addition, an antenna is incorporated in the housing 741. At least one of the housings 740 and 741 is provided with the semiconductor device described in any of the above embodiments. In the semiconductor device described in any of the above embodiments, writing and reading of data can be performed at high speed, data can be stored for a long time, and power consumption is sufficiently reduced. Therefore, a cellular phone in which writing and reading of data are performed at high speed, data is stored for a long time, and power consumption is sufficiently reduced can be realized.

FIG. 16E illustrates a digital camera which includes a main body 761, a display portion 767, an eyepiece 763, an operation switch 764, a display portion 765, a battery 766, and the like. In the main body 761, the semiconductor device described in any of the above embodiments is provided. In the semiconductor device described in any of the above embodiments, writing and reading of data can be performed at high speed, data can be stored for a long time, and power consumption is sufficiently reduced. Therefore, a digital camera in which writing and reading of data are performed at high speed, data is stored for a long time, and power consumption is sufficiently reduced can be realized.

Figure 16F:
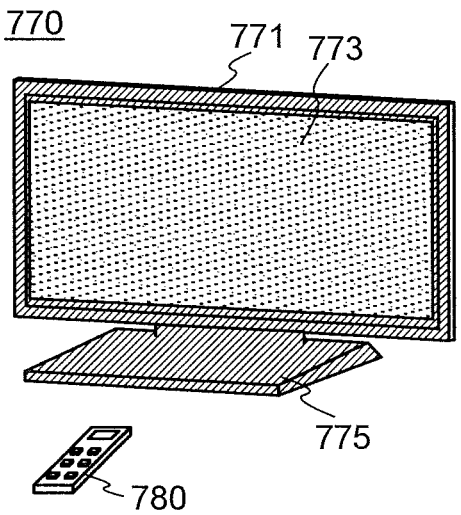

FIG. 16F illustrates a television set 770 which includes a housing 771, a display portion 773, a stand 775, and the like. The television set 770 can be operated with an operation switch of the housing 771 or a remote controller 780. The semiconductor device described in any of the above embodiments is mounted on the housing 771 and the remote controller 780. In the semiconductor device described in any of the above embodiments, writing and reading of data can be performed at high speed, data can be stored for a long time, and power consumption is sufficiently reduced. Therefore, a television set in which writing and reading of data are performed at high speed, data is stored for a long time, and power consumption is sufficiently reduced can be realized.

As described above, the semiconductor device in any of the above embodiments is mounted on each of the electronic devices described in this embodiment. Therefore, electronic devices in which power consumption is reduced can be realized.

Example 1

The number of times when data can be rewritten in the semiconductor device according to one embodiment of the disclosed invention can rewrite data was examined. In this example, the examination results will be described with reference to FIG. 17.

A semiconductor device used for the examination is a semiconductor device having the circuit configuration in FIG. 5A1. Here, an oxide semiconductor was used for a transistor corresponding to the transistor 162, and a capacitor with a capacitance value of 0.33 pF was used as a capacitor corresponding to the capacitor 164.

The examination was performed by comparing the initial memory window width and the memory window width at the time after storing and writing of data were repeated predetermined times. Data was stored and written by applying 0 V or 5 V to a line corresponding to the third line in FIG. 5A and applying 0 V or 5 V to a line corresponding to the fourth line in FIG. 5A1. When the potential of the line corresponding to the fourth line is 0 V, the transistor corresponding to the transistor 162 is off; thus, a potential supplied to a floating gate portion FG is held. When the potential of the line corresponding to the fourth line is 5 V, the transistor corresponding to the transistor 162 is on; thus, the potential of the line corresponding to the third line is supplied to the floating gate portion FG.

The memory window width is one of indicators of characteristics of a memory device. Here, the memory window width represents the shift amount $\Delta V_{eg}$ in curves ($V_{eg}$–$1_d$ curves) between different memory states, which show the relation between the potential V of a line corresponding to the fifth line and drain current $I_d$ of a transistor corresponding to the transistor 160. The different memory states mean a state where 0 V is applied to the floating gate portion FG (hereinafter referred to as a Low state) and a state where 5 V is applied to the floating gate portion FG (hereinafter referred to as a High state). That is, the memory window width can be checked by sweeping the potential $V_{eg}$ in the Low state and in the High state. In any case, $V_{ds}$ was set to 1 V.

Figure 17:
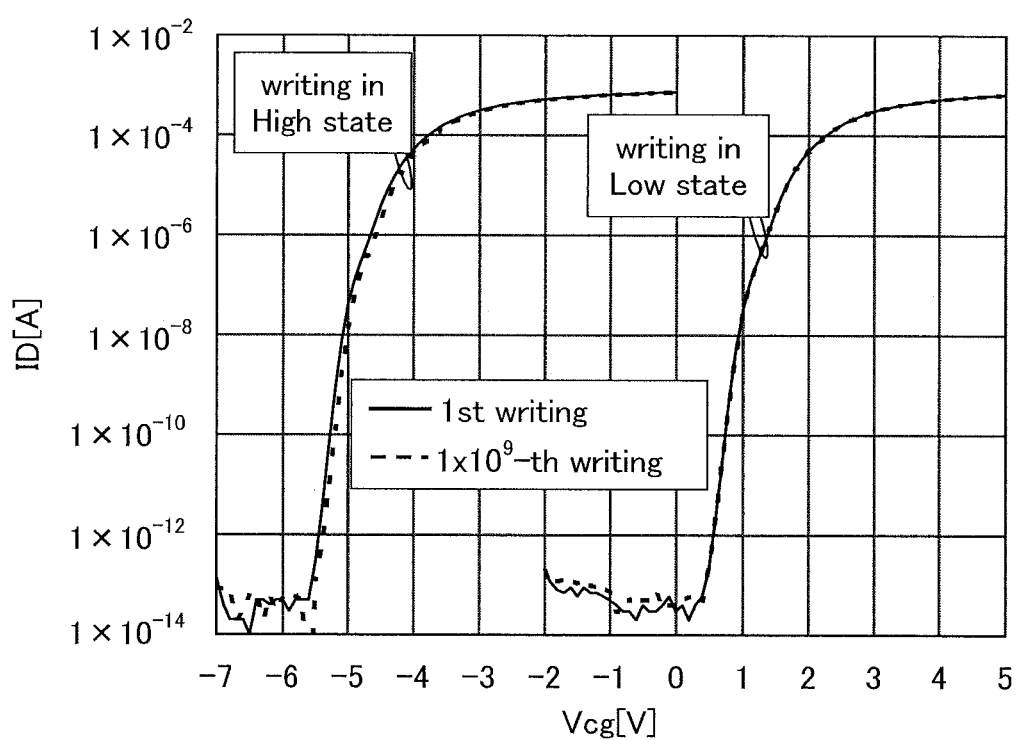
FIG. 17 is a graph showing examination results of a memory window width.

FIG. 17 shows the examination results of the memory window width at an initial state and the memory window width at the time after writing was performed $1 \times 10^9$ times. In FIG. 17, each of solid lines shows a first writing and each of dashed lines shows a $1 \times 10^9$-th writing. Further, in both the solid lines and the dashed lines, a curve on the left side shows a writing in the High state and a curve on the right side shows a writing in the Low state. The horizontal axis shows $V_{eg}$ (V) and the vertical axis shows $I_d$ (A). According to FIG. 17, it can be confirmed that before and after data was written $1 \times 10^9$ times, the memory window width sweeping the potential $V_{eg}$ in the High state and the Low state was not changed. The memory window width was not changed after data was written $1 \times 10^9$ times, which means that at least during this period, the characteristics of the semiconductor device are not changed.

As described above, in a semiconductor device according to one embodiment of the disclosed invention, characteristics were not changed even after data was stored and written plural times. That is, it can be said that according to one embodiment of the disclosed invention, a significantly high reliable semiconductor device can be realized.

This application is based on Japanese Patent Application serial no. 2009-296202 filed with Japan Patent Office on Dec. 25, 2009, the entire contents of which are hereby incorporated by reference.

The invention claimed is:

1. A memory device comprising:
a memory cell array comprising a plurality of memory cells arranged in a matrix;
a first driver circuit electrically connected to a bit line; and
a second driver circuit electrically connected to a word line,
wherein each of the plurality of memory cells comprises a first transistor and a capacitor,
wherein one of a source and a drain of the first transistor is electrically connected to the bit line,
wherein the other of the source and the drain of the first transistor is electrically connected to one electrode of the capacitor,
wherein a gate electrode of the first transistor is electrically connected to the word line,
wherein the first transistor comprises a channel formation region in an oxide semiconductor layer,
wherein the oxide semiconductor layer comprises a crystal,
wherein a c-axis of the crystal of the oxide semiconductor layer is perpendicular to a surface of the oxide semiconductor layer,
wherein a potential is supplied to the one electrode of the capacitor by turning on the first transistor,
wherein the potential supplied to the capacitor is held by turning off the first transistor,
wherein at least one of the first driver circuit and the second driver circuit comprises a second transistor, and
wherein the second transistor comprises silicon in a channel formation region.

2. The memory device according to claim 1,
wherein a hydrogen concentration measured by SIMS in the oxide semiconductor layer is $5 \times 10^{19}$ atoms/cm$^3$ or less.

3. The memory device according to claim 1,
wherein the oxide semiconductor layer comprises a region being an i-type or substantially i-type.

4. The memory device according to claim 1,
wherein the oxide semiconductor layer comprises an In—Sn—Ga—Zn—O-based oxide semiconductor layer, an In—Ga—Zn—O-based oxide semiconductor layer, an In—Sn—Zn—O-based oxide semiconductor layer, an In—Al—Zn—O-based oxide semiconductor layer, an In—Zn—O-based oxide semiconductor layer, an In—Mg—O-based oxide semiconductor layer, or an In—O-based oxide semiconductor layer.

5. The memory device according to claim 1,
wherein, in the memory cell array, two memory cells in the same column are electrically connected to the same bit line, and
wherein, in the memory cell array, two memory cells in the same row are electrically connected to the same word line.

6. The memory device according to claim 1,
wherein the memory cell array are positioned over the first driver circuit and the second driver circuit.

7. A memory device comprising:
a memory cell array comprising a plurality of memory cells arranged in a matrix;
a first driver circuit electrically connected to a bit line; and
a second driver circuit electrically connected to a word line,
wherein each of the plurality of memory cells comprises a first transistor and a capacitor,
wherein one of a source and a drain of the first transistor is electrically connected to the bit line,
wherein the other of the source and the drain of the first transistor is electrically connected to one electrode of the capacitor,
wherein a gate electrode of the first transistor is electrically connected to the word line,
wherein the first transistor comprises a channel formation region in an oxide semiconductor layer,
wherein the oxide semiconductor layer comprises a crystal,
wherein a c-axis of the crystal of the oxide semiconductor layer is perpendicular to a surface of the oxide semiconductor layer,
wherein a potential is supplied to the one electrode of the capacitor by turning on the first transistor,
wherein the potential supplied to the capacitor is held by turning off the first transistor,
wherein the oxide semiconductor layer comprises a layer comprising indium, and
wherein, in the crystal, the layer comprising indium is parallel to a a-axis and a b-axis.

8. The memory device according to claim 7,
wherein electric conductivity of the oxide semiconductor layer is controlled by the layer comprising indium.

9. The memory device according to claim 7,
wherein a hydrogen concentration measured by SIMS in the oxide semiconductor layer is $5 \times 10^{19}$ atoms/cm$^3$ or less.

10. The memory device according to claim 7,
wherein the oxide semiconductor layer comprises a region being an i-type or substantially i-type.

11. The memory device according to claim 7,
wherein at least one of the first driver circuit and the second driver circuit comprises a second transistor, and
wherein the second transistor comprises silicon in a channel formation region.

12. The memory device according to claim 7,
wherein the oxide semiconductor layer comprises an In—Sn—Ga—Zn—O-based oxide semiconductor layer, an In—Ga—Zn—O-based oxide semiconductor layer, an In—Sn—Zn—O-based oxide semiconductor layer, an In—Al—Zn—O-based oxide semiconductor layer, an In—Zn—O-based oxide semiconductor layer, an In—Mg—O-based oxide semiconductor layer, or an In—O-based oxide semiconductor layer.

13. The memory device according to claim 7,
wherein, in the memory cell array, two memory cells in the same column are electrically connected to the same bit line, and
wherein, in the memory cell array, two memory cells in the same row are electrically connected to the same word line.

14. The memory device according to claim 7,
wherein the memory cell array are positioned over the first driver circuit and the second driver circuit.

* * * * *